(12) United States Patent
Lamkin et al.

(10) Patent No.: US 10,866,413 B2
(45) Date of Patent: Dec. 15, 2020

(54) ECCENTRIC INCIDENT LUMINANCE PUPIL TRACKING

(71) Applicant: Lockheed Martin Corporation, Bethesda, MD (US)

(72) Inventors: Mark A. Lamkin, Fort Worth, TX (US); Kyle Martin Ringgenberg, Fort Worth, TX (US); Jordan David Lamkin, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 190 days.

(21) Appl. No.: 16/208,060

(22) Filed: Dec. 3, 2018

(65) Prior Publication Data
US 2020/0174252 A1 Jun. 4, 2020

(51) Int. Cl.
*G02B 27/00* (2006.01)
*G02B 27/01* (2006.01)
(Continued)

(52) U.S. Cl.
CPC ..... *G02B 27/0093* (2013.01); *G02B 27/0179* (2013.01); *H05K 1/028* (2013.01);
(Continued)

(58) Field of Classification Search
CPC ............ G02B 27/0093; G02B 27/0179; G02B 27/017; G02B 2027/0187; G02B 30/10;
(Continued)

(56) References Cited

U.S. PATENT DOCUMENTS

| 5,731,899 A | 3/1998 | Meyers |
| 6,317,175 B1 | 11/2001 | Salerno et al. |

(Continued)

FOREIGN PATENT DOCUMENTS

| CN | 105093532 | 11/2015 |
| CN | 106309089 | 1/2017 |

(Continued)

OTHER PUBLICATIONS

U.S. Appl. No. 16/373,087, filed Apr. 2, 2019, Mark. A. Lamkin.
(Continued)

*Primary Examiner* — David P Porta
*Assistant Examiner* — Gisselle M Gutierrez
(74) *Attorney, Agent, or Firm* — Baker Botts L.L.P.

(57) ABSTRACT

In one embodiment, an electronic assembly includes a flexible circuit board formed into a curved shape that is configured to be substantially concentric with a viewer's eye. The electronic assembly further includes a plurality of facets coupled to a side of curved shape of the flexible circuit board that is configured to face the viewer's eye. Each facet has a planar face, one or more emitters configured to emit light towards the viewer's eye, and one or more receptors configured to detect the emitted light after it has been reflected back towards the electronic assembly from a retina of the viewer's eye. Each face is normal to a line pointing towards a center area of the viewer's eye when the curved shape is substantially concentric with the viewer's eye. Each facet is individually addressable such that the plurality of facets are configurable to detect a center of gaze of the viewer.

20 Claims, 41 Drawing Sheets

(51) Int. Cl.
  *H05K 1/02* (2006.01)
  *H05K 1/18* (2006.01)
  *H05K 3/00* (2006.01)

(52) U.S. Cl.
  CPC ........... *H05K 1/181* (2013.01); *H05K 3/0044* (2013.01); *G02B 27/017* (2013.01); *G02B 2027/0187* (2013.01); *H05K 2201/10121* (2013.01); *H05K 2201/10128* (2013.01); *H05K 2201/10151* (2013.01); *H05K 2203/0228* (2013.01)

(58) Field of Classification Search
  CPC ........ G02B 27/0075; G02B 2027/0123; G02B 27/0172; H05K 1/028; H05K 1/181; H05K 3/0044; H05K 2201/10121; H05K 2201/10128; H05K 2201/10151; H05K 2203/0228; G09G 3/003; G06F 3/013
  USPC ....................................................... 250/349
  See application file for complete search history.

(56) References Cited

U.S. PATENT DOCUMENTS

| | | |
|---|---|---|
| 6,724,012 B2 | 4/2004 | Kimura |
| 6,909,233 B2 | 6/2005 | Cok et al. |
| 7,015,639 B2 | 3/2006 | Stegamat et al. |
| 7,075,501 B1 | 7/2006 | Spitzer et al. |
| 7,387,913 B2 | 6/2008 | Yoshimura et al. |
| 7,468,312 B2 | 12/2008 | Tanaka |
| 7,476,904 B2 | 1/2009 | Fukunaga |
| 7,542,210 B2 | 6/2009 | Chirieleison |
| 7,697,053 B2 | 4/2010 | Kurtz et al. |
| 7,714,923 B2 | 5/2010 | Cok et al. |
| 7,808,540 B2 | 10/2010 | Cok |
| 7,952,059 B2 | 5/2011 | Vitale et al. |
| 8,482,859 B2 | 7/2013 | Border et al. |
| 8,508,830 B1 | 8/2013 | Wang |
| 8,576,276 B2 | 11/2013 | Bar-Zeev et al. |
| 8,605,082 B2 | 12/2013 | Buchheit |
| 8,610,650 B2 | 12/2013 | Somerville |
| 8,749,620 B1 | 6/2014 | Knight |
| 8,823,742 B2 | 9/2014 | Kweon |
| 8,884,845 B2 | 11/2014 | Yamazaki et al. |
| 8,933,862 B2 | 1/2015 | Lapstun |
| 8,964,298 B2 | 2/2015 | Haddick et al. |
| 9,001,427 B2 | 4/2015 | Jacobs et al. |
| 9,049,411 B2 | 6/2015 | Venkataraman et al. |
| 9,135,873 B2 | 9/2015 | Miyatake et al. |
| 9,155,984 B2 | 10/2015 | Fleck et al. |
| 9,158,115 B1 | 10/2015 | Worley et al. |
| 9,177,355 B1 | 11/2015 | Buchheit |
| 9,179,134 B2 | 11/2015 | Renieri et al. |
| 9,204,397 B2 | 12/2015 | Raffle et al. |
| 9,229,227 B2 | 1/2016 | Border et al. |
| 9,237,263 B2 | 1/2016 | Rime et al. |
| 9,355,314 B2 | 5/2016 | Yang |
| 9,368,546 B2 | 6/2016 | Fleck et al. |
| 9,377,624 B2 | 6/2016 | D'Amico et al. |
| 9,419,031 B1 | 8/2016 | Or-Bach et al. |
| 9,454,008 B2 | 9/2016 | Ziarati et al. |
| 9,465,991 B2 | 10/2016 | Mei et al. |
| 9,497,380 B1 | 11/2016 | Jannard et al. |
| 9,519,144 B2 | 12/2016 | Lanman et al. |
| 9,564,078 B2 | 2/2017 | Ninan |
| 9,581,821 B2 | 2/2017 | McDowall et al. |
| 9,596,456 B2 | 3/2017 | Yang et al. |
| 9,626,936 B2 | 4/2017 | Bell |
| 9,632,315 B2 | 4/2017 | Smith et al. |
| 9,651,784 B2 | 5/2017 | Osterhout |
| 9,671,613 B2 | 6/2017 | Border |
| 9,679,511 B2 | 6/2017 | Gu |
| 9,684,174 B2 | 6/2017 | Fleck et al. |
| 9,706,132 B2 | 7/2017 | Nisenzon et al. |
| 9,734,554 B2 | 8/2017 | Ballard |
| 9,841,537 B2 | 12/2017 | Luebke et al. |
| 9,852,496 B2 | 12/2017 | Marchand et al. |
| 10,129,984 B1 | 11/2018 | Lamkin |
| 10,249,800 B1 | 4/2019 | Lamkin |
| 2001/0000005 A1 | 3/2001 | Forrest et al. |
| 2005/0205958 A1 | 9/2005 | Taniguchi et al. |
| 2005/0206755 A1 | 9/2005 | Yokoyama et al. |
| 2005/0242712 A1 | 11/2005 | Sung |
| 2007/0029941 A1 | 2/2007 | Ito et al. |
| 2007/0109438 A1 | 5/2007 | Duparre et al. |
| 2007/0123133 A1 | 5/2007 | Winters |
| 2007/0286944 A1 | 12/2007 | Yokoyama et al. |
| 2008/0030597 A1 | 2/2008 | Olsen |
| 2008/0218331 A1 | 9/2008 | Baillot |
| 2009/0152530 A1 | 6/2009 | Ahn et al. |
| 2010/0020092 A1 | 1/2010 | Canu et al. |
| 2010/0065862 A1 | 3/2010 | Ray |
| 2011/0018903 A1 | 1/2011 | Lapstun et al. |
| 2011/0080487 A1 | 4/2011 | Venkataraman |
| 2012/0133807 A1 | 5/2012 | Wu |
| 2012/0154920 A1 | 6/2012 | Harrison et al. |
| 2012/0242855 A1 | 9/2012 | Nagasaka et al. |
| 2012/0249797 A1 | 10/2012 | Haddick et al. |
| 2013/0063550 A1 | 3/2013 | Ritchey et al. |
| 2013/0175557 A1 | 7/2013 | Ray |
| 2013/0242262 A1 | 9/2013 | Lewis |
| 2013/0286053 A1 | 10/2013 | Fleck et al. |
| 2013/0341491 A1 | 12/2013 | Hirose et al. |
| 2014/0002675 A1 | 1/2014 | Duparre |
| 2014/0022364 A1 | 1/2014 | Rodriguez |
| 2014/0140654 A1 | 5/2014 | Brown et al. |
| 2015/0015467 A1 | 1/2015 | Kaplan et al. |
| 2015/0022643 A1 | 1/2015 | Stetson |
| 2015/0054734 A1 | 2/2015 | Raghoebardajal et al. |
| 2015/0077312 A1 | 3/2015 | Wang |
| 2015/0178939 A1 | 6/2015 | Bradski et al. |
| 2015/0212320 A1 | 7/2015 | Hervy et al. |
| 2015/0235583 A1 | 8/2015 | Schowengerdt et al. |
| 2015/0243092 A1 | 8/2015 | Schowengerdt |
| 2015/0243712 A1 | 8/2015 | Wang et al. |
| 2015/0277100 A1 | 10/2015 | Novoselov |
| 2015/0301781 A1 | 10/2015 | Ekkaia et al. |
| 2015/0312549 A1 | 10/2015 | Georgiev et al. |
| 2015/0364527 A1 | 12/2015 | Wang et al. |
| 2016/0012643 A1 | 1/2016 | Kezele et al. |
| 2016/0041663 A1 | 2/2016 | Chen et al. |
| 2016/0044263 A1 | 2/2016 | Hashimoto et al. |
| 2016/0064682 A1 | 3/2016 | Yamae et al. |
| 2016/0091737 A1 | 3/2016 | Kim et al. |
| 2016/0103318 A1 | 4/2016 | Du et al. |
| 2016/0189429 A1 | 6/2016 | Mallinson |
| 2016/0196777 A1 | 7/2016 | Liu |
| 2016/0203646 A1 | 7/2016 | Nadler et al. |
| 2016/0203745 A1 | 7/2016 | Park et al. |
| 2016/0252727 A1 | 9/2016 | Mack et al. |
| 2016/0267713 A1 | 9/2016 | Patel |
| 2016/0267851 A1 | 9/2016 | Pirtskhlava et al. |
| 2016/0269720 A1 | 9/2016 | Patel |
| 2016/0292850 A1 | 10/2016 | Perez et al. |
| 2016/0307372 A1 | 10/2016 | Pitts et al. |
| 2016/0313558 A1 | 10/2016 | Gutierrez |
| 2016/0315115 A1 | 10/2016 | Izuha et al. |
| 2016/0320620 A1 | 11/2016 | Maimone |
| 2016/0327798 A1 | 11/2016 | Xiao |
| 2016/0337607 A1 | 11/2016 | Okamoto et al. |
| 2016/0359143 A1 | 12/2016 | Osawa |
| 2016/0379573 A1 | 12/2016 | de Greef |
| 2017/0003507 A1 | 1/2017 | Raval et al. |
| 2017/0026622 A1 | 1/2017 | Yoon et al. |
| 2017/0038590 A1 | 2/2017 | Jepsen |
| 2017/0038593 A1 | 2/2017 | Travers |
| 2017/0038607 A1 | 2/2017 | Camara |
| 2017/0039904 A1 | 2/2017 | Jepsen |
| 2017/0039960 A1 | 2/2017 | Jepsen |
| 2017/0052393 A1 | 2/2017 | Kweon |
| 2017/0055825 A1 | 3/2017 | Umlinson |
| 2017/0061696 A1 | 3/2017 | Li et al. |
| 2017/0061698 A1 | 3/2017 | Luebke et al. |
| 2017/0070729 A1 | 3/2017 | Li et al. |

(56) References Cited

U.S. PATENT DOCUMENTS

| | | |
|---|---|---|
| 2017/0076425 A1 | 3/2017 | Folse |
| 2017/0078652 A1 | 3/2017 | Hua et al. |
| 2017/0084867 A1 | 3/2017 | Lim et al. |
| 2017/0090194 A1 | 3/2017 | Hayes |
| 2017/0090562 A1 | 3/2017 | Gustafsson et al. |
| 2017/0091549 A1 | 3/2017 | Gustafsson et al. |
| 2017/0092232 A1 | 3/2017 | Mullins et al. |
| 2017/0097701 A1 | 4/2017 | Hong |
| 2017/0099479 A1 | 4/2017 | Browd et al. |
| 2017/0104035 A1 | 4/2017 | Lee |
| 2017/0108697 A1 | 4/2017 | El-Ghoroury et al. |
| 2017/0123488 A1 | 5/2017 | Guenter et al. |
| 2017/0123489 A1 | 5/2017 | Guenter |
| 2017/0125506 A1 | 5/2017 | Kim |
| 2017/0132976 A1 | 5/2017 | Yang et al. |
| 2017/0134691 A1 | 5/2017 | Unno |
| 2017/0141169 A1 | 5/2017 | Sim |
| 2017/0153454 A1 | 6/2017 | Callier et al. |
| 2017/0154464 A1 | 6/2017 | Lanier et al. |
| 2017/0154678 A1 | 6/2017 | Nakagawa et al. |
| 2017/0161951 A1 | 6/2017 | Fix et al. |
| 2017/0163977 A1 | 6/2017 | Fleck et al. |
| 2017/0168296 A1 | 6/2017 | Giwnewer et al. |
| 2017/0168302 A1 | 6/2017 | McDowall et al. |
| 2017/0168306 A1 | 6/2017 | Dreyer et al. |
| 2017/0169612 A1 | 6/2017 | Cashen et al. |
| 2017/0170239 A1 | 6/2017 | Lee et al. |
| 2017/0176748 A1 | 6/2017 | Kim |
| 2017/0184839 A1 | 6/2017 | Tigelaar |
| 2017/0184854 A1 | 6/2017 | Takagi et al. |
| 2017/0186370 A1 | 6/2017 | Lee et al. |
| 2017/0186804 A1 | 6/2017 | Takeuchi et al. |
| 2017/0186818 A1 | 6/2017 | Yen et al. |
| 2017/0188006 A1 | 6/2017 | Park et al. |
| 2017/0192235 A1 | 7/2017 | Petrov |
| 2017/0193687 A1 | 7/2017 | Lo et al. |
| 2017/0195658 A1 | 7/2017 | Jung |
| 2017/0200296 A1 | 7/2017 | Jones et al. |
| 2017/0220863 A1 | 8/2017 | Lection et al. |
| 2017/0236295 A1 | 8/2017 | El-Ghoroury |
| 2017/0302913 A1 | 10/2017 | Tonar et al. |
| 2017/0316544 A1 | 11/2017 | Cerny |
| 2017/0340200 A1 | 11/2017 | Bhaha et al. |
| 2018/0067237 A1 | 3/2018 | Vandame et al. |
| 2018/0104106 A1 | 4/2018 | Lee et al. |
| 2018/0125716 A1 | 5/2018 | Cho et al. |
| 2018/0125726 A1 | 5/2018 | Cho et al. |
| 2018/0269260 A1 | 9/2018 | Ghosh et al. |
| 2018/0294305 A1 | 10/2018 | Janssens |
| 2018/0295300 A1 | 10/2018 | McCorkle |
| 2018/0295310 A1 | 10/2018 | Zapor |
| 2019/0057957 A1 | 2/2019 | Xie |
| 2019/0103444 A1 | 4/2019 | Lamkin |
| 2019/0103518 A1 | 4/2019 | Lamkin |
| 2019/0140031 A1 | 5/2019 | Lamkin |

FOREIGN PATENT DOCUMENTS

| | | |
|---|---|---|
| CN | 107049721 | 8/2017 |
| EP | 0 933 753 | 8/1999 |
| EP | 2172 973 | 4/2010 |
| EP | 2975909 | 2/2016 |
| EP | 2993963 | 3/2016 |
| FR | 2852147 | 9/2004 |
| GB | 2420537 | 2/2005 |
| JP | 2014-235268 | 12/2014 |
| KR | 2009 0065182 | 6/2009 |
| KR | 1020 140140861 | 12/2014 |
| WO | WO 2015/100714 | 7/2015 |
| WO | WO 2015/193875 | 12/2015 |
| WO | WO 2016/162606 | 10/2016 |
| WO | WO 2017/005614 | 1/2017 |
| WO | WO 2017/133564 | 8/2017 |
| WO | WO 2018/022521 | 2/2018 |

OTHER PUBLICATIONS

U.S. Appl. No. 16/188,361, filed Nov. 13, 2018, Mark A. Lamkin.
PCT Notification of Transmittal of the International Search Report and the Written Opinion of the International Searching Authority, or the Declaration re PCT/US2019/014655, dated Apr. 10, 2019.
PCT Notification of Transmittal of the International Search Report and the Written Opinion of the International Searching Authority, or the Declaration re PCT/US2019/014657, dated Apr. 11, 2019.
PCT Invitation to Pay Additional Fees and, where Applicable, Protest Fee re PCT/US2019/014674, Apr. 5, 2019.
PCT Notification of Transmittal of the International Search Report and the Written Opinion of the International Searching Authority, or the Declaration re PCT/US2019/014676, dated Apr. 10, 2019.
PCT Notification of Transmittal of the International Search Report and the Written Opinion of the International Searching Authority, or the Declaration re PCT/US2019/015759, dated Apr. 18, 2019.
Lamlin, U.S. Appl. No. 15/890,945, Non-final Office Action, dated Apr. 2, 2019.
PCT Notification of Transmittal of the International Search Report and the Written Opinion of the International Searching Authority, or the Declaration, PCT/US2019/061959, dated Mar. 6, 2020.
U.S. Appl. No. 15/890,711, filed Feb. 7, 2018, Mark A. Lamkin.
U.S. Appl. No. 15/890,776, filed Feb. 7, 2018, Mark A. Lamkin.
U.S. Appl. No. 15/890,816, filed Feb. 7, 2018, Mark A. Lamkin.
U.S. Appl. No. 15/890,853, filed Feb. 7, 2018, Mark A. Lamkin.
U.S. Appl. No. 15/890,892, filed Feb. 7, 2018, Mark A. Lamkin.
U.S. Appl. No. 15/890,945, filed Feb. 7, 2018, Mark A. Lamkin.
U.S. Appl. No. 15/890,976, filed Feb. 7, 2018, Mark A. Lamkin.
Near-Eye Light Field Displays; http://research.nvidia.com/publications/near-eye-light-filed-displays-0, Downloaded Feb. 5, 2018.
Fu-Chung Huang et al., Eyeglasses-free display: towards correcting visual aberrations with computational light field displays, ACM Transactions on Graphics (TOG), Jul. 2014.
V. F. Pamplona, et al., "Tailored displays to compensate for visual aberrations." Jul. 2012.
PCT Notification of Transmittal of the Intl. Search Report and the Written Opinion of the Intl. Searching Authority, or the Declaration re PCT/US2018/053388, dated Jan. 18, 2019.
PCT Notification of Transmittal of the Intl. Search Report and the Written Opinion of the Intl. Searching Authority, or the Declaration re PCT/US2018/053374, dated Jan. 18, 2019.
PCT Invitation to Pay Additional Fees and, where Applicable, Protest Fee re PCT/US2018/056826, Feb. 5, 2019.
PCT Notification of Transmittal of the Intl. Search Report and the Written Opinion of the International Searching Authority, or the Declaration re PCT/US2018/056826, dated Apr. 16, 2019.
PCT Notification of Transmittal of the Intl. Search Report and the Written Opinion of the International Searching Authority, or the Declaration re PCT/US2018/014668, dated May 14, 2019.
B. Salahieh et al., "Light Field Retargeting from Plenoptic Camera to Integral Display," *Imaging and Applied Optics* 2017 (3D, AIO, COSI, IS, MATH, pcAOP) © OSA 2016.
S-W. Min et al., "3-D Electro-Floating Display System Using an Integral Imagine Method," revised May 12, 2005; accepted May 17, 2005, Jun. 13, 2005/vol. 13, No. 12. *Optics Express* 4358, © 2005 OSA.
X. Xiao et al., "Advances in 3-D Integral Imaging: Sensing, Display, and Applications [Invited]," XP-001580772, *Applied Optics*, vol. 52, No. 4, Feb. 1, 2013, © 2013 *Optical Society of America*.
Lamkin, U.S. Appl. No. 15/890,945, Response to Non-final Office Action, dated Jul. 16, 2019.
Lamkin, U.S. Appl. No. 15/808,368, Non-final Office Action, dated Mar. 21, 2019.
Lamkin, U.S. Appl. No. 15/808,368, Response to Non-final Office Action, dated Jun. 20, 2019.
Lamkin, U.S. Appl. No. 15/724,004, Non-final Office Action, dated Apr. 25, 2018.
Lamkin, U.S. Appl. No. 15/724,004, Response to Non-final Office Action, dated Sep. 24, 2018.
Lamkin, U.S. Appl. No. 15/724,027, Non-final Office Action, dated Dec. 21, 2018.

(56) References Cited

OTHER PUBLICATIONS

Lamkin, U.S. Appl. No. 15/724,027, Response to Non-final Office Action, dated Mar. 20, 2019.
Lamkin, U.S. Appl. No. 15/724,027, Non-final Office Action, dated Jun. 26, 2019.
Lamkin, U.S. Appl. No. 15/890,853, Non-final Office Action, dated Aug. 7, 2019.

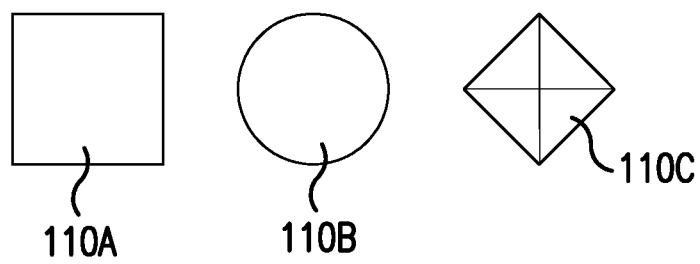
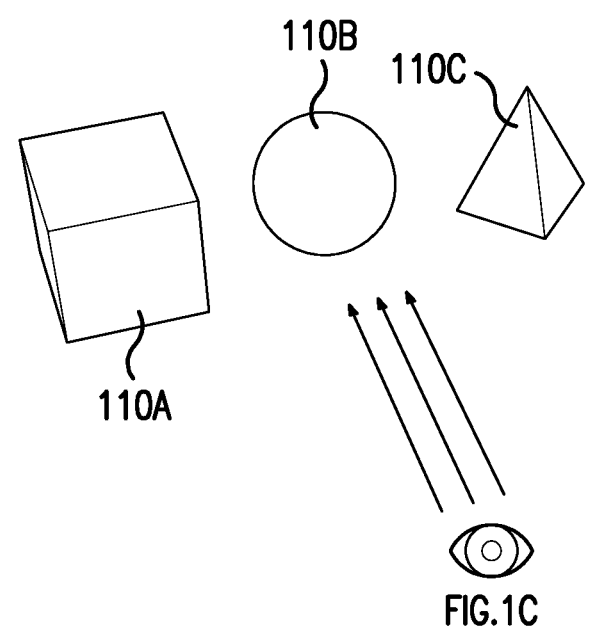
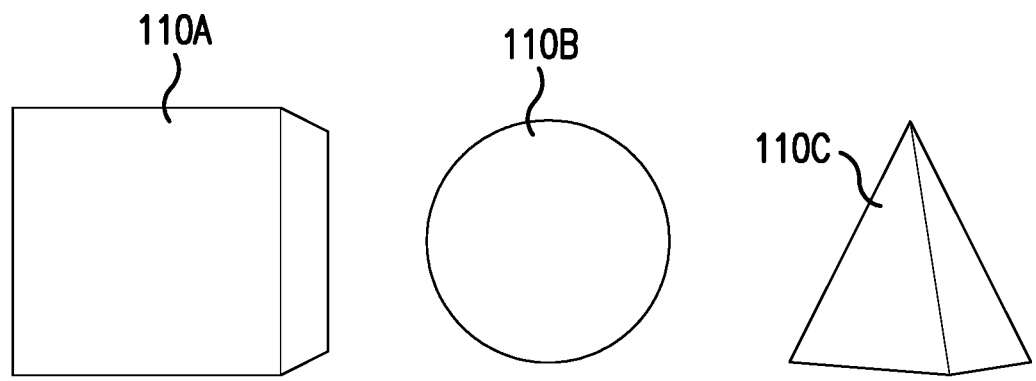

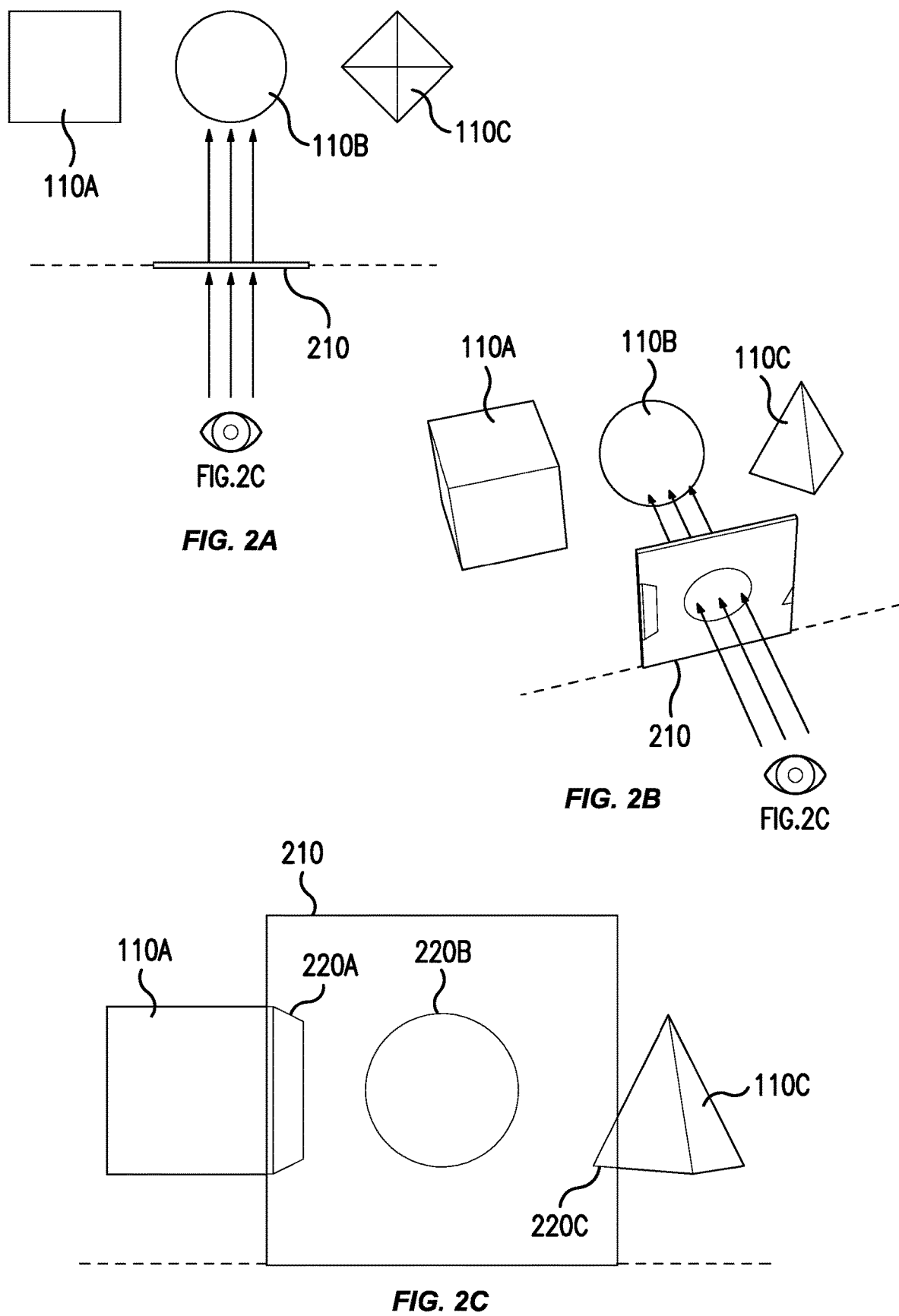

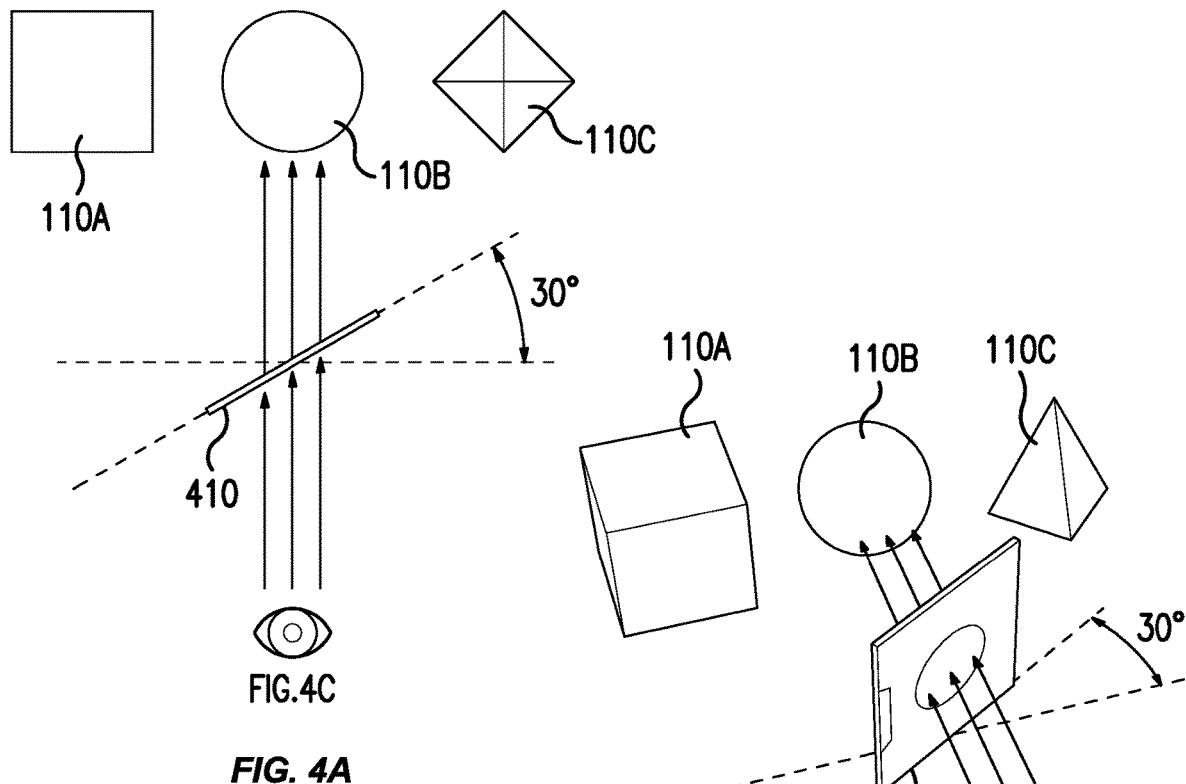
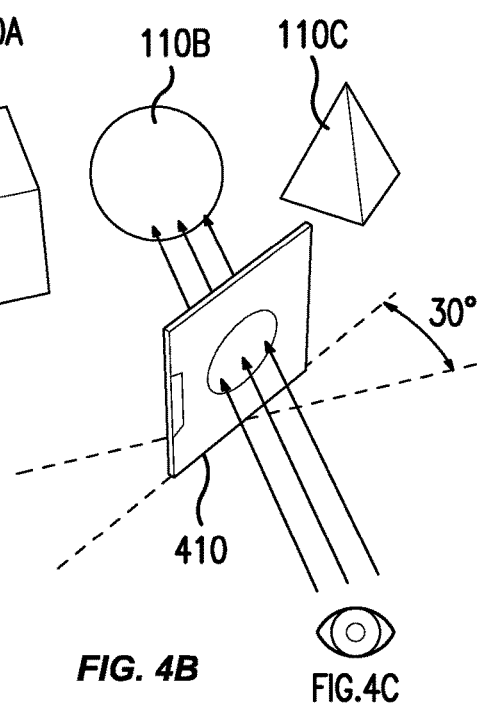
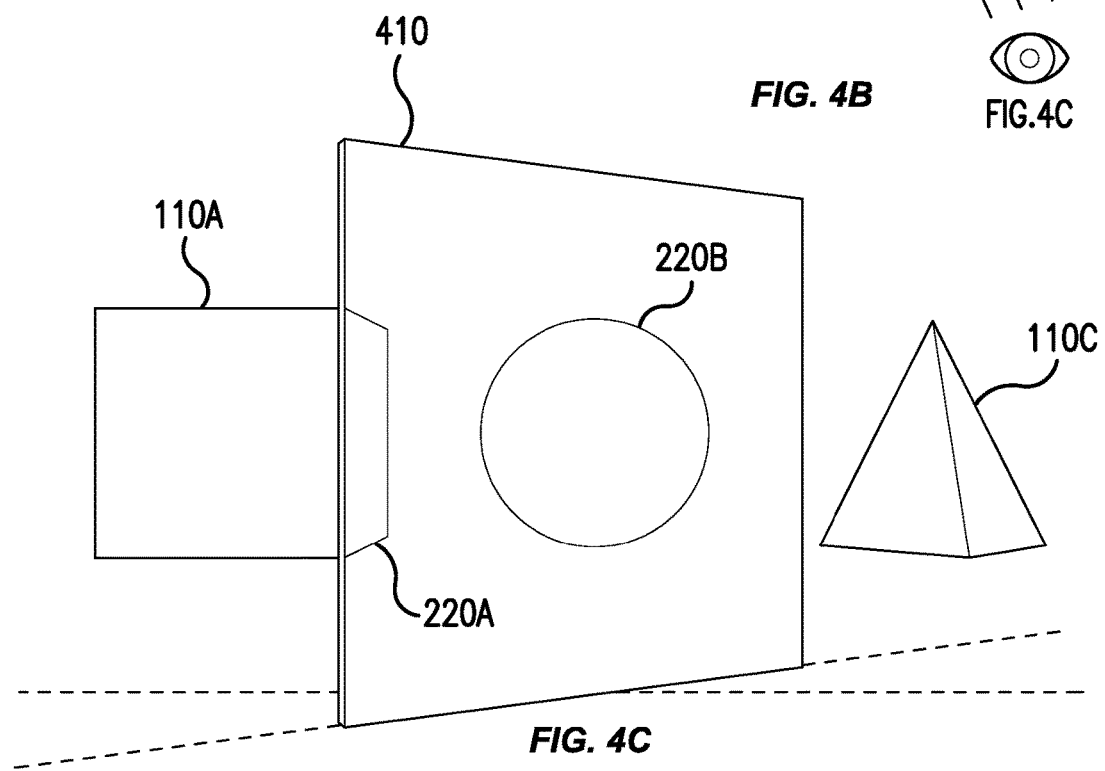
FIG. 4A
FIG. 4B
FIG. 4C

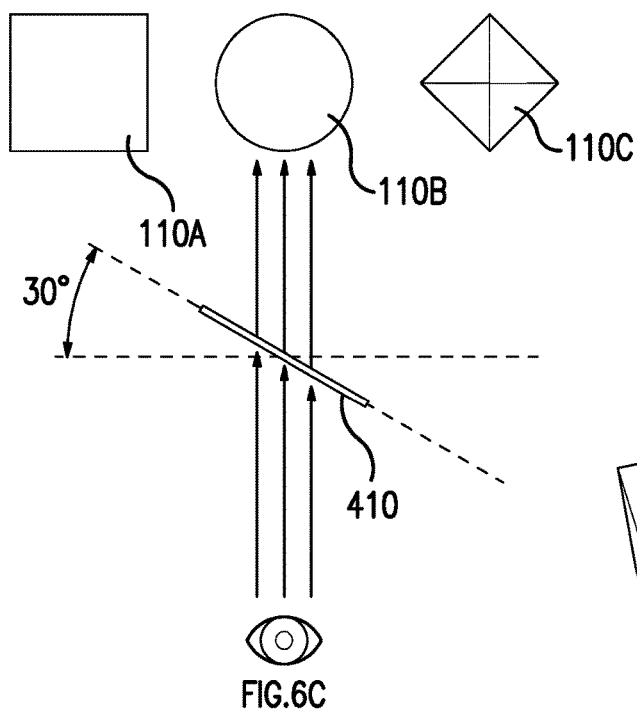
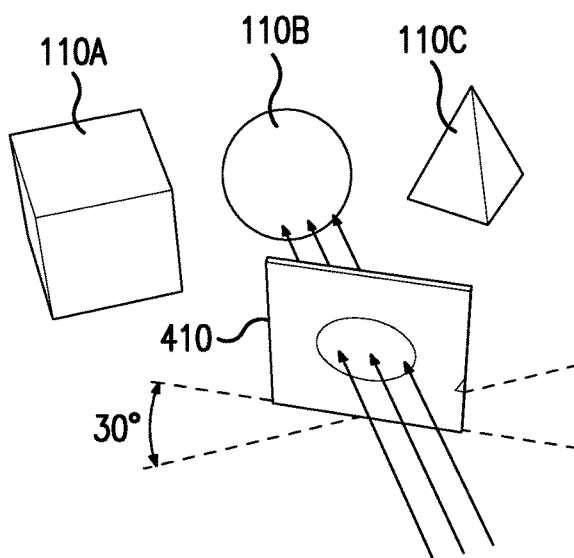
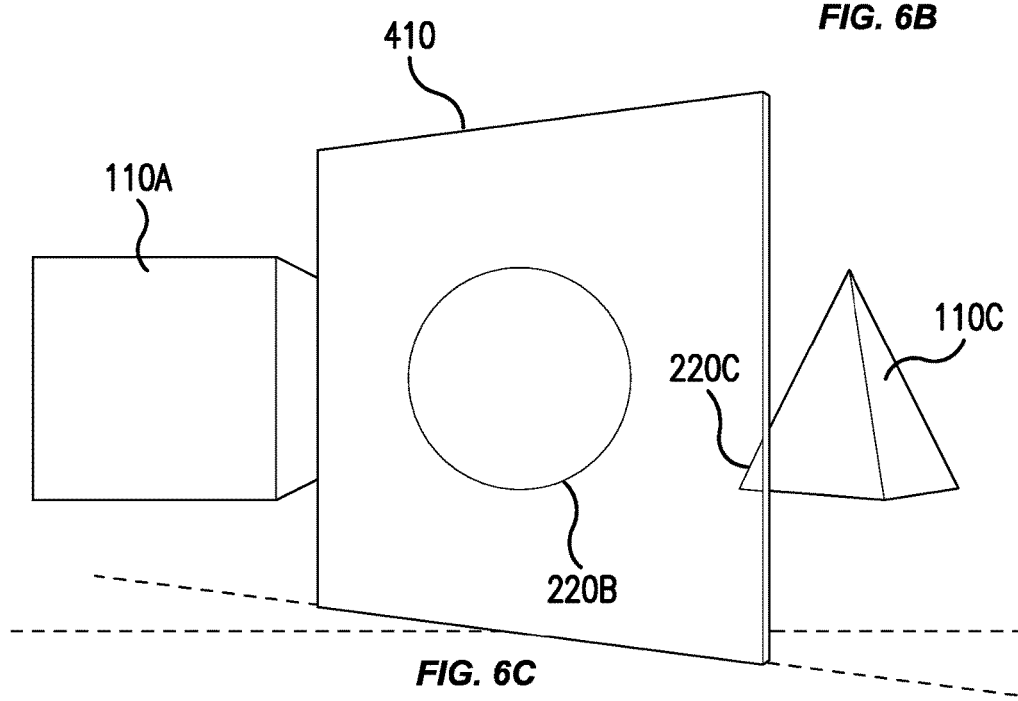
FIG. 6A
FIG. 6B
FIG. 6C

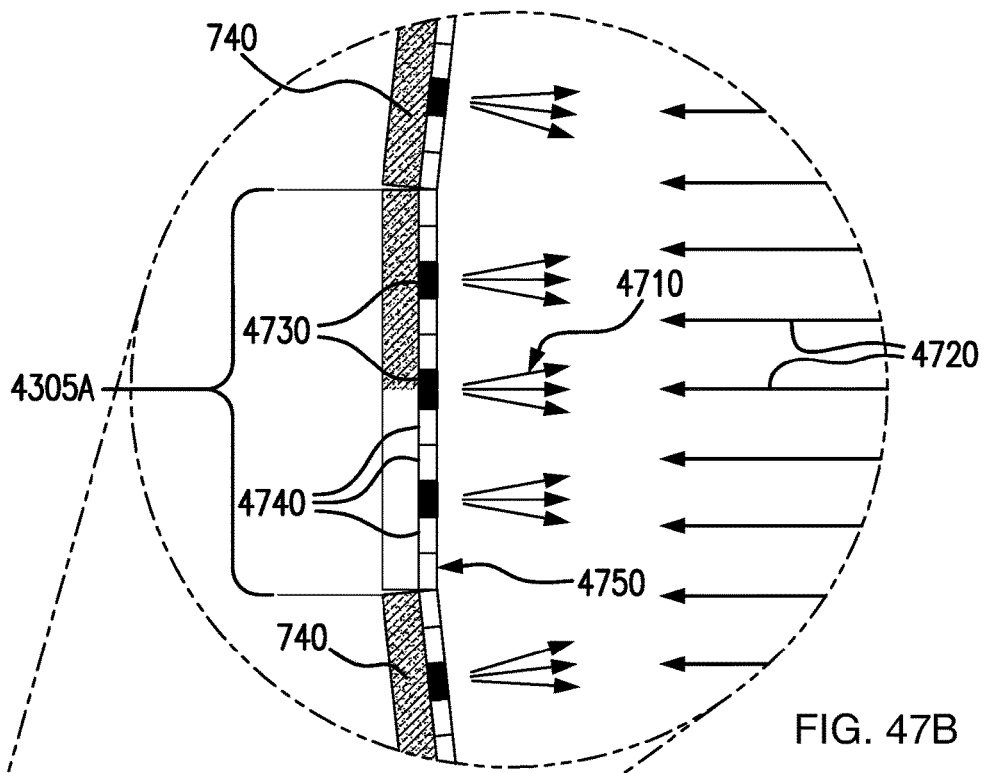
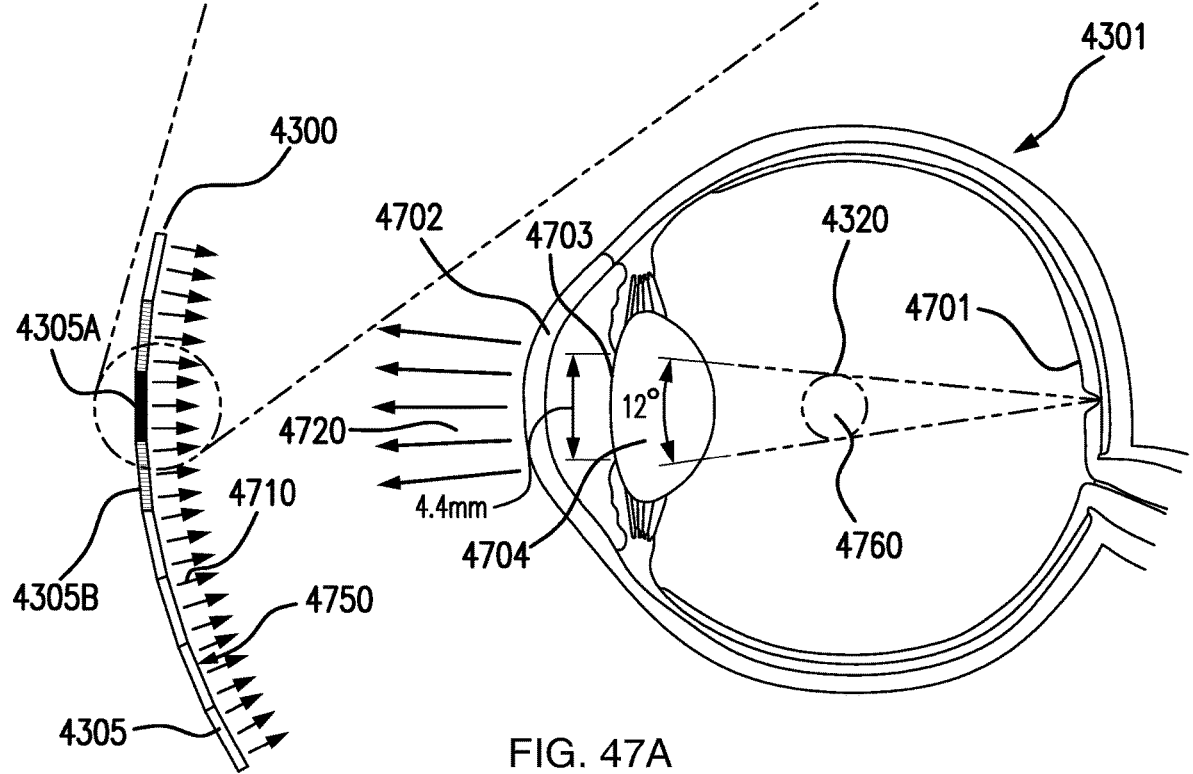
FIG. 47B
FIG. 47A

ECCENTRIC INCIDENT LUMINANCE PUPIL TRACKING

TECHNICAL FIELD

This disclosure relates generally to light field displays and cameras, and more particularly to eccentric incident luminance pupil tracking systems and methods.

BACKGROUND

Electronic displays are utilized in a variety of applications. For example, displays are used in smartphones, laptop computers, and digital cameras. Some devices, such as smartphones and digital cameras, may include an image sensor in addition to an electronic display. While some cameras and electronic displays separately capture and reproduce light fields, light field displays and light field cameras are generally not integrated with one another.

SUMMARY OF PARTICULAR EMBODIMENTS

In one embodiment, an electronic assembly includes a flexible circuit board formed into a curved shape that is configured to be substantially concentric with a viewer's eye. The electronic assembly further includes a plurality of facets coupled to a side of curved shape of the flexible circuit board that is configured to face the viewer's eye. Each facet has a planar face, one or more emitters configured to emit light towards the viewer's eye, and one or more receptors configured to detect the emitted light after it has been reflected back towards the electronic assembly from a retina of the viewer's eye. Each face is normal to a line pointing towards a center area of the viewer's eye when the curved shape is substantially concentric with the viewer's eye. Each facet is individually addressable such that the plurality of facets are configurable to detect a center of gaze of the viewer.

The present disclosure presents several technical advantages. Some embodiments provide a complete and accurate recreation of a target light field while remaining lightweight and comfortable to wear for a user. Some embodiments provide a thin electronic system which offers both opacity and controllable unidirectional emulated transparency, as well as digital display capabilities such as virtual reality (VR), augmented reality (AR), and mixed reality (MR). Some embodiments provide a direct sensor-to-display system that utilizes a direct association of input pixels to corollary output pixels to circumvent the need for image transformation. This reduces the complexity, cost, and power requirements for some systems. Some embodiments provide in-layer signal processing configurations that provide for local, distributed processing of large quantities of data (e.g., 160 k of image data or more), thereby circumventing bottlenecks as well as performance, power, and transmission line issues associated with existing solutions. Some embodiments utilize microlens layers with arrays of plenoptic cells to accurately capture and display a volume of light to a viewer. The plenoptic cells include opaque cell walls to eliminate optical cross-talk between cells, thereby improving the accuracy of the replicated light field.

Some embodiments provide three-dimensional electronics by geodesic faceting. In such embodiments, a flexible circuit board with an array of small, rigid surfaces (e.g., display and/or sensor facets) may be formed into any 3D shape, which is especially useful to accommodate the narrow radii of curvature (e.g., 30-60 mm) necessary for head-mounted near-eye wrapped displays. Some embodiments provide distributed multi-screen arrays for high density displays. In such embodiments, an array of small, high-resolution micro displays (e.g., display facets) of custom sizes and shapes are formed and then assembled on a larger, flexible circuit board that may then be formed into a 3D shape (e.g., a semispherical surface). Each micro display may act independently of any other display, thereby providing a large array of many high-resolution displays with unique content on each, such that the whole assembly together forms essentially a single extremely high-resolution display. Some embodiments provide a distributed multi-aperture camera array. Such embodiments provide an array of small image sensors (e.g., sensor facets) of custom sizes and shapes, all of which are assembled on a larger, flexible circuit board that is then formed to a 3D (e.g., semispherical) shape. Each discrete image sensor may act independently of any other image sensor in order to provide a large array of many apertures capturing unique content on each, such that the whole assembly essentially becomes a seamless, very high resolution, multi-node camera.

Some embodiments utilize tracking surfaces to track a viewer's eye and to determine a center of gaze of the user. In some embodiments, the tracking surfaces are ocular-centric (i.e., have curved shapes that are substantially concentric with an eye of the viewer). In other embodiments, the tracking surfaces are not ocular-centric. The tracking surfaces may include IR emitters to emit IR light into the viewer's eye and IR detectors to detect a cone of retro-reflected IR light from the viewer's eye (e.g. from the retina or other portion of the eye). In some embodiments, the IR emitters and detectors are embedded within display pixels of display facets of a near-eye wrapped display.

Other technical advantages will be readily apparent to one skilled in the art from FIGS. 1A through 42, their descriptions, and the claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which:

FIGS. 1A-1C illustrate a reference scene with various three-dimensional (3D) objects and various viewing positions, according to certain embodiments;

FIGS. 2A-2C illustrate viewing the 3D objects of FIGS. 1A-1C through a transparent panel, according to certain embodiments;

FIGS. 4A-4C illustrate viewing the 3D objects of FIGS. 1A-1C through an emulated-transparency electronic panel, according to certain embodiments;

FIGS. 6A-6C illustrate viewing the 3D objects of FIGS. 1A-1C through the emulated-transparency electronic panel of FIGS. 4A-4C from an alternate angle, according to certain embodiments;

FIGS. 47A-47B illustrate cross-sectional views of the near-eye pupil-tracking surface of FIGS. 43-46, according to certain embodiments;

DETAILED DESCRIPTION OF EXAMPLE EMBODIMENTS

Electronic displays are utilized in a variety of applications. For example, displays are used in smartphones, laptop computers, and digital cameras. Some devices, such as smartphones and digital cameras, may include an image sensor in addition to an electronic display. Devices with displays and image sensors, however, are generally limited in their ability to accurately capture and display the full photonic environment.

Figure 10:
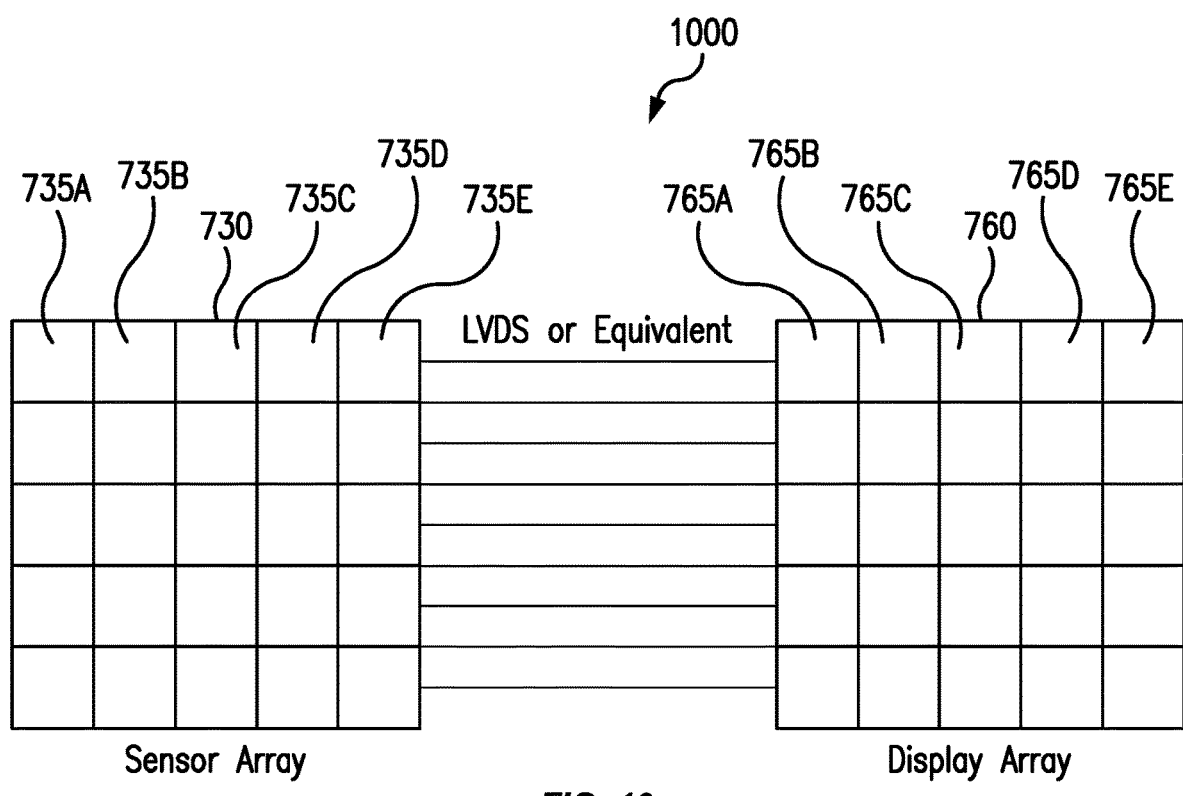
FIG. 10 illustrates a direct sensor-to-display system that may be used by the emulated transparency assembly of FIG. 7, according to certain embodiments.
Figure 11:
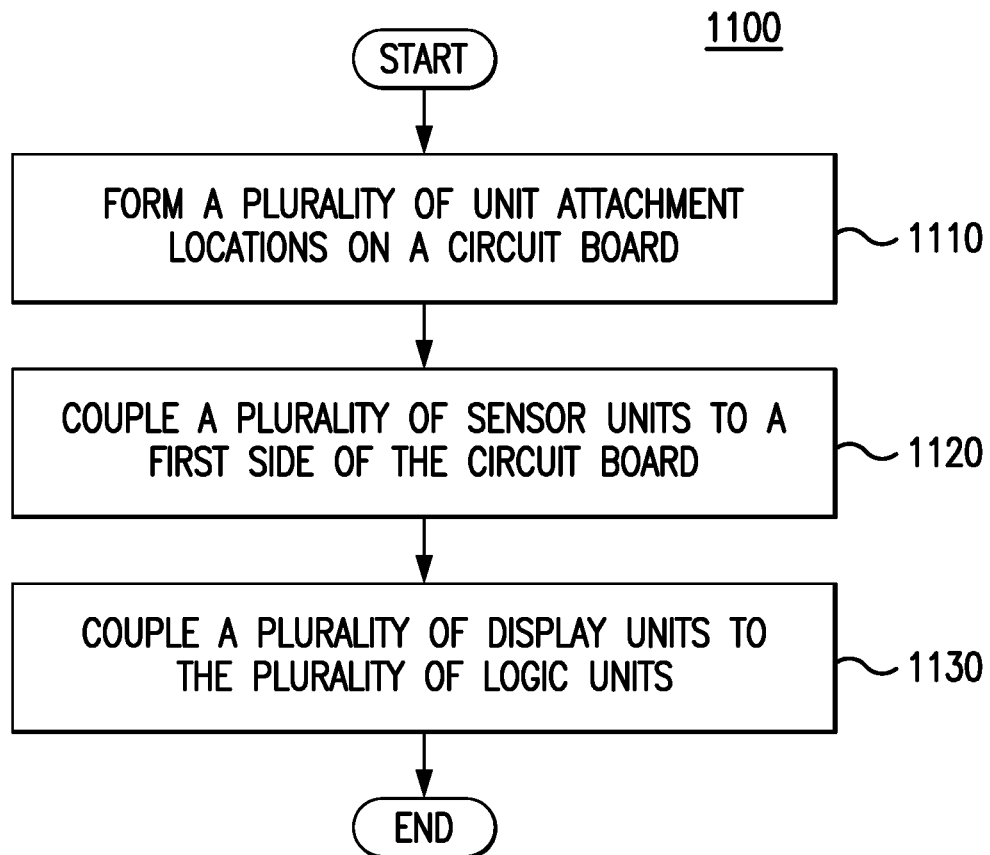
FIG. 11 illustrates a method of manufacturing the direct sensor-to-display system of FIG. 10, according to certain embodiments.
Figure 12:
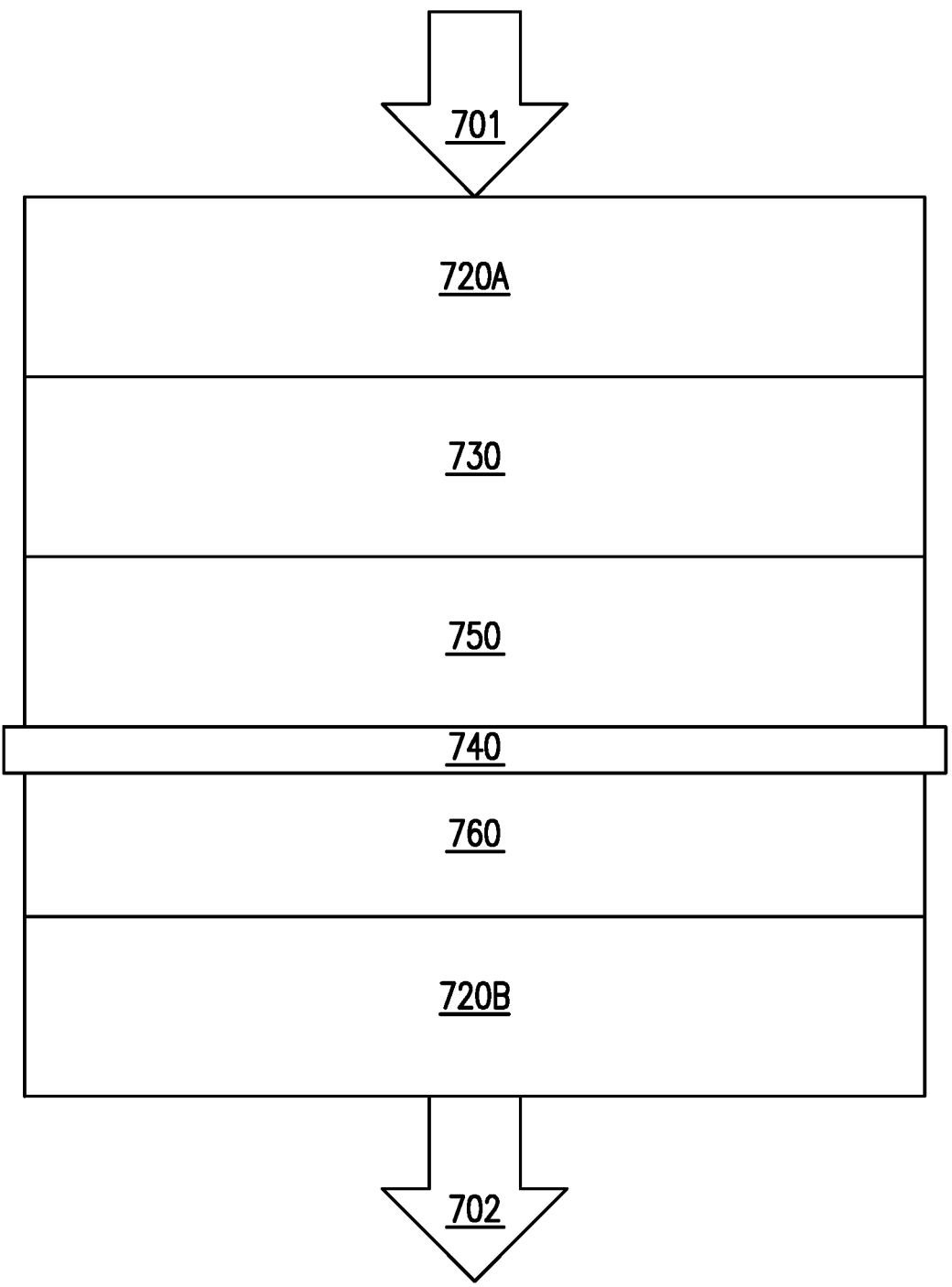
FIGS. 12-13 illustrate various in-layer signal processing configurations that may be used by the emulated transparency assembly of FIG. 7, according to certain embodiments.
Figure 13:
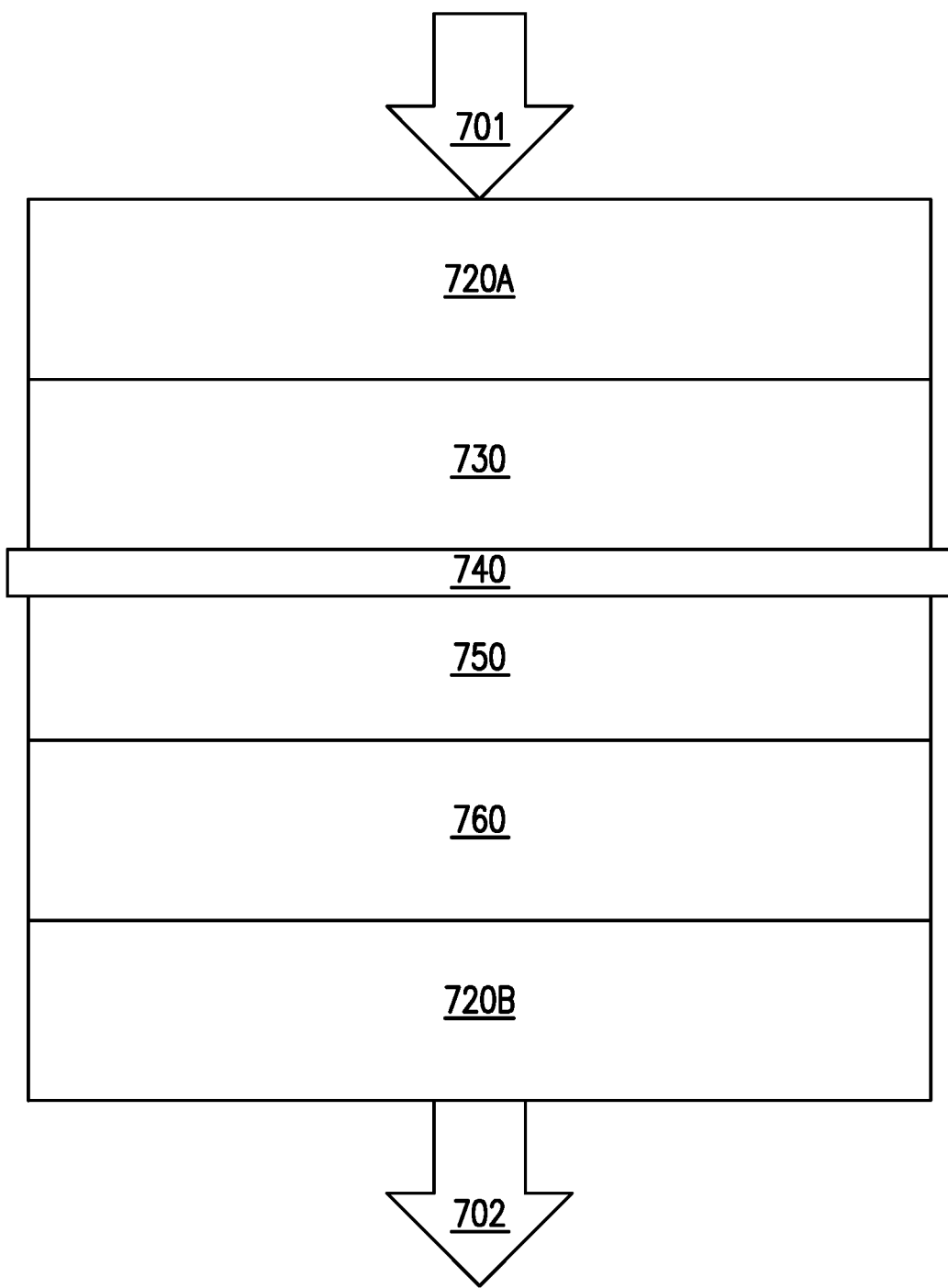
Figure 14:
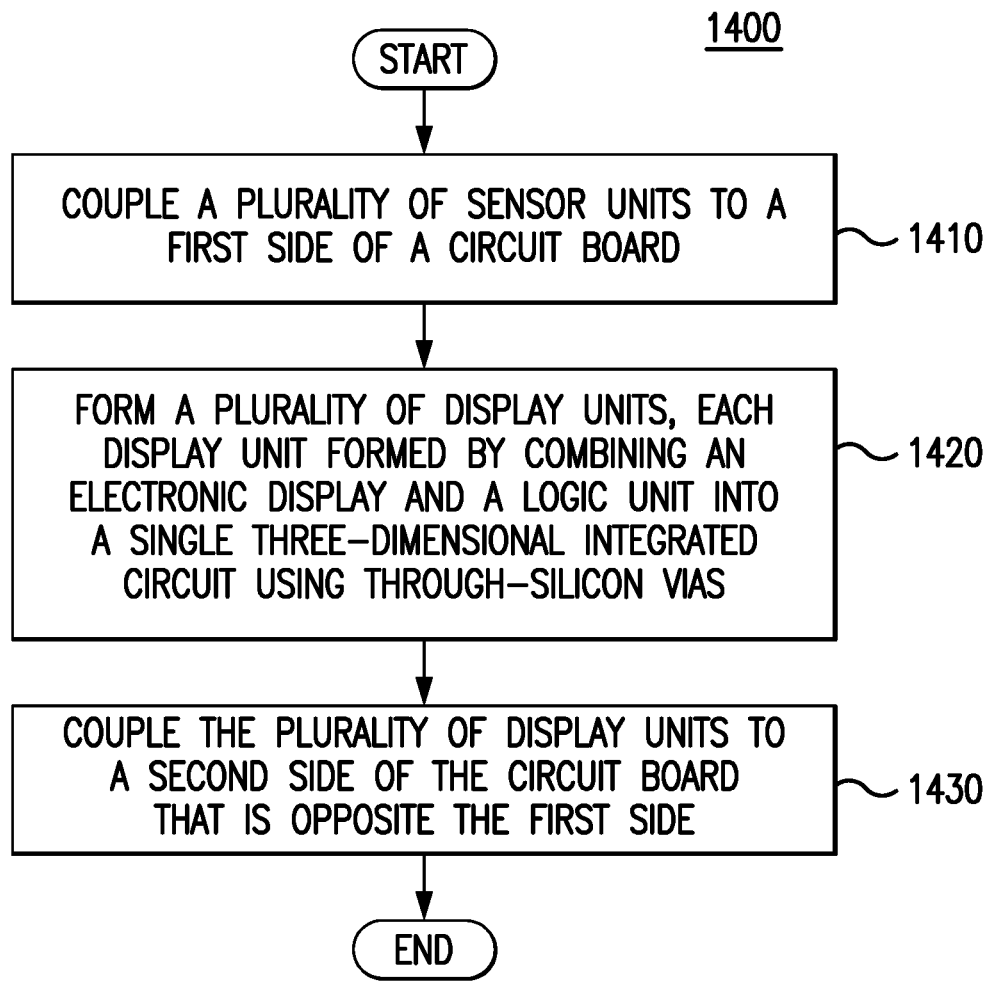
FIG. 14 illustrates a method of manufacturing the in-layer signal processing systems of FIGS. 12-13, according to certain embodiments.

To address problems and limitations associated with existing electronic displays, embodiments of the disclosure provide various electronic assemblies for capturing and displaying light fields. FIGS. 1A-9 are directed to display assemblies with electronically emulated transparency, FIGS. 10-11 are directed to direct camera-to-display systems, FIGS. 12-14 are directed to in-layer signal processing, FIGS. 15-21 are directed to plenoptic cellular imaging systems, FIGS. 22-25 are directed to three-dimensional (3D) electronics distribution by geodesic faceting, FIGS. 26-36 are directed to distributed multi-screen arrays for high density displays, FIGS. 37-42 are directed to distributed multi-aperture camera arrays, and FIGS. 43-51 are directed to tracking surfaces that utilize IR emitters and IR detectors to detect a cone of retinal retro-reflected IR light from the viewer's eye.

To facilitate a better understanding of the present disclosure, the following examples of certain embodiments are given. The following examples are not to be read to limit or define the scope of the disclosure. Embodiments of the present disclosure and its advantages are best understood by referring to FIGS. 1A-42, where like numbers are used to indicate like and corresponding parts.

FIGS. 1A-9 illustrate various aspects of an assembly with electronically emulated transparency, according to certain embodiments. In general, the electronic assembly illustrated in detail in FIGS. 7-8 may be used in different applications to provide features such as virtual reality (VR), augmented reality (AR), and mixed reality (MR). For VR applications, a digital display is required which can completely replace a view of the real world, similar to how a standard computer monitor blocks the view of the scene behind it. However, for AR applications, a digital display is required which can overlay data on top of that view of the real world, such as a pilot's heads-up display in a modern cockpit. MR applications require a combination of both. Typical systems used to provide some or all of these features are not desirable for a number of reasons. For example, typical solutions do not provide an accurate or complete recreation of a target light field. As another example, existing solutions are typically bulky and not comfortable for users.

To address problems and limitations with existing electronic displays, embodiments of the disclosure provide a thin electronic system which offers both opacity and controllable unidirectional emulated transparency, as well as digital display capabilities. From one side the surface appears opaque, but from the opposite side the surface can appear fully transparent, appear fully opaque, act as a digital display, or any combination of these. In some embodiments, simultaneous plenoptic sensing and display technologies are combined within a single layered structure to form what appears to be a unidirectional visually transparent surface. The system may include multiple layers of electronics and optics for the purpose of artificially recreating transparency that may be augmented and/or digitally controlled. Individual image sensor pixels on one side may be arranged spatially to match the positions of display pixels on the opposite side of the assembly. In some embodiments, all electronic driving circuitry as well as some display logic circuitry may be sandwiched between the sensor layer and display layer, and each sensor pixel's output signal may be channeled through the circuitry to the corresponding display pixel on the opposite side. In some embodiments, this centrally-processed signal is aggregated with the incoming signal from the plenoptic imaging sensor array on the opposite side, and is handled according to the following modes of operation. In VR mode, the external video feed overrides the camera data, completely replacing the user's view of the outside world with the incoming view from the video. In AR mode, the external video feed is overlaid on the camera data, resulting in a combined view of both the external world and the view from the video (e.g., the video data is simply added to the scene). In MR mode, the external video feed is mixed with the camera data, allowing virtual objects to appear to interact with actual objects in the real world, altering the virtual content to make it appear integrated with the actual environment through object occlusion, lighting, etc.

Some embodiments combine stacked transparent high dynamic range (HDR) sensor and display pixels into a single structure, with sensor pixels on one side of the assembly and display pixels on the other, and with pixel-for-pixel alignment between camera and display. Both the sensor and display pixel arrays may be focused by groups of micro lenses to capture and display four-dimensional light fields. This means that the complete view of the real world is captured on one side of the assembly and electronically reproduced on the other, allowing for partial or complete alteration of the incoming image while maintaining image clarity, luminance, and enough angular resolution for the display side to appear transparent, even when viewed at oblique angles.

FIGS. 1A-6C are provided to illustrate the differences between electronically emulated transparency provided by embodiments of the disclosure and typical camera images (such as through a camera viewfinder or using a smartphone to display its current camera image). FIGS. 1A-1C illustrate a reference scene with various 3D objects 110 (i.e., 110A-C) and a frontal viewing position, according to certain embodiments. FIG. 1A is a top view of an arrangement of 3D objects 110 and a frontal viewing direction of 3D objects 110. FIG. 1B is a perspective view of the same arrangement of 3D objects 110 and frontal viewing direction as FIG. 1A. FIG. 1C is the resulting front view of 3D objects 110 from the position illustrated in FIGS. 1A and 1B. As can be seen, the view in FIG. 1C of 3D objects 110 is a normal, expected view of 3D objects 110 (i.e., the view of 3D objects 110 is not altered at all because there is nothing between the viewer and 3D objects 110).

FIGS. 2A-2C illustrate viewing the 3D objects 110 of FIGS. 1A-1C through a transparent panel 210, according to certain embodiments. Transparent panel 210 may be, for example, a piece of transparent glass. FIG. 2A is a top view of a frontal viewing direction of 3D objects 110 through transparent panel 210, and FIG. 2B is a perspective view of the same arrangement of 3D objects 110 and frontal viewing direction as FIG. 2A. FIG. 2C is the resulting front view of 3D objects 110 through transparent panel 210 from the position illustrated in FIGS. 2A and 2B. As can be seen, the view in FIG. 2C of 3D objects 110 through transparent panel 210 is a normal, expected view of 3D objects 110 (i.e., the view of 3D objects 110 is not altered at all because the viewer is looking through a transparent panel 210). In other words, the view of 3D objects 110 through transparent panel 210 in FIG. 2C is the same as the view in FIG. 1C where no object is between the viewer and 3D objects 110 (i.e., "perceived" transparency). Stated another way, the edges of the projected imagery on transparent panel 210 line up with the view of the actual 3D objects 110 behind transparent panel 210 to create a view-aligned image 220A of 3D object 110A, a view-aligned image 220B of 3D object 110B, and a view-aligned image 220C of 3D object 110C.

Figure 3A:
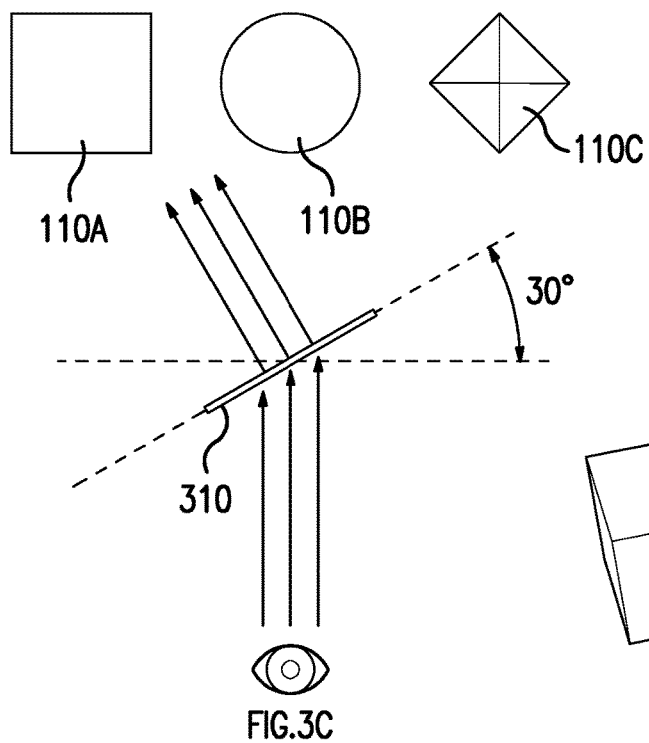
FIGS. 3A-3C illustrate viewing the 3D objects of FIGS. 1A-1C through a camera image panel, according to certain embodiments.
Figure 3B:
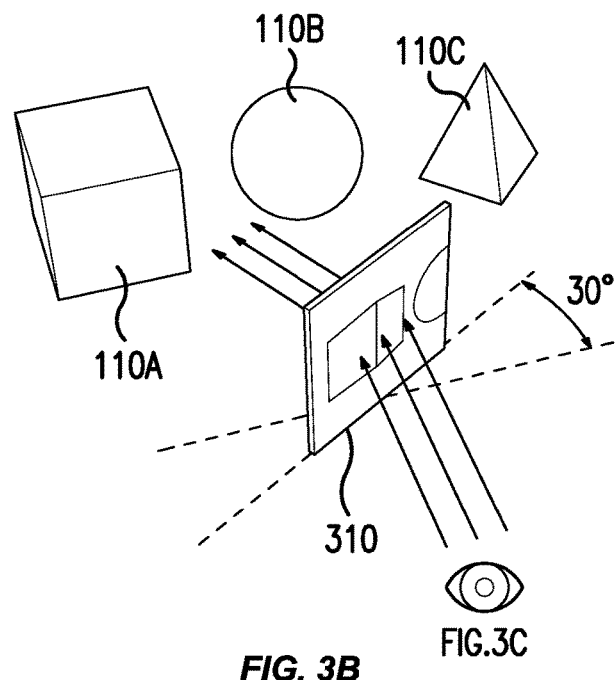
Figure 3C:
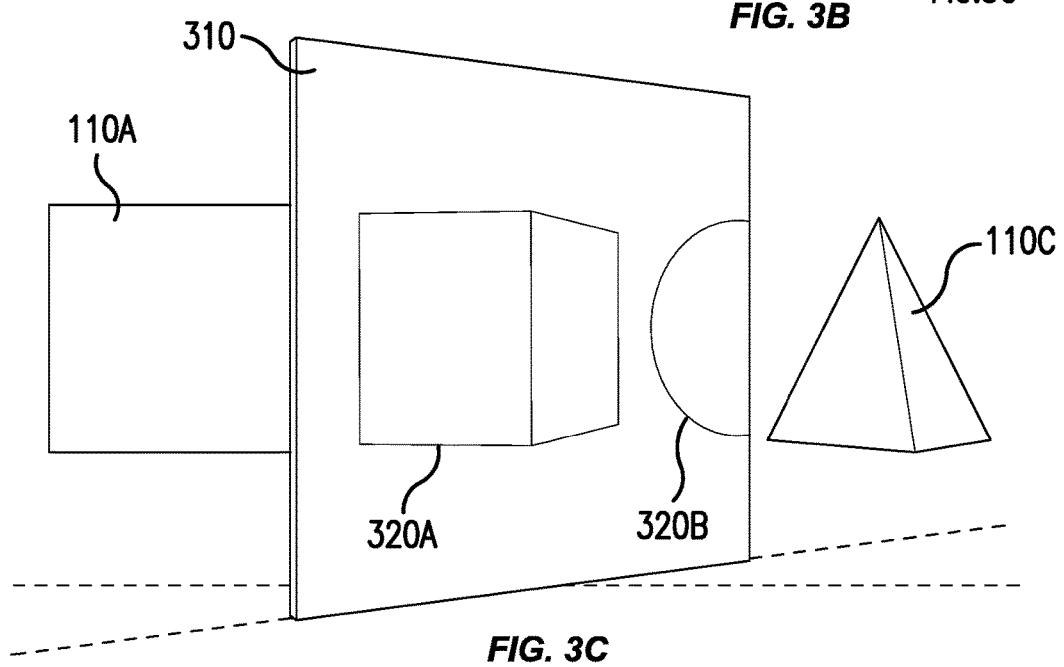

FIGS. 3A-3C illustrate viewing the 3D objects 110 of FIGS. 1A-1C through a camera image panel 310, according to certain embodiments. Camera image panel 310 may be, for example, a camera viewfinder or a display of a smartphone that is displaying its current camera image. In these images, camera image panel 310 is at an angle (e.g., 30 degrees) to the viewer to illustrate how such systems do not provide true emulated transparency. FIG. 3A is a top view of a frontal viewing direction of 3D objects 110 through camera image panel 310, and FIG. 3B is a perspective view of the same arrangement of 3D objects 110 and frontal viewing direction as FIG. 3A. FIG. 3C is the resulting front view of 3D objects 110 through camera image panel 310 from the position illustrated in FIGS. 3A and 3B. As can be seen, the view in FIG. 3C of 3D objects 110 through camera image panel 310 is different from a view of 3D objects 110 through transparent panel 210. Here, camera image panel 310 redirects the lines of sight that are normal to camera image panel 310, thereby showing no perceived transparency (i.e., the image on camera image panel 310 is not aligned with the view but instead depicts the image acquired by the redirected lines of sight). Stated another way, the edges of the projected imagery on camera image panel 310 do not line up with the view of the actual 3D objects 110 behind camera image panel 310. This is illustrated by an unaligned image 320A of 3D object 110A and an unaligned image 320B of 3D object 110B on camera image panel 310 in FIG. 3C.

FIGS. 4A-4C illustrate viewing the 3D objects 110 of FIGS. 1A-1C through an emulated-transparency electronic panel 410, according to certain embodiments. In these images, emulated transparency panel 410 is at an angle (e.g., 30 degrees) to the viewer to illustrate how emulated transparency panel 410 provides true emulated transparency unlike camera image panels 310. FIG. 4A is a top view of a frontal viewing direction of 3D objects 110 through emulated transparency panel 410, and FIG. 4B is a perspective view of the same arrangement of 3D objects 110 and frontal viewing direction as FIG. 4A. FIG. 4C is the resulting front view of 3D objects 110 through emulated transparency panel 410 from the position illustrated in FIGS. 4A and 4B. As can be seen, the view in FIG. 4C of 3D objects 110 through emulated transparency panel 410 is different from a view of 3D objects 110 through camera image panel 310 but is similar to a view of 3D objects 110 through transparent panel 210. Here, emulated transparency panel 410 does not redirect the lines of sight from the viewer through emulated transparency panel 410, but allows them to remain virtually unchanged and thereby providing emulated transparency (i.e., the image on emulated transparency panel 410 is aligned with the view as in transparent panel 210). Like transparent panel 210, the edges of the projected imagery on emulated transparency panel 410 lines up with the view of the actual 3D objects 110 behind emulated transparency panel 410 to create view-aligned image 220A of 3D object 110A, view-aligned image 220B of 3D object 110B, and view-aligned image 220C of 3D object 110C.

Figure 5A:
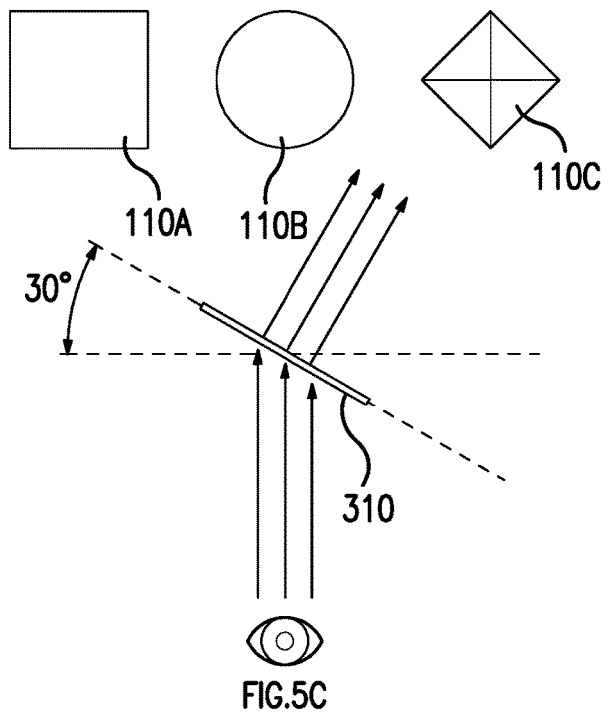
FIGS. 5A-5C illustrate viewing the 3D objects of FIGS. 1A-1C through the camera image panel of FIGS. 3A-3C from an alternate angle, according to certain embodiments.
Figure 5B:
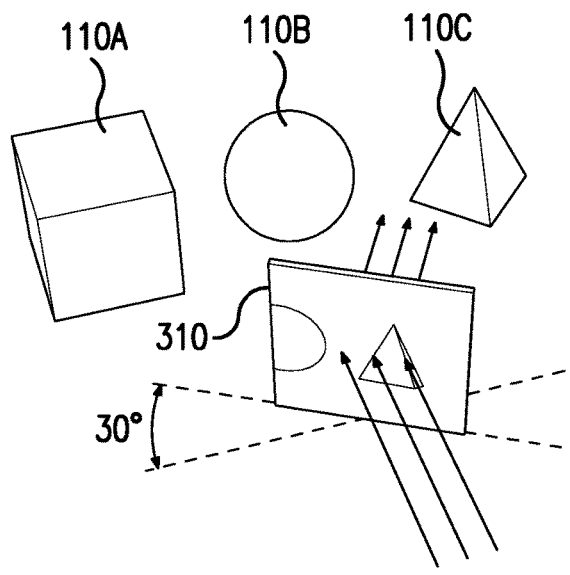
Figure 5C:
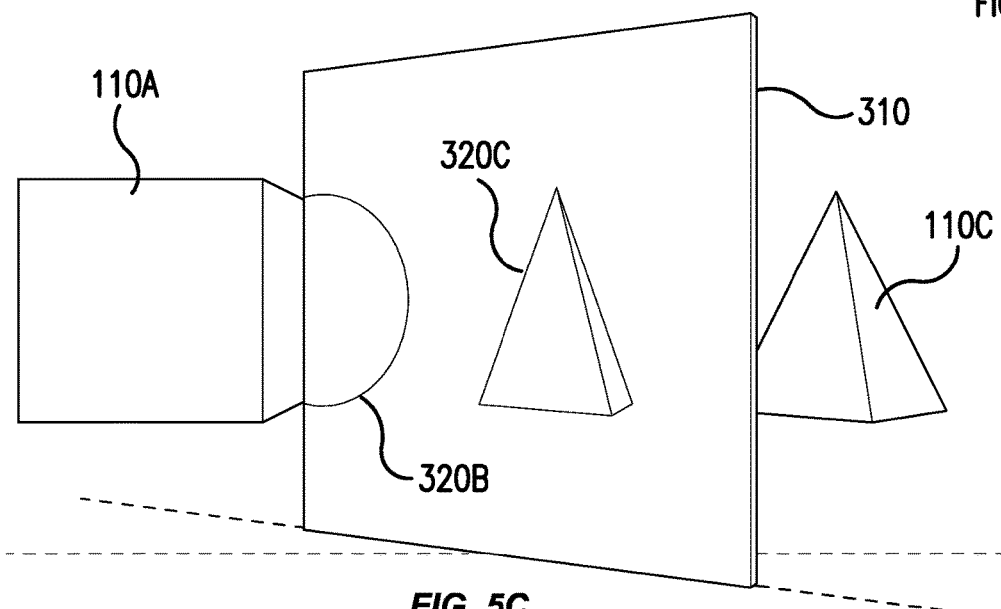

FIGS. 5A-5C illustrate viewing the 3D objects 110 of FIGS. 1A-1C through the camera image panel 310 of FIGS. 3A-3C, but from an alternate angle. In these images, camera image panel 310 is at a different 30 degree angle to the viewer to further illustrate how such systems do not provide true emulated transparency. Like in FIGS. 3A-3C, the edges of the projected imagery on camera image panel 310 do not line up with the view of the actual 3D objects 110 behind camera image panel 310. This is illustrated by an unaligned image 320C of 3D object 110C and an unaligned image 320B of 3D object 110B on camera image panel 310 in FIG. 5C.

FIGS. 6A-6C illustrate viewing the 3D objects 110 of FIGS. 1A-1C through the emulated-transparency electronic panel 410 of FIGS. 4A-4C, but from an alternate angle. Like in FIGS. 4A-4C, the edges of the projected imagery on emulated transparency panel 410 in FIG. 6C line up with the view of the actual 3D objects 110 behind emulated transparency panel 410 to create view-aligned image 220B of 3D object 110B and view-aligned image 220C of 3D object 110C.

Figure 7:
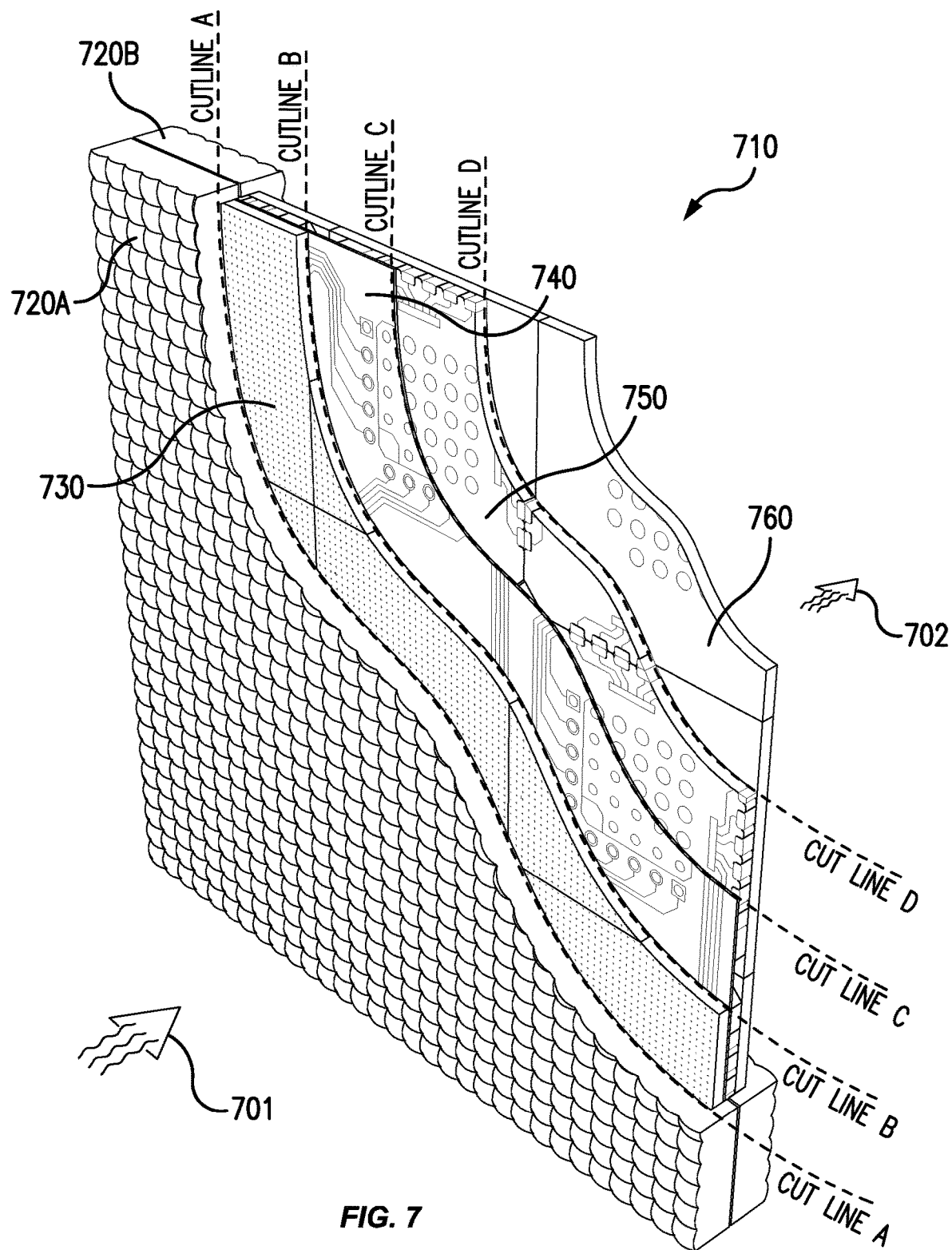
FIG. 7 illustrates a cut-away view of an emulated transparency assembly, according to certain embodiments.
Figure 8:
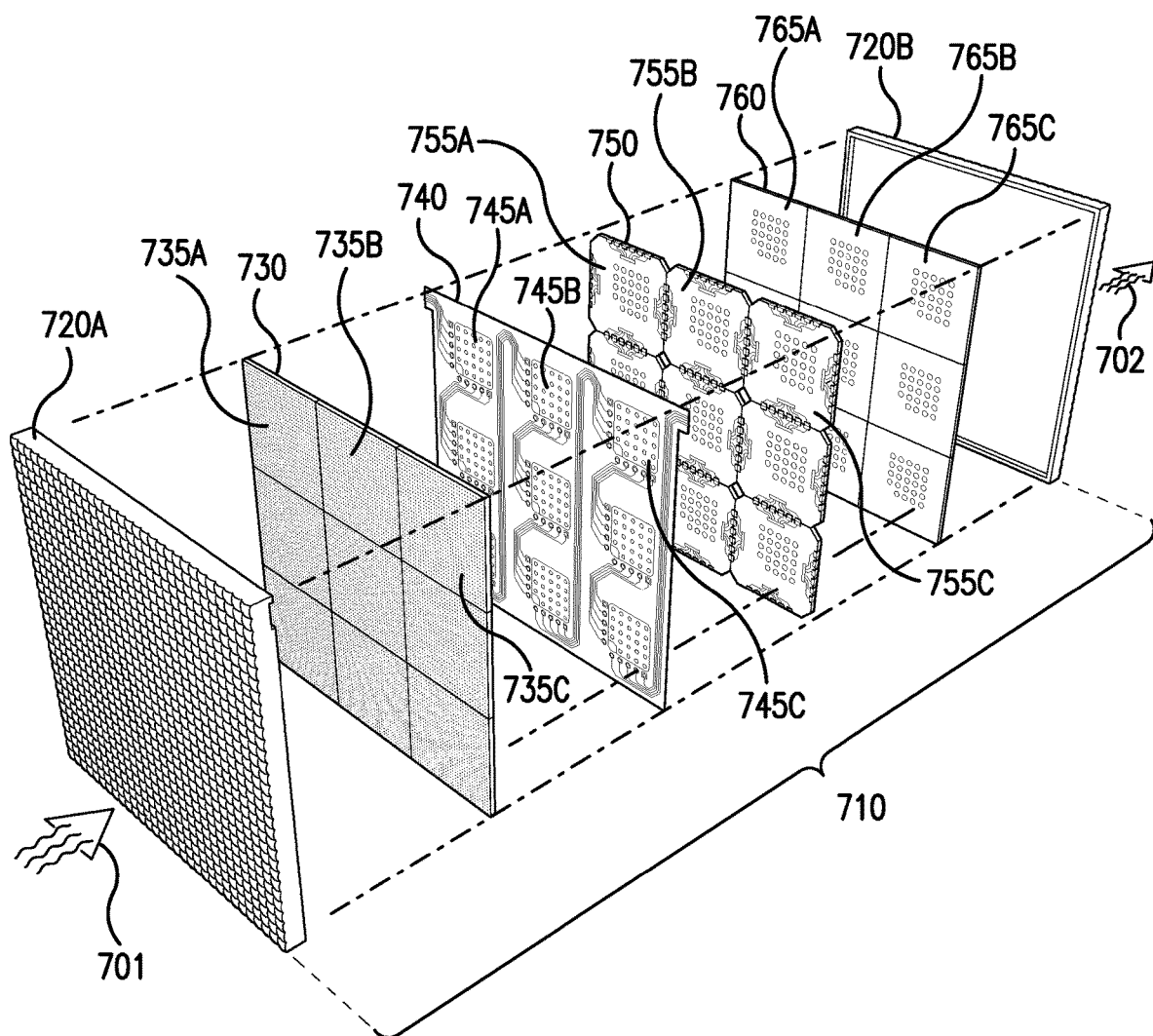
FIG. 8 illustrates an exploded view of the emulated transparency assembly of FIG. 7, according to certain embodiments.

As illustrated above in FIGS. 4A-4C and 6A-6C, emulated transparency panel 410 provides view-aligned images 220 of 3D objects 110 behind emulated transparency panel 410, thereby providing electronically-emulated transparency. FIGS. 7-8 illustrate an example embodiment of emulated transparency panel 410. FIG. 7 illustrates a cut-away view of an emulated transparency assembly 710 which may be emulated transparency panel 410, and FIG. 8 illustrates an exploded view of the emulated transparency assembly 710 of FIG. 7, according to certain embodiments.

In some embodiments, emulated transparency assembly 710 includes two microlens arrays 720 (i.e., a sensor side microlens array 720A and a display side microlens array 720B), an image sensor layer 730, a circuit board 740, and an electronic display layer 760. In general, incoming light field 701 enters sensor side microlens array 720A where it is detected by image sensor layer 730. Electronically-replicated outgoing light field 702 is then generated by electronic display layer 760 and projected through display side microlens array 720B. As explained in more detail below, the unique arrangement and features of emulated transparency assembly 710 permits it to provide electronically-emulated transparency via electronically-replicated outgoing light field 702, as well as other features described below. While a specific shape of emulated transparency assembly 710 is illustrated in FIGS. 7-8, emulated transparency assembly 710 may have any appropriate shape including any polygonal or non-polygonal shape, and both flat and non-flat configurations.

Microlens arrays 720 (i.e., sensor side microlens array 720A and display side microlens array 720B) are generally layers of microlenses. In some embodiments, each microlens of microlens arrays 720 is a plenoptic cell 1510 as described in more detail below in reference to FIG. 15. In general, each microlens of sensor side microlens array 720A is configured to capture a portion of incoming light field 701 and direct it to pixels within image sensor layer 730. Similarly, each microlens of display side microlens array 720B is configured to emit a portion of electronically-replicated outgoing light field 702 that is generated by pixels of electronic display layer 760. In some embodiments, each microlens of sensor side microlens array 720A and display side microlens array 720B is in a 3D shape with a collimating lens on one end of the 3D shape. The 3D shape may be, for example, a triangular polyhedron, a rectangular cuboid, a pentagonal polyhedron, a hexagonal polyhedron, a heptagonal polyhedron, or an octagonal polyhedron. In some embodiments, each microlens of sensor side microlens array 720A and display side microlens array 720B includes opaque walls such as cell walls 1514 (discussed below in reference to FIG. 15) that are configured to prevent light from bleeding into adjacent microlenses. In some embodiments, each microlens of sensor side microlens array 720A and display side microlens array 720B additionally or alternatively includes a light incidence angle rejection coating such as filter layer 1640 described below to prevent light from bleeding into adjacent microlenses.

In some embodiments, the microlenses of sensor side microlens array 720A are oriented towards a first direction, and the microlenses of display side microlens array 720B are oriented towards a second direction that is 180 degrees from the first direction. In other words, some embodiments of emulated transparency assembly 710 include a sensor side microlens array 720A that is oriented exactly opposite from display side microlens array 720B. In other embodiments, any other orientation of sensor side microlens array 720A and display side microlens array 720B is possible.

In general, image sensor layer 730 includes a plurality of sensor pixels that are configured to detect incoming light field 701 after it passes through sensor side microlens array 720A. In some embodiments, image sensor layer 730 includes an array of sensor units 735 (e.g., sensor units 735A-C as illustrated in FIG. 8). Each sensor unit 735 may be a defined portion of image sensor layer 730 (e.g., a specific area such as a portion of a rectangular grid) or a specific number or pattern of sensor pixels within image sensor layer 730. In some embodiments, each sensor unit 735 corresponds to a specific logic unit 755 of logic unit layer 750 as described below. In some embodiments, image sensor layer 730 is coupled to or otherwise immediately adjacent to sensor side microlens array 720A. In some embodiments, image sensor layer 730 is between sensor side microlens array 720A and circuit board 740. In other embodiments, image sensor layer 730 is between sensor side microlens array 720A and logic unit layer 750. In some embodiments, other appropriate layers may be included in emulated transparency assembly 710 on either side of image sensor layer 730. Furthermore, while a specific number and pattern of sensor units 735 are illustrated, any appropriate number (including only one) and pattern of sensor units 735 may be used.

Circuit board 740 is any appropriate rigid or flexible circuit board. In general, circuit board 740 includes various pads and traces that provide electrical connections between various layers of emulated transparency assembly 710. As one example, in embodiments that include circuit board 740, circuit board 740 may be located between image sensor layer 730 and logic unit layer 750 as illustrated in FIGS. 7-8 in order to provide electrical connections between image sensor layer 730 and logic unit layer 750. In other embodiments, circuit board 740 may be located between logic unit layer 750 and electronic display layer 760 in order to provide electrical connections between logic unit layer 750 and electronic display layer 760. In some embodiments, circuit board 740 includes an array of unit attachment locations 745 (e.g., unit attachment locations 745A-C as illustrated in FIG. 8). Each unit attachment location 745 may be a defined portion of circuit board 740 (e.g., a specific area such as a portion of a rectangular grid) and may include a plurality of pads (e.g., ball grid array (BGA) pad) and/or vias. In some embodiments, each unit attachment location 745 corresponds to a specific sensor unit 735 of image sensor layer 730 and a specific display unit 765 of electronic display layer 760 (e.g., unit attachment location 745A corresponds to sensor unit 735A and display unit 765A) and is configured to permit electrical communication between the corresponding specific sensor unit 735 and the specific display unit 765.

Logic unit layer 750 provides optional/additional logic and/or processing for emulated transparency assembly 710. In general, logic unit layer 750 emulates transparency by directing signals from the plurality of sensor pixels of image sensor layer 730 to the plurality of display pixels of electronic display layer 760, thereby emitting electronically-replicated outgoing light field 702 from display side microlens array 720B at angles that correspond to angles of the incoming light field 701 detected through sensor side microlens array 720A. By emitting electronically-replicated outgoing light field 702 from display side microlens array 720B at angles that correspond to angles of the incoming light field 701 detected through sensor side microlens array 720A, an image is displayed that matches what would be seen if emulated transparency assembly 710 was not present (i.e., emulated transparency). In some embodiments, logic unit layer 750 includes an array of logic units 755 (e.g., logic units 755A-C as illustrated in FIG. 8). Each logic units 755 may be a defined portion of logic unit layer 750 (e.g., a specific area such as a portion of a rectangular grid). In some embodiments, each logic unit 755 is a separate physical, rigid unit that is later joined to or coupled to other logic units 755 in order to form logic unit layer 750. In some embodiments, each logic unit 755 corresponds to a specific sensor unit 735 of image sensor layer 730 and a specific display unit 765 of electronic display layer 760 (e.g., logic unit 755A corresponds to (and is electrically coupled to) sensor unit 735A and display unit 765A). In some embodiments, logic unit layer 750 is located between circuit board 740 and electronic display layer 760. In other embodiments, logic unit layer 750 is between image sensor layer 730 and circuit board 740. In some embodiments, other appropriate layers may be included in emulated transparency assembly 710 on either side of logic unit layer 750. Furthermore, while a specific number and pattern of logic units 755 is illustrated, any appropriate number (including none or only one) and pattern of logic units 755 may be used.

In general, electronic display layer 760 includes a plurality of display pixels that are configured to generate and project electronically-replicated outgoing light field 702 through display side microlens array 720B. In some embodiments, electronic display layer 760 includes an array of display units 765 (e.g., display units 765A-C as illustrated in FIG. 8). Each display unit 765 may be a defined portion of electronic display layer 760 (e.g., a specific area such as a portion of a rectangular grid) or a specific number or pattern of display pixels within electronic display layer 760. In some embodiments, each display unit 765 corresponds to a specific logic unit 755 of logic unit layer 750. In some embodiments, electronic display layer 760 is coupled to or otherwise immediately adjacent to display side microlens array 720B. In some embodiments, electronic display layer 760 is between display side microlens array 720B and circuit board 740. In other embodiments, electronic display layer 760 is between display side microlens array 720B and logic unit layer 750. In some embodiments, other appropriate layers may be included in emulated transparency assembly 710 on either side of electronic display layer 760. Furthermore, while a specific number and pattern of display units 765 are illustrated, any appropriate number (including only one) and pattern of display units 765 may be used.

Figure 19A:
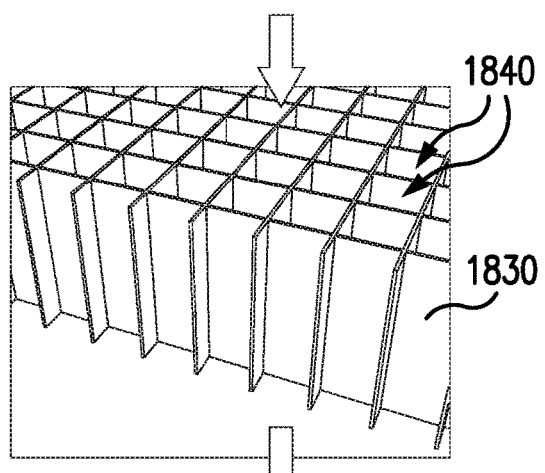
FIGS. 19A-19B illustrate another method of manufacturing the plenoptic cell assembly of FIG. 15, according to certain embodiments.
Figure 19B:
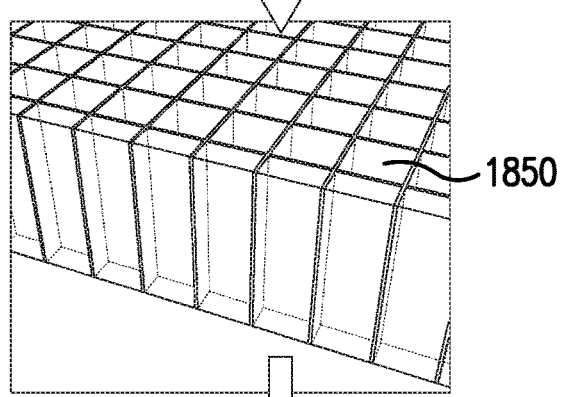
Figure 20:
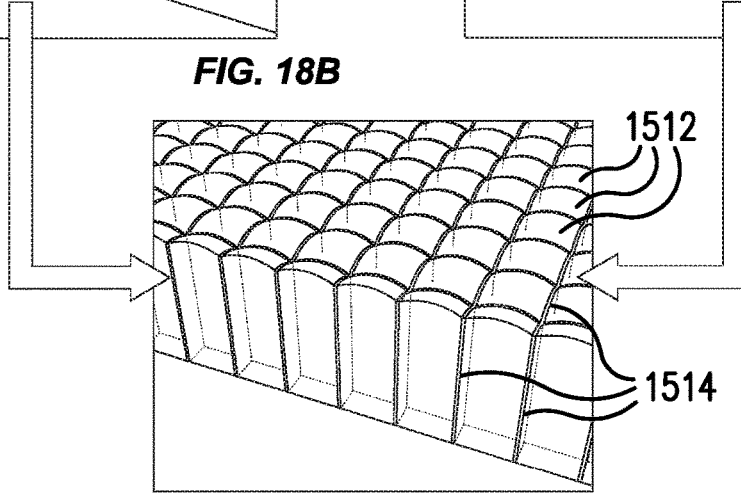
FIGS. 20-21 illustrate a plenoptic cell assembly that may be manufactured by the methods of FIGS. 18A-19B, according to certain embodiments.

In some embodiments, the sensor pixels of image sensor layer 730 may be sensor pixels 1800 as described in FIGS. 18-20 and their associated descriptions in U.S. patent application Ser. No. 15/724,027 entitled "Stacked Transparent Pixel Structures for Image Sensors," which is incorporated herein by reference in its entirety. In some embodiments, the display pixels of electronic display layer 760 are display pixels 100 as described in FIGS. 1-4 and their associated descriptions in U.S. patent application Ser. No. 15/724,004 entitled "Stacked Transparent Pixel Structures for Electronic Displays," which is incorporated herein by reference in its entirety.

While FIGS. 7-8 depict emulated transparency assembly 710 as having arrays of sensors, displays, and electronics, other embodiments may have single-unit setups. Furthermore, while the illustrated embodiments of emulated transparency assembly 710 depict unidirectional emulated transparency (i.e. allowing the capture of incoming light field 701 from a single direction and displaying a corresponding electronically-replicated outgoing light field 702 in the opposite direction), other embodiments may include arrangements and combinations of emulated transparency assembly 710 that permit bidirectional transparency.

Figure 9:
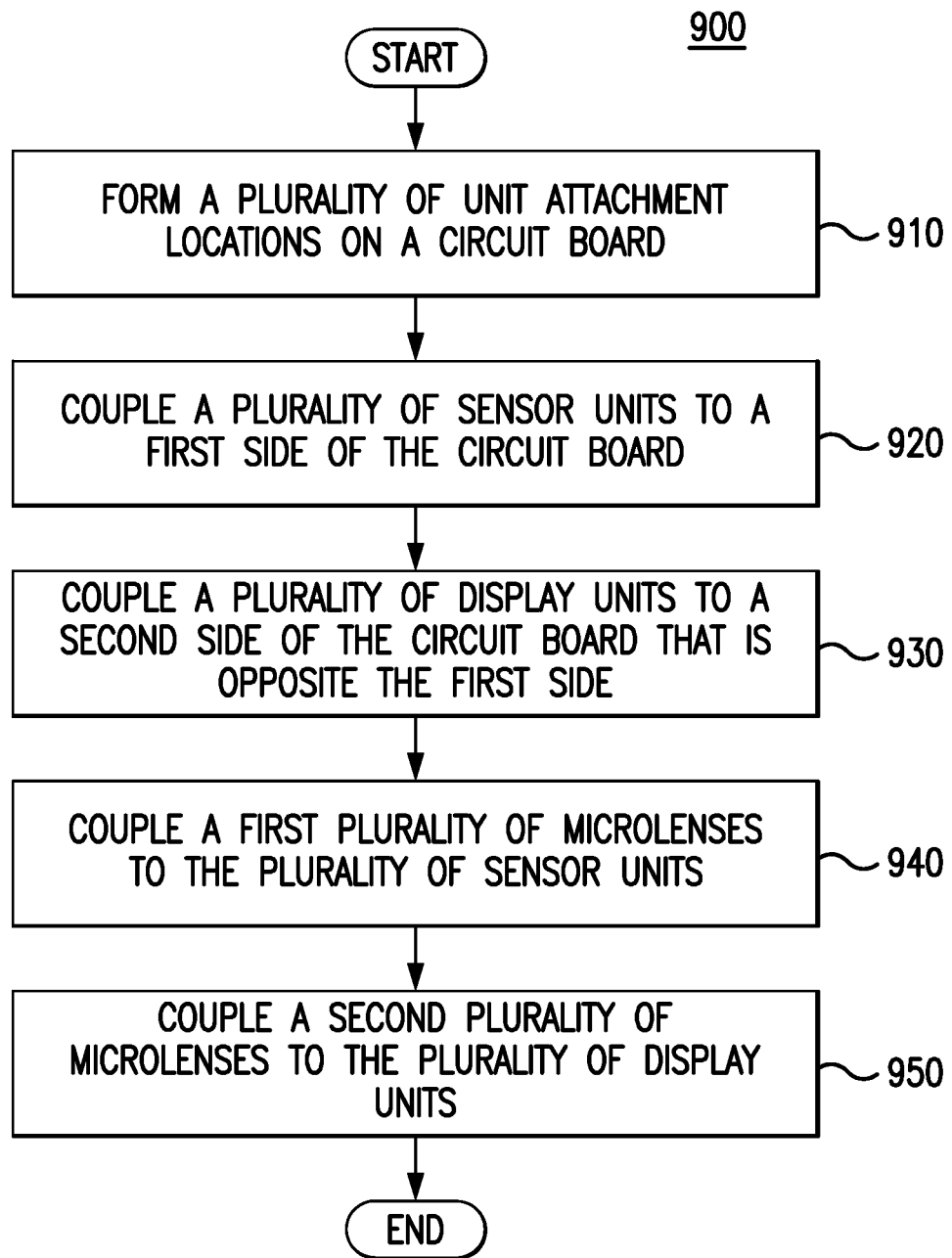
FIG. 9 illustrates a method of manufacturing the emulated transparency assembly of FIG. 7, according to certain embodiments.

FIG. 9 illustrates a method 900 of manufacturing the emulated transparency assembly 710 of FIG. 7, according to certain embodiments. Method 900 may begin in step 910 where a plurality of unit attachment locations are formed on a circuit board. In some embodiments, the circuit board is circuit board 740 and the unit attachment locations are unit attachment locations 145. In some embodiments, each unit attachment location corresponds to one of a plurality of display units such as display units 765 and one of a plurality of sensor units such as sensor units 735.

At step 920, a plurality of sensor units are coupled to a first side of the circuit board. In some embodiments, the sensor units are sensor units 735. In some embodiments, each sensor unit is coupled in step 920 to a respective one of the unit attachment locations of step 910. In some embodiments, the sensor units are first formed into an image sensor layer such as image sensor layer 730, and the image sensor layer is coupled to the first side of the circuit board in this step.

At step 930, a plurality of display units are coupled to a second side of the circuit board that is opposite the first side. In some embodiments, the display units are display units 765. In some embodiments, each display unit is coupled to a respective one of the unit attachment locations. In some embodiments, the display units are first formed into a display layer such as electronic display layer 760, and the display layer is coupled to the second side of the circuit board in this step.

At step 940, a first plurality of microlenses are coupled to the plurality of sensor units of step 920. In some embodiments, the microlenses are plenoptic cells 1510. In some embodiments, the microlenses are first formed into an microlens array layer such as sensor side microlens array 720A, and the microlens array layer is coupled to the sensor units.

At step 950, a second plurality of microlenses are coupled to the plurality of display units of step 930. In some embodiments, the microlenses are plenoptic cells 1510. In some embodiments, the microlenses are first formed into an microlens array layer such as display side microlens array 720B, and the microlens array layer is coupled to the display units. After step 950, method 900 may end.

In some embodiments, method 900 may additionally include coupling a plurality of logic units between the circuit board of step 910 and the plurality of display units of step 930. In some embodiments, the logic units are logic units 755. In some embodiments, the plurality of logic units are coupled between the circuit board and the plurality of sensor units of step 920.

Particular embodiments may repeat one or more steps of method 900, where appropriate. Although this disclosure describes and illustrates particular steps of method 900 as occurring in a particular order, this disclosure contemplates any suitable steps of method 900 occurring in any suitable order (e.g., any temporal order). Moreover, although this disclosure describes and illustrates an example emulated transparency assembly manufacturing method including the particular steps of method 900, this disclosure contemplates any suitable emulated transparency assembly manufacturing method including any suitable steps, which may include all, some, or none of the steps of method 900, where appropriate. Furthermore, although this disclosure describes and illustrates particular components, devices, or systems carrying out particular steps of method 900, this disclosure contemplates any suitable combination of any suitable components, devices, or systems carrying out any suitable steps of method 900.

FIG. 10 illustrates a direct sensor-to-display system 1000 that may be implemented by the emulated transparency assembly of FIG. 7, according to certain embodiments. In general, FIG. 10 illustrates how embodiments of emulated transparency assembly 710 utilize a direct association of input pixels to corollary output pixels. In some embodiments, this is accomplished by using a layered approach such that the image sensor layer 730 and electronic display layer 760 are in close proximity to one another, mounted on opposite sides of a shared substrate (e.g., circuit board 740) as illustrated in FIGS. 7-8. Signals from image sensor layer 730 may be propagated directly to electronic display layer 760 through circuit board 740 (and logic unit layer 750 in some embodiments). Logic unit layer 750 provides simple processing with optional input for any necessary control or augmentation. Typical electronic sensor/display pairs (e.g., a digital camera) do not express a one-to-one relationship in that the display is not coupled directly with the input sensor and thus requires some degree of image transformation. Certain embodiments of the disclosure, however, implement a one-to-one mapping between input and output pixels (i.e., the sensor pixel and display pixel layouts are identical), thereby circumventing the need for any image transformation. This reduces the complexity and power requirements of emulated transparency assembly 710.

As illustrated in FIG. 10, each sensor unit 735 is directly coupled to a corresponding display unit 765. For example, sensor unit 735A may be directly coupled to display unit 765A, sensor unit 735B may be directly coupled to display unit 765B, and so on. In some embodiments, the signaling between sensor units 735 and display units 765 may be any appropriate differential signaling such as low-voltage differential signaling (LVDS). More specifically, each sensor unit 735 may output first signals in a specific format (e.g., LVDS) that corresponds to incoming light field 701. In some embodiments, the first signals are sent via a corresponding logic unit 755, which in turn sends second signals to display unit 765 in the same format as the first signals (e.g., LVDS). In other embodiments, the first signals are sent directly to display units 765 from sensor units 735 (e.g., sensor units 735 and display units 765 are coupled directly to opposite sides of circuit board 740). Display unit 765 receives the second signals from the logic unit 755 (or the first signals directly from the sensor unit 735 via circuit board 740) and uses them to generate outgoing light field 702.

Because no conversion is needed in the signaling between sensor units 735 and display units 765, emulated transparency assembly 710 may provide many benefits from typical display/sensor combinations. First, no signal processors are needed to convert the signals from sensor units 735 to display units 765. For example, no off-board signal processors are needed to perform image transformation between sensor units 735 and display units 765. This reduces the space, complexity, weight, and cost requirements for emulated transparency assembly 710. Second, emulated transparency assembly 710 may provide greater resolutions than would typically be possible for display/sensor combinations. By directly coupling sensor units 735 with display units 765 and not requiring any processing or transformation of data between the units, the resolution of sensor units 735 and display units 765 may be far greater than would typically be possible. Furthermore, emulated transparency assembly 710 may provide heterogeneous resolutions across sensor units 735 and display units 765 at any particular time. That is, a particular sensor unit 735 and corresponding display unit 765 may have a particular resolution that is different from other sensor units 735 and display units 765 at a particular time, and the resolutions of each sensor unit 735 and display unit 765 may be changed at any time.

In some embodiments, each particular sensor pixel of a sensor unit 735 is mapped to a single display pixel of a corresponding display unit 765, and the display pixel displays light corresponding to light captured by its mapped sensor pixel. This is illustrated best in FIGS. 17A-17B. As one example, each center sensing pixel 1725 of a particular plenoptic cell 1510 of sensor side microlens array 720A (e.g., the bottom plenoptic cell 1510 of sensor side microlens array 720A in FIG. 17A) is mapped to a center display pixel 1735 of a corresponding plenoptic cell 1510 of display side microlens array 720B (e.g., the bottom plenoptic cell 1510 of display side microlens array 720B in FIG. 17A). As another example, each top sensing pixel 1725 of a particular plenoptic cell 1510 of sensor side microlens array 720A (e.g., the top plenoptic cell 1510 of sensor side microlens array 720A in FIG. 17B) is mapped to a bottom display pixel 1735 of a corresponding plenoptic cell 1510 of display side microlens array 720B (e.g., the top plenoptic cell 1510 of display side microlens array 720B in FIG. 17B).

In some embodiments, sensor units 735 are coupled directly to circuit board 740 while display units 765 are coupled to logic units 755 (which are in turn coupled to circuit board 740) as illustrated in FIG. 8. In other embodiments, display units 765 are coupled directly to circuit board 740 while sensor units 735 are coupled to logic units 755 (which are in turn coupled to circuit board 740). In other embodiments, both sensor units 735 and display units 765 are coupled directly to circuit board 740 (i.e., without any intervening logic units 755). In such embodiments, sensor units 735 and display units 765 are coupled to opposite sides of circuit board 740 at unit attachment locations 745 (e.g., sensor unit 735A and display unit 765A are coupled to opposite sides of circuit board 740 at unit attachment location 745A).

FIG. 11 illustrates a method 1100 of manufacturing the direct sensor-to-display system 1000 of FIG. 10, according to certain embodiments. Method 1100 may begin at step 1110 where a plurality of unit attachment locations are formed on a circuit board. In some embodiments, the circuit board is circuit board 740 and the unit attachment locations are unit attachment locations 745. In some embodiments, each unit attachment location corresponds to one of a plurality of display units and one of a plurality of sensor units. The display units may be display units 765 and the sensor units may be sensor units 735. In some embodiments, each particular unit attachment location includes BGA pads that are configured to couple to one of the plurality of sensor units and/or one of the plurality of logic units. In some embodiments, each particular unit attachment location includes a plurality of interconnection pads configured to electrically couple the particular unit attachment location to one or more adjacent unit attachment locations. In some embodiments, the unit attachment locations are arranged into a plurality of columns and plurality of rows as illustrated in FIG. 8.

At step 1120, a plurality of sensor units are coupled to a first side of the circuit board. In some embodiments, each sensor unit is coupled to a respective one of the unit attachment locations of step 1110. At step 1130, a plurality of display units are coupled to a second side of the circuit board that is opposite to the first side. In some embodiments, each display unit is coupled to a respective one of the unit attachment locations of step 1110 such that each particular one of the plurality of sensor pixel units is mapped to a corresponding one of the plurality of display pixel units. By mapping each particular sensor pixel unit to one of the display pixel units, the display pixels of each particular one of the plurality of display pixel units are configured to display light corresponding to light captured by sensor pixels of its mapped sensor pixel unit. After step 1130, method 1100 may end.

Particular embodiments may repeat one or more steps of method 1100, where appropriate. Although this disclosure describes and illustrates particular steps of method 1100 as occurring in a particular order, this disclosure contemplates any suitable steps of method 1100 occurring in any suitable order (e.g., any temporal order). Moreover, although this disclosure describes and illustrates an example direct sensor-to-display system manufacturing method including the particular steps of method 1100, this disclosure contemplates any suitable direct sensor-to-display system manufacturing method including any suitable steps, which may include all, some, or none of the steps of method 1100, where appropriate. Furthermore, although this disclosure describes and illustrates particular components, devices, or systems carrying out particular steps of method 1100, this disclosure contemplates any suitable combination of any suitable components, devices, or systems carrying out any suitable steps of method 1100.

FIGS. 12-13 illustrate various in-layer signal processing configurations that may be used by emulated transparency assembly 710 of FIG. 7, according to certain embodiments. In general, the configurations of FIGS. 12-13 utilize a layer of digital logic (e.g., logic unit layer 750) that is sandwiched between the camera and display (i.e., between image sensor layer 730 and electronic display layer 760). These configurations allow for local, distributed processing of large quantities of data (e.g., 160 k of image data or more), thereby circumventing bottlenecks as well as performance, power, and transmission line issues associated with typical configurations. Human visual acuity represents a tremendous amount of data which must be processed in real-time. Typical imaging systems propagate a single data stream to/from a high-powered processor (e.g., a CPU or GPU), which may or may not serialize the data for manipulation. The bandwidth required for this approach at human 20/20 visual acuity far exceeds that of any known transmission protocols. Typical systems also use a master controller which is responsible for either processing all incoming/outgoing data or managing distribution to smaller processing nodes. Regardless, all data must be transported off-system/off-chip, manipulated, and then returned to the display device(s). However, this typical approach is unable to handle the enormous amount of data required by human visual acuity. Embodiments of the disclosure, however, harness the faceted nature of a sensor/display combination as described herein to decentralize and localize signal processing. This enables previously unachievable real-time digital image processing.

As illustrated in FIGS. 12-13, certain embodiments of emulated transparency assembly 710 include logic unit layer 750 that contains the necessary logic to manipulate input signals from image sensor layer 730 and provide output signals to electronic display layer 760. In some embodiments, logic unit layer 750 is located between image sensor layer 730 and circuit board 740 as illustrated in FIG. 12. In other embodiments, logic unit layer 750 is located between circuit board 740 and electronic display layer 760 as illustrated in FIG. 13. In general, logic unit layer 750 is a specialized image processing layer that is capable of mixing an input signal directly from image sensor layer 730 and performing one or more mathematical operations (e.g., matrix transforms) on the input signal before outputting a resulting signal directly to electronic display layer 760. Since each logic unit 755 of logic unit layer 750 is responsible only for it's associated facet (i.e., sensor unit 735 or display unit 765), the data of the particular logic unit 755 can be manipulated with no appreciable impact to the system-level I/O. This effectively circumvents the need to parallelize any incoming sensor data for centralized processing. The distributed approach enables emulated transparency assembly 710 to provide multiple features such as magnification/zoom (each facet applies a scaling transform to its input), vision correction (each facet applies a simulated optical transformation compensating for common vision issues such as near-sightedness, far-sightedness, astigmatism, etc.), color blindness correction (each facet applies a color transformation compensating for common color blindness issues), polarization (each facet applies a transformation simulating wave polarization allowing for glare reduction), and dynamic range reduction (each facet applies a transformation that darkens high-intensity regions (e.g. Sun) and lightens low-intensity regions (e.g. shadows)). Furthermore, since any data transformations remain localized to logic unit layer 750 of each facet, there may be no need for long transmission lines. This circumvents issues of cross talk, signal integrity, etc. Additionally, since the disclosed embodiments do not require optical transparency (but instead harness emulated transparency), there is no functional impact to placing an opaque processing layer between the sensor and display facets.

In some embodiments, logic unit layer 750 contains discrete logic units (e.g., transistors) that are formed directly on circuit board 740. For example, standard photo lithography techniques may be used to form logic unit layer 750 directly on circuit board 740. In other embodiments, each logic unit 755 is a separate integrated circuit (IC) that is coupled to either a sensor facet or a display facet, or directly to circuit board 740. As used herein, "facet" refers to a discrete unit that is separately manufactured and then coupled to circuit board 740. For example, a "display facet" may refer to a unit that includes a combination of an electronic display layer 760 and a display side microlens array 720B, and a "sensor facet" may refer to a unit that includes a combination of an image sensor layer 730 and a sensor side microlens array 720A. In some embodiments, a display facet may include a single display unit 765, or it may include multiple display units 765. Similarly, a sensor facet may include a single sensor unit 735, or it may include multiple sensor units 735. In some embodiments, a logic unit 755 may be included in either a sensor facet or a display facet. In embodiments where a logic unit 755 is a separate IC that is coupled directly to either a display or sensor facet (as opposed to being formed directly on circuit board 740), any appropriate technique such as 3D IC design with through-silicon vias may be used to couple the IC of logic unit 755 to a wafer of the facet.

In some embodiments, logic unit layer 750 is an application-specific integrated circuit (ASIC) or an arithmetic logic unit (ALU), but not a general purpose processor. This allows logic unit layer 750 to be power efficient. Furthermore, this allows logic unit layer 750 to operate without cooling, further reducing cost and power requirements of emulated transparency assembly 710.

In some embodiments, logic units 755 are configured to communicate using the same protocol as sensor units 735 and display units 765. For example, in embodiments where logic units 755 are discrete ICs, the ICs may be configured to communicate in a same protocol as the sensor and display facets (e.g., LVDS or Inter-Integrated Circuit (I²C)). This eliminates the problem of having to translate between the sensor and display facet, thereby reducing power and cost.

In some embodiments, logic unit layer 750 performs one or more operations on signals received from image sensor layer 730 before transmitting output signals to electronic display layer 760. For example, logic unit layer 750 may transform received signals from image sensor layer 730 to include augmented information for display on electronic display layer 760. This may be used, for example, to provide AR to a viewer. In some embodiments, logic unit layer 750 may completely replace received signals from image sensor layer 730 with alternate information for display on electronic display layer 760. This may be used, for example, to provide VR to a viewer.

FIG. 14 illustrates a method 1400 of manufacturing the in-layer signal processing systems of FIGS. 12-13, according to certain embodiments. Method 1400 may begin in step 1410 where a plurality of sensor units are coupled to a first side of a circuit board. In some embodiments, the sensor units are sensor units 735, and the circuit board is circuit board 740. In some embodiments, each sensor unit is coupled to one of a plurality of unit attachment locations such as unit attachment locations 745. Each sensor unit includes a plurality of sensor pixels.

At step 1420, a plurality of display units are formed. In some embodiments, the display units are a combination of display units 765 and logic units 755. Each display unit may be formed by combining an electronic display and a logic unit into a single 3D integrated circuit using through-silicon vias. Each display unit includes a plurality of display pixels.

At step 1430, the plurality of display units of step 1420 are coupled to a second side of the circuit board that is opposite the first side. In some embodiments, each logic unit is coupled to a respective one of the unit attachment locations. After step 1430, method 1400 may end.

Particular embodiments may repeat one or more steps of method 1400, where appropriate. Although this disclosure describes and illustrates particular steps of method 1400 as occurring in a particular order, this disclosure contemplates any suitable steps of method 1400 occurring in any suitable order (e.g., any temporal order). Moreover, although this disclosure describes and illustrates an example in-layer signal processing system manufacturing method including the particular steps of method 1400, this disclosure contemplates any suitable in-layer signal processing system manufacturing method including any suitable steps, which may include all, some, or none of the steps of method 1400, where appropriate. Furthermore, although this disclosure describes and illustrates particular components, devices, or systems carrying out particular steps of method 1400, this disclosure contemplates any suitable combination of any suitable components, devices, or systems carrying out any suitable steps of method 1400.

Figure 15:
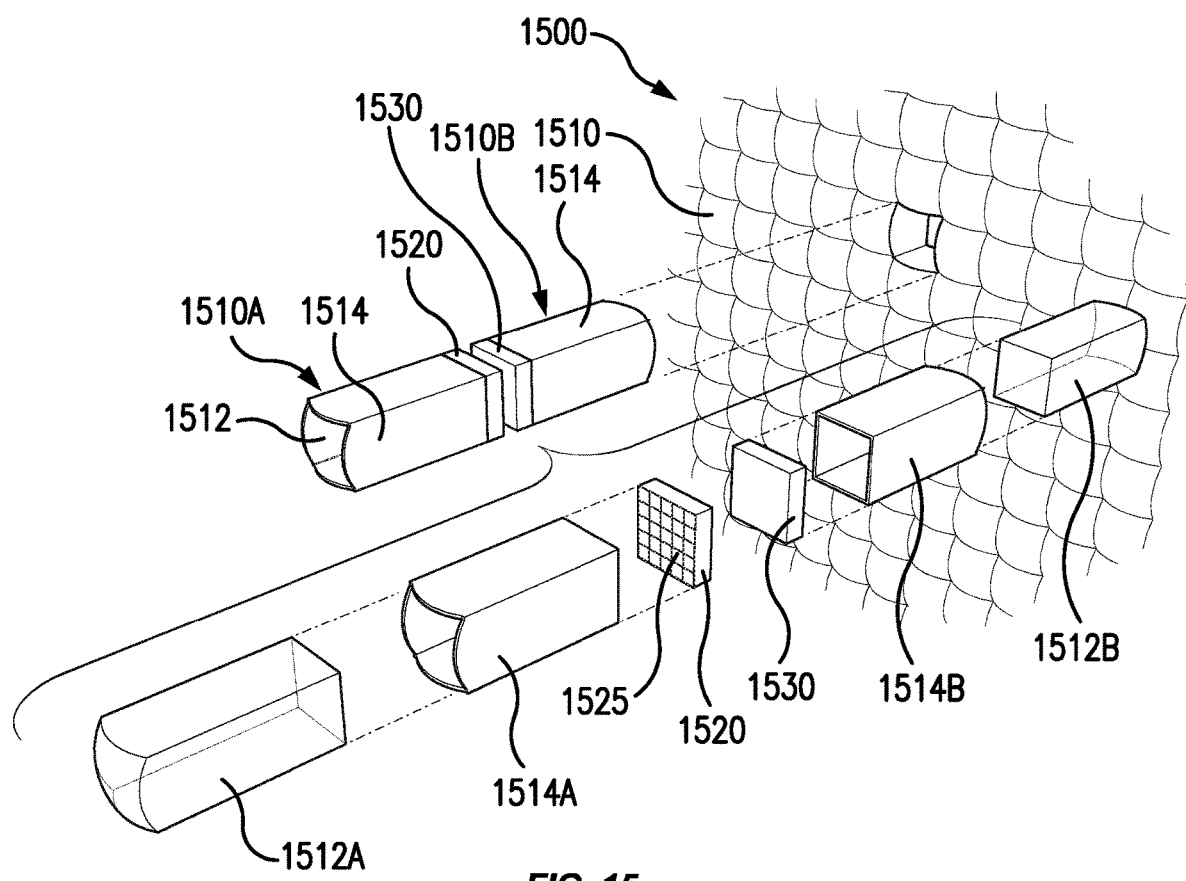
FIG. 15 illustrates a plenoptic cell assembly that may be used by the emulated transparency assembly of FIG. 7, according to certain embodiments.
Figure 16:
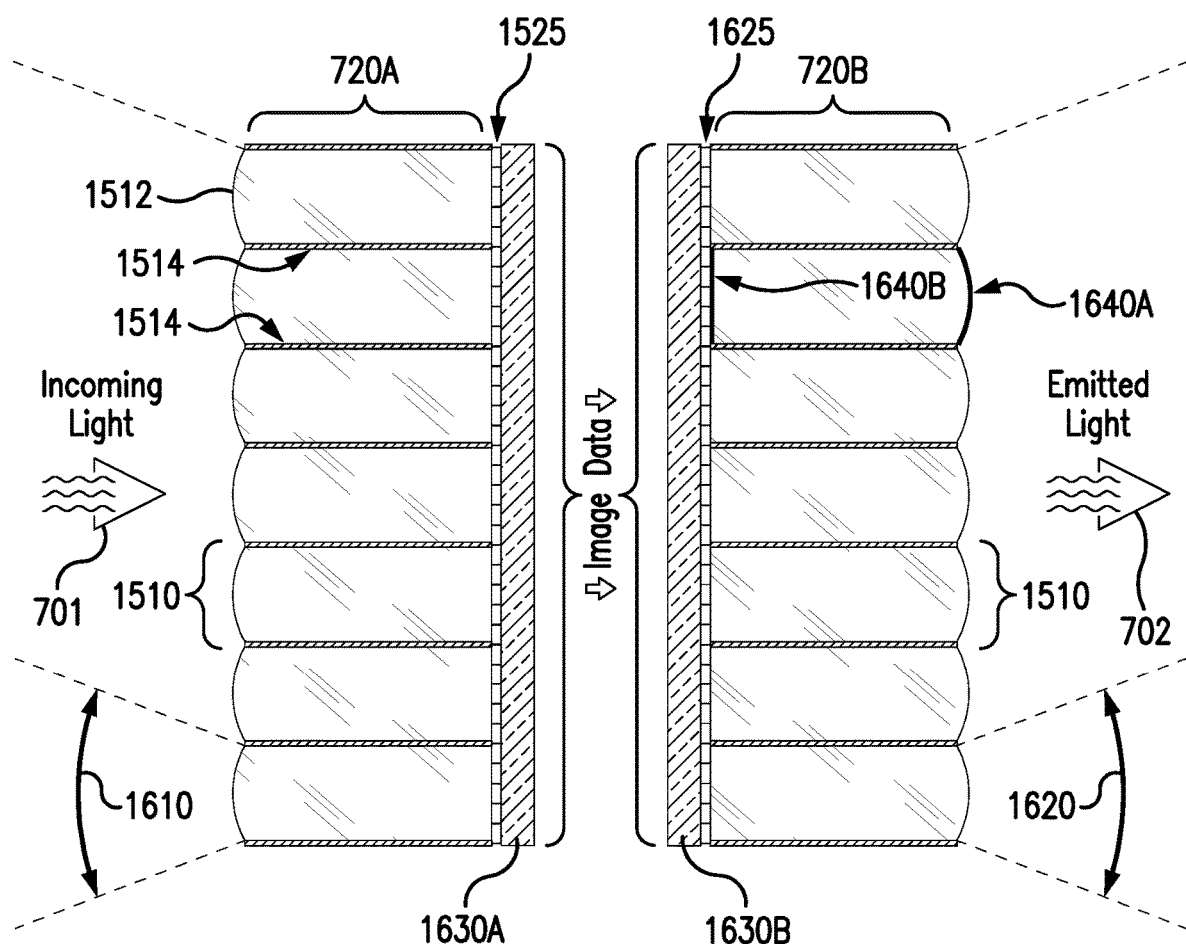
FIG. 16 illustrates a cross section of a portion of the plenoptic cell assembly of FIG. 15, according to certain embodiments.

FIGS. 15-17C illustrate various views of an array 1500 of plenoptic cells 1510 that may be used within microlens arrays 720A-B of emulated transparency assembly 710. FIG. 15 illustrates a plenoptic cell assembly 1500, FIG. 16 illustrates a cross section of a portion of the plenoptic cell assembly 1500 of FIG. 15, and FIGS. 17A-17C illustrate cross sections of a portion of the plenoptic cell assembly 1500 of FIG. 15 with various incoming and outgoing fields of light.

Standard electronic displays typically include planar arrangements of pixels which form a two-dimensional rasterized image, conveying inherently two-dimensional data. One limitation is that the planar image cannot be rotated in order to perceive a different perspective within the scene being conveyed. In order to clearly view this image, regardless of what is portrayed within the image itself, either a viewer's eyes or the lens of a camera must focus on the screen. By contrast, a volume of light entering the eyes from the real world allows the eyes to naturally focus on any point within that volume of light. This plenoptic "field" of light contains rays of light from the scene as they naturally enter the eye, as opposed to a virtual image focused by an external lens at a single focal plane. While existing light field displays may be able to replicate this phenomenon, they present substantial tradeoffs between spatial and angular resolutions, resulting in the perceived volume of light looking fuzzy or scant in detail.

To overcome problems and limitation with existing light field displays, embodiments of the disclosure provide a coupled light field capture and display system that is capable of recording and then electronically recreating the incoming plenoptic volume of light. Both the capture and the display process are accomplished by an arrangement of plenoptic cells 1510 responsible for recording or displaying smaller views of a larger compound image. Each plenoptic cell 1510 of the sensor is itself comprised of a dense cluster of image sensor pixels, and each plenoptic cell of the display is itself comprised of a dense cluster of display pixels. In both cases, light rays entering the sensor cells or exiting the display cells are focused by one or more transparent lenslets 1512 to produce a precisely tuned distribution of near-collimated rays. This essentially records an incoming light field and reproduces it on the opposite side of the assembly. More specifically, for the sensor, the volume of light entering the lens (or series of lenses) of this cell is focused onto the image pixels such that each pixel gathers light from only one direction, as determined by its position within the cell and the profile of the lens. This allows rasterized encoding of the various angular rays within the light field, with the number of pixels in the cell determining the angular resolution recorded. For the display, the light emitted from the pixels is focused by an identical lens (or series of lenses) to create a volume of light that matches what was recorded by the sensor, plus any electronic augmentation or alterations (e.g., from logic unit layer 750 described above). The cone of emitted light from this cell contains a subset of rays at enough interval angles to enable the formation of a light field for the viewer, where each output ray direction is determined by the position of its originating pixel within the cell and the profile of the lens.

Plenoptic cells 1510 may be utilized by both sensor side microlens array 720A and display side microlens array 720B. For example, multiple plenoptic cells 1510A may be included in sensor side microlens array 720A, and each plenoptic cell 1510A may be coupled to or otherwise adjacent to an image sensor 1520. Image sensor 1520 may be a portion of image sensor layer 730 and may include a sensor pixel array 1525 that includes sensing pixels 1725. Similarly, multiple plenoptic cells 1510B may be included in display side microlens array 720B, and each plenoptic cell 1510B may be coupled to or otherwise adjacent to a display 1530. Display 1530 may be a portion of electronic display layer 760 and may include a display pixel array 1625 that includes display pixels 1735. Sensing pixels 1725 may be sensor pixels 1800 as described in FIGS. 18-20 and their associated descriptions in U.S. patent application Ser. No. 15/724,027 entitled "Stacked Transparent Pixel Structures for Image Sensors," which is incorporated herein by reference in its entirety. Display pixels 1735 may be display pixels 100 as described in FIGS. 1-4 and their associated descriptions in U.S. patent application Ser. No. 15/724,004 entitled "Stacked Transparent Pixel Structures for Electronic Displays," which is incorporated herein by reference in its entirety.

In some embodiments, plenoptic cell 1510 includes a transparent lenslet 1512 and cell walls 1514. Specifically, plenoptic cell 1510A includes transparent lenslet 1512A and cell walls 1514A, and plenoptic cell 1510B includes transparent lenslet 1512B and cell walls 1514B. In some embodiments, transparent lenslet 1512 contains a 3D shape with a collimating lens on one end of the 3D shape. For example, as illustrated in FIG. 15, transparent lenslet 1512 may be a rectangular cuboid with a collimating lens on one end of the rectangular cuboid. In other embodiments, the 3D shape of transparent lenslet 1512 may be a triangular polyhedron, a pentagonal polyhedron, a hexagonal polyhedron, a heptagonal polyhedron, an octagonal polyhedron, a cylinder, or any other appropriate shape. Each plenoptic cell 1510A includes an input field of view (FOV) 1610 (e.g., 30 degrees), and each plenoptic cell 1510B includes an output FOV 1620 (e.g., 30 degrees). In some embodiments, input FOV 1610 matches output FOV 1620 for corresponding plenoptic cells 1510.

Transparent lenslet 1512 may be formed from any appropriate transparent optical material. For example, transparent lenslet 1512 may be formed from a polymer, silica glass, or sapphire. In some embodiments, transparent lenslet 1512 may be formed from a polymer such as polycarbonate or acrylic. In some embodiments, transparent lenslets 1512 may be replaced with waveguides and/or photonic crystals in order to capture and/or produce a light field.

In general, cell walls 1514 are barriers to prevent optical crosstalk between adjacent plenoptic cells 1510. Cell walls 1514 may be formed from any appropriate material that is opaque to visible light when hardened. In some embodiments, cell walls 1514 are formed from a polymer. Preventing optical cross talk using cell walls 1514 is described in more detail below in reference to FIGS. 17A and 17C.

In some embodiments, image sensor 1520 includes or is coupled to backplane circuitry 1630A, and display 1530 includes or is coupled to backplane circuitry 1630B. In general, backplane circuitry 1630A-B provides electrical connections to permit image data to flow from image sensor 1520 to display 1530. In some embodiments, backplane circuitry 1630A and backplane circuitry 1630B are the opposite sides of a single backplane. In some embodiments, backplane circuitry 1630A and backplane circuitry 1630B are circuit board 740.

In some embodiments, a filter layer 1640 may be included on one or both ends of transparent lenslet 1512 in order to restrict the entry or exit of light to a specific incidence angle. For example, a first filter layer 1640A may be included on the convex end of transparent lenslet 1512, and/or a second filter layer 1640B may be included on the opposite end of transparent lenslet 1512. Similar to cell walls 1514, such a coating or film may also limit image bleed between adjacent transparent lenslets 1512 to an acceptable amount. Filter layer 1640 may be used in addition to or in place of cell walls 1514.

Figure 17A:
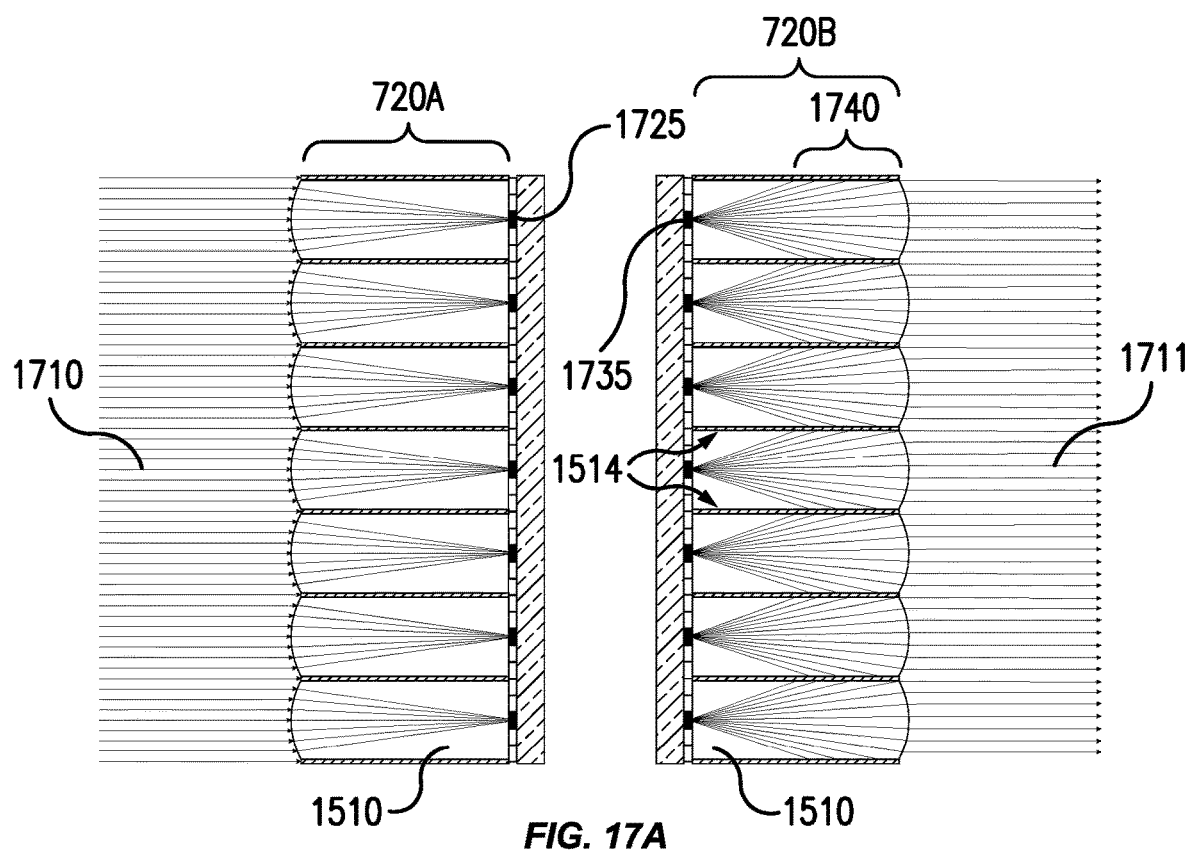
FIGS. 17A-17C illustrate cross sections of a portion of the plenoptic cell assembly of FIG. 15 with various incoming fields of light, according to certain embodiments.
Figure 17B:
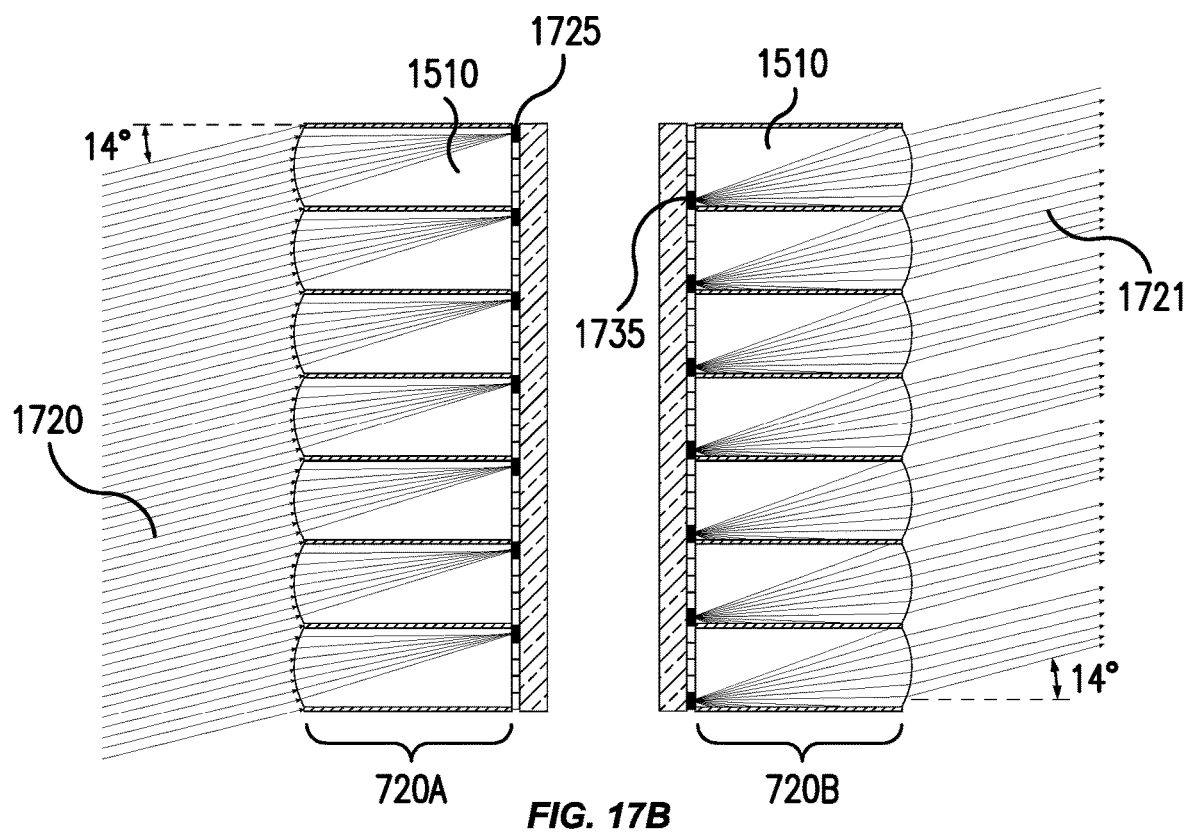
Figure 17C:
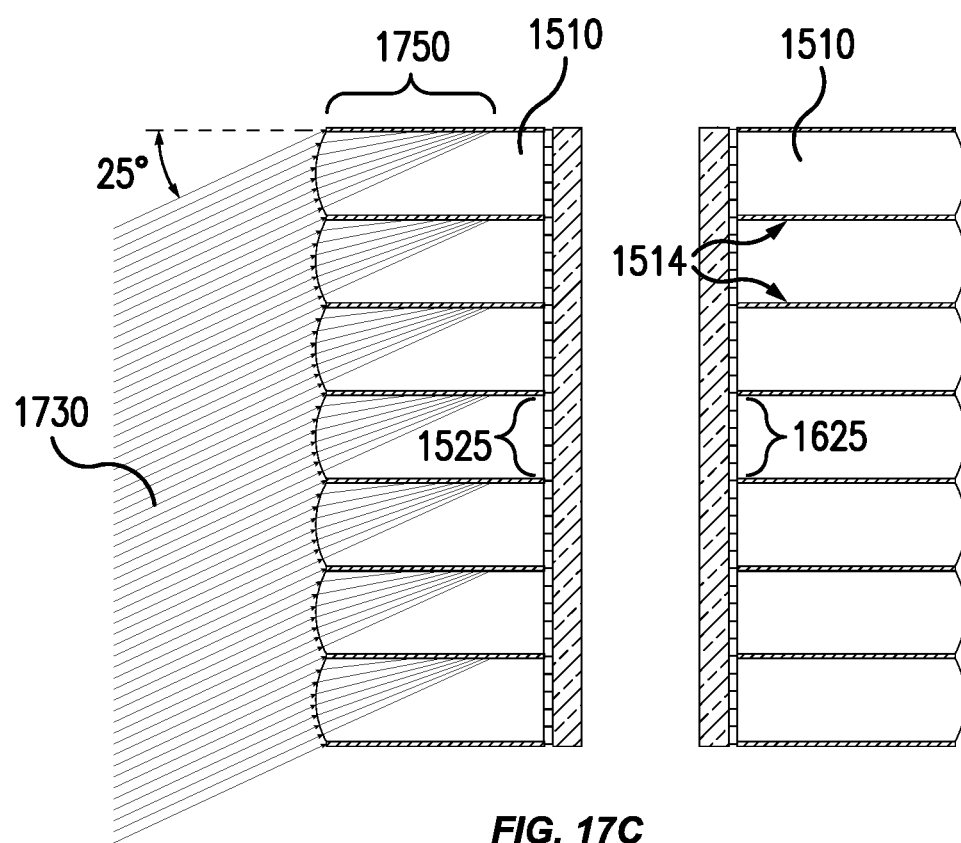

FIGS. 17A-17C each illustrate a cross-sectional view of seven adjacent plenoptic cells 1510 for a sensor side microlens array 720A and a corresponding display side microlens array 720B. These figures show how incoming light fields 701 are captured by image sensors 1520 and electronically replicated on display 1530 to emit a virtually identical field of light. In FIG. 17A, an incoming light field 1710 from objects directly in front of the sensor plenoptic cells 1510 are focused by the transparent lenslets 1512 of the sensor plenoptic cells 1510 onto center sensing pixels 1725. Corresponding light is then transmitted by corresponding center display pixels 1735 of corresponding display plenoptic cells 1510. The transmitted light is focused and emitted as emitted light field 1711 by the transparent lenslets 1512 of display plenoptic cells 1510. Emitted light field 1711 precisely matches the zero degree source light field (i.e., incoming light field 1710). In addition, emitted light rays striking cell walls 1514 at location 1740 that would otherwise penetrate adjacent display plenoptic cells 1510 are blocked by the opaque cell walls 1514, thereby preventing optical cross-talk.

In FIG. 17B, an incoming light field 1720 from objects fourteen degrees off the axis of sensor plenoptic cells 1510 are focused by the transparent lenslets 1512 of the sensor plenoptic cells 1510 onto top sensing pixels 1725. Corresponding light is then transmitted by corresponding opposite (i.e., bottom) display pixels 1735 of corresponding display plenoptic cells 1510. The transmitted light is focused and emitted as emitted light field 1721 by the transparent lenslets 1512 of display plenoptic cells 1510. Emitted light field 1721 precisely matches the 14 degree source light field (i.e., incoming light field 1720).

In FIG. 17C, an incoming light field 1730 from objects 25 degrees off the axis of sensor plenoptic cells 1510 are focused by the transparent lenslets 1512 of the sensor plenoptic cells 1510 entirely onto cell walls 1514. Because incoming light field 1730 is focused entirely onto cell walls 1514 of sensor plenoptic cells 1510 instead of sensing pixels 1725, no corresponding light is transmitted by corresponding display plenoptic cells 1510. In addition, incoming light rays striking cell walls 1514 at location 1750 that would otherwise penetrate adjacent sensor plenoptic cells 1510 are blocked by the opaque cell walls 1514, thereby preventing optical cross-talk.

Figure 18A:
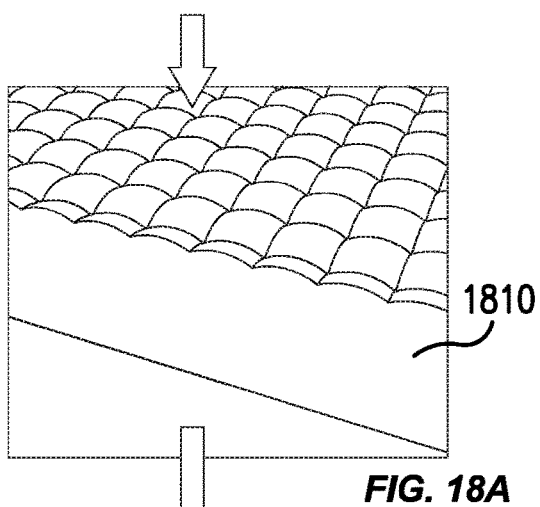
FIGS. 18A-18B illustrate a method of manufacturing the plenoptic cell assembly of FIG. 15, according to certain embodiments.
Figure 18B:
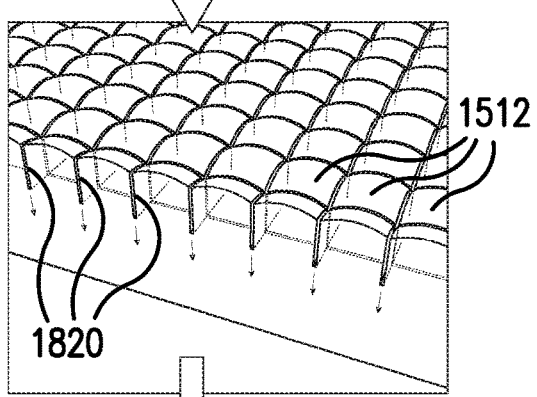
Figure 21:
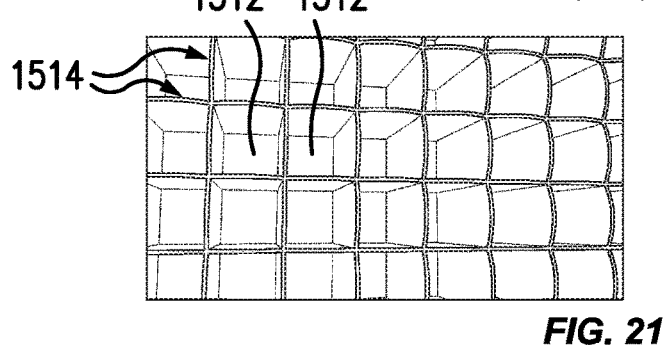

FIGS. 18A-18B illustrate a method of manufacturing the plenoptic cell assembly of FIG. 15, according to certain embodiments. In FIG. 18A, a microlens array (MLA) sheet 1810 is formed or obtained. MLA sheet 1810 includes a plurality of lenslets as illustrated. In FIG. 18B, a plurality of grooves 1820 are cut around each of the plurality of lenslets of MLA sheet 1810 to a predetermined depth. In some embodiments, grooves 1820 may be cut using multiple passes to achieve the desired depth. In some embodiments, grooves 1820 may be cut using laser ablation, etching, lithographic processes, or any other appropriate method. After grooves 1820 are cut to the desired depth, they are filled with a material configured to prevent light from bleeding through grooves 1820. In some embodiments, the material is any light absorbing (e.g., carbon nanotubes) or opaque material (e.g., a non-reflective opaque material or a tinted polymer) when hardened. The resulting plenoptic cell assembly after grooves 1820 are filled and allowed to harden is illustrated in FIGS. 20-21.

FIGS. 19A-19B illustrate another method of manufacturing the plenoptic cell assembly of FIG. 15, according to certain embodiments. In FIG. 19A, a pre-formed lattice 1830 having voids 1840 is obtained or formed. Lattice 1830 is made of any suitable material as described above for cell walls 1514. Lattice 1830 may be formed from any suitable method including, but not limited to, additive manufacturing and ablation of cell matter.

In FIG. 19B, voids 1840 are filled with an optical polymer 1850. Optical polymer 1850 may be any suitable material as described above for transparent lenslet 1512. After voids 1840 are filled with optical polymer 1850, the final lens profile is created using molding or ablation. An example of the resulting plenoptic cell assembly after the lenses are formed is illustrated in FIGS. 20-21.

Figure 22:
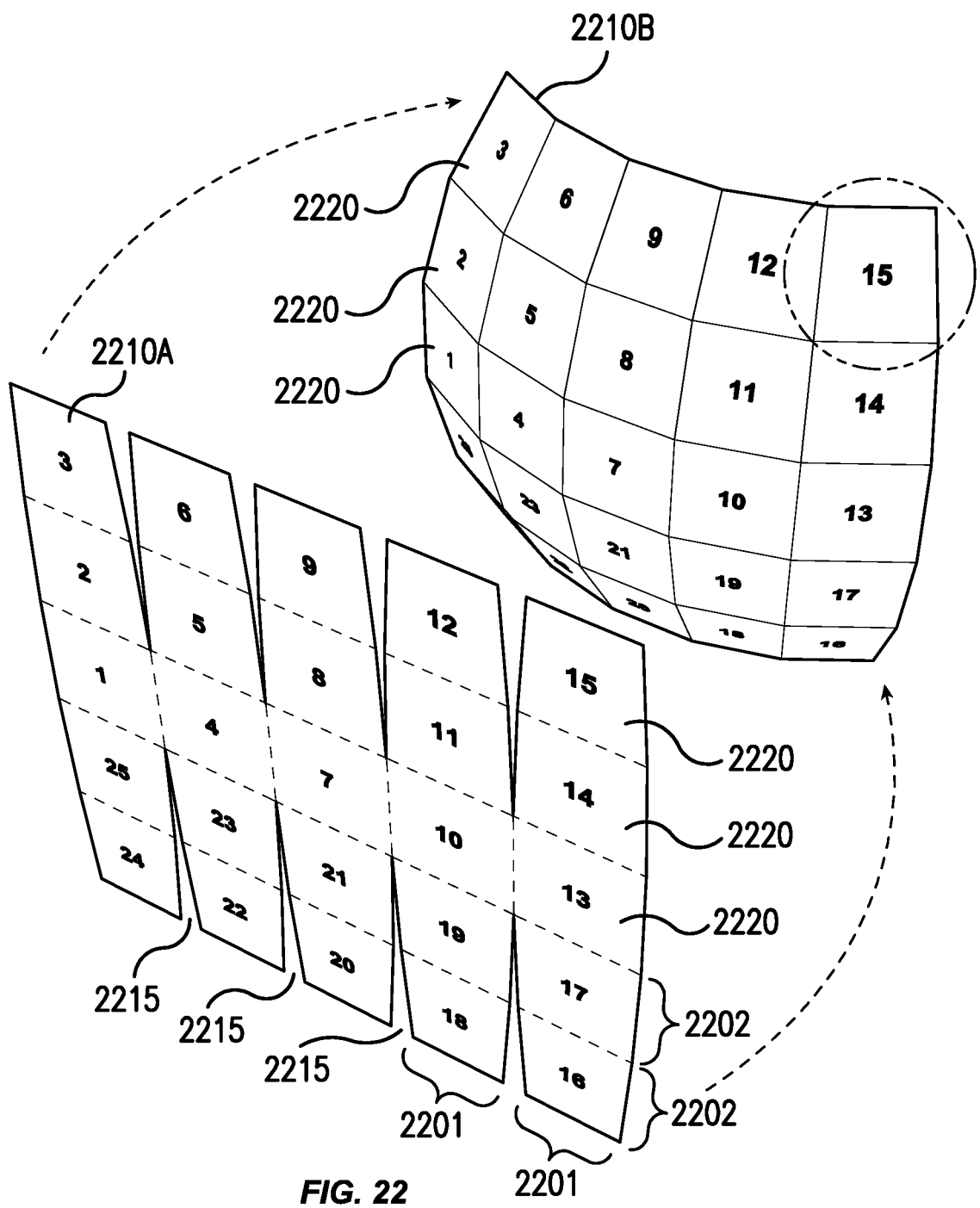
FIG. 22 illustrates a flexible circuit board that may be used by the emulated transparency assembly of FIG. 7, according to certain embodiments.
Figure 23:
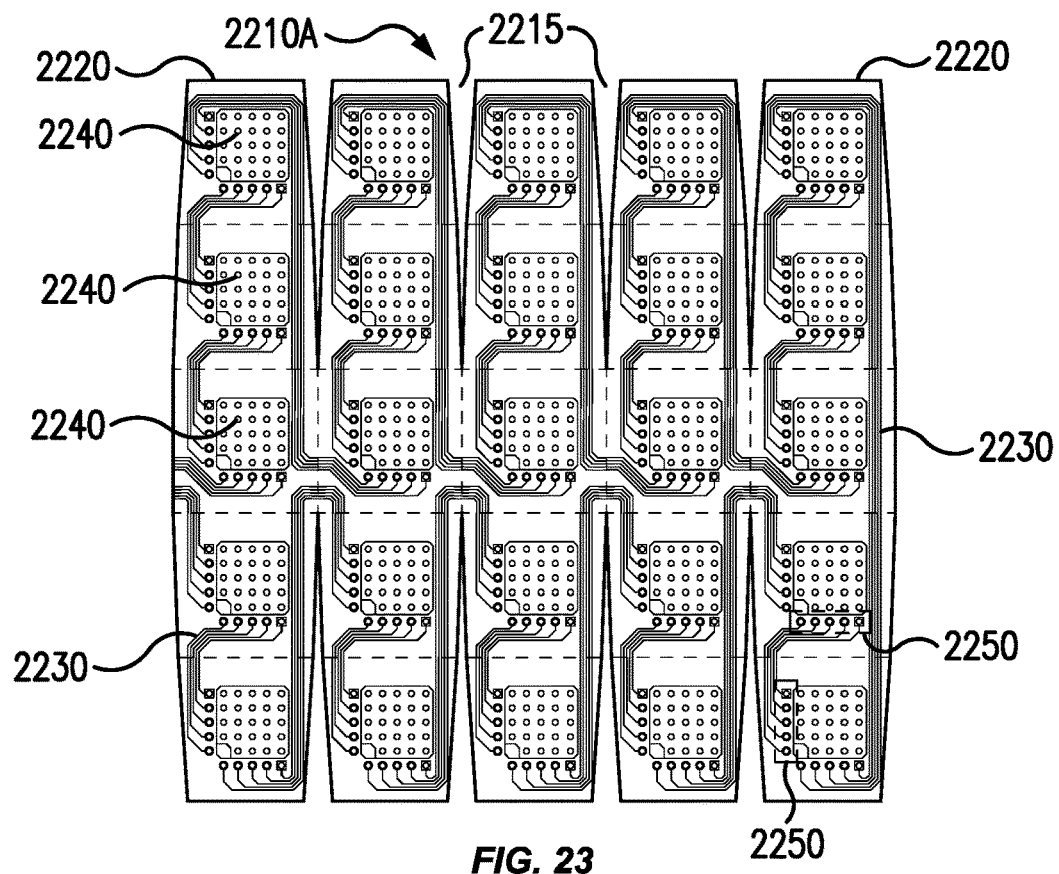
FIG. 23 illustrates additional details of the flexible circuit board of FIG. 22, according to certain embodiments.

FIG. 22-23 illustrates a flexible circuit board 2210 that may be used as circuit board 740 by the emulated transparency assembly 710 of FIG. 7, according to certain embodiments. Generally, wrapping electronics around a 3D shape such as spherical or semispherical surface is a non-trivial task. Though various examples of flexible and even stretchable circuitry are currently available, there are several hurdles to overcome when positioning such electronics on a small radius (e.g., 30-60 mm) spherical or semispherical surface. For example, bending of flexible electronics substrates in one direction does not inherently indicate adaptability to compound curvature, as the torsional forces required for such curvature can be damaging to the thin films involved. As another example, questions remain about the degree of stretchability and lifetime of stretchable electronics currently available.

To address the problems and limitations of current solutions, embodiments of the disclosure present a 3D (e.g., spherical or semispherical) electronics manufacturing method using a geodesic faceted approach consisting of an array of small, rigid surfaces built on a single flexible circuit. In some embodiments, the flexible circuit is cut to a specific net shape and then wrapped to a 3D shape (e.g., a spherical or semispherical shape) and locked into place to prevent wear and tear from repeated flexing. The method is especially useful to accommodate the narrow radii of curvature (e.g., 30-60 mm) necessary for head-mounted near-eye wrapped displays. In some embodiments, the assembly includes a single, foundational flexible printed circuitry layer, with rigid sensor and display arrays layered on opposite sides of the flexible circuit. The entire assembly including sensor and display layers may be manufactured by standard planar semiconductor processes (e.g., spin coatings, photolithography, etc.). The rigid electronics layers may be etched to form individual sensor and display units (i.e., "facets") and then connected to the flexible circuitry by connection pads and adhered through patterned conductive and non-conductive adhesives. This permits the flexible circuitry to fold slightly at the edges between the rigid facets. In some embodiments, following planar manufacturing, the fully cured and functional electronic stack is formed to the desired final 3D shape using one side of a final rigid polymer casing as a mold. In this way, the arrays of rigid electronics facets are not deformed but simply fall into place in their mold, with the flexible circuitry bending at defined creases/gaps to match the faceted interior of the casing. The assembly may be finally capped and sealed using an opposite matching side of the rigid casing.

Embodiments of the disclosure are not limited to only spherical or semispherical shapes, although such shapes are certainly contemplated. The disclosed embodiments may be formed into any compound curvature or any other revolved shape. Furthermore, the disclosed embodiments may be formed into any non-uniform curvature, as well as non-curved (i.e., flat) surfaces.

FIG. 22 illustrates flexible circuit board 2210 in two different states: a flat flexible circuit board 2210A and a 3D-shaped flexible circuit board 2210B. Flexible circuit board 2210 includes facet locations 2220, which in general are locations in which facets (e.g., sensor facets 3735, display facets 2665, or logic facets 2655 discussed below) may be installed on flexible circuit board 2210. In some embodiments, flexible circuit board 2210 includes gaps 2215. As illustrated in the bottom portion of FIG. 22, when flexible circuit board 2210 is flat, at least some of facet location 2220 are separated from one or more adjacent facet locations 2220 by one or more gaps 2215. As illustrated in the top portion of FIG. 22, when flexible circuit board 2210 is formed into a 3D shape, gaps 2215 may be substantially eliminated, thereby forming a continuous surface across at least some of the facets that are coupled at facet locations 2220 (e.g., a continuous sensing surface across multiple sensor facets 3735 or a continuous display surface across multiple display facets 2665).

In general, facet locations 2220 may have any shape. In some embodiments, facet locations 2220 are in the shape of a polygon (e.g., a triangle, square, rectangle, pentagon, hexagon, heptagon, or octagon). In some embodiments, facet locations 2220 are all identical. In other embodiments, however, facet locations 2220 all share the same polygon shape (e.g., all are hexagonal), but have different dimensions. In some embodiments, facet locations 2220 have heterogeneous shapes (e.g., some are rectangular and some are hexagonal). Any appropriate shape of facet locations 2220 may be used.

In some embodiments, facet locations 2220 are arranged in columns 2201. In some embodiments, facet locations 2220 are additionally or alternatively arranged in rows 2202. While a specific pattern of facet locations 2220 is illustrated, any appropriate pattern of facet locations 2220 may be used.

FIG. 23 illustrates additional details of flexible circuit board 2210, according to certain embodiments. In some embodiments, each facet location 2220 includes pads and/or vias for coupling sensor or display facets to flexible circuit board 2210. As an example, some embodiments of flexible circuit board 2210 include BGA pads 2240 at each facet location 2220. Any appropriate pattern and number of pads/vias may be included at each facet location 2220.

In general, each particular facet location 2220 is configured to transmit signals between a particular sensor facet coupled to the particular facet location and a particular display facet coupled to an opposite side of the particular facet location. For example, a particular facet location 2220 may have a sensor facet 3735 coupled to one side, and a display facet 2665 coupled to its opposite side. The particular facet location 2220 provides the necessary electrical connections to permit signals from the sensor facet 3735 to travel directly to the display facet 2665, thereby enabling the display facet 2665 to display light that corresponds to light captured by the sensor facet 3735.

Figure 24:
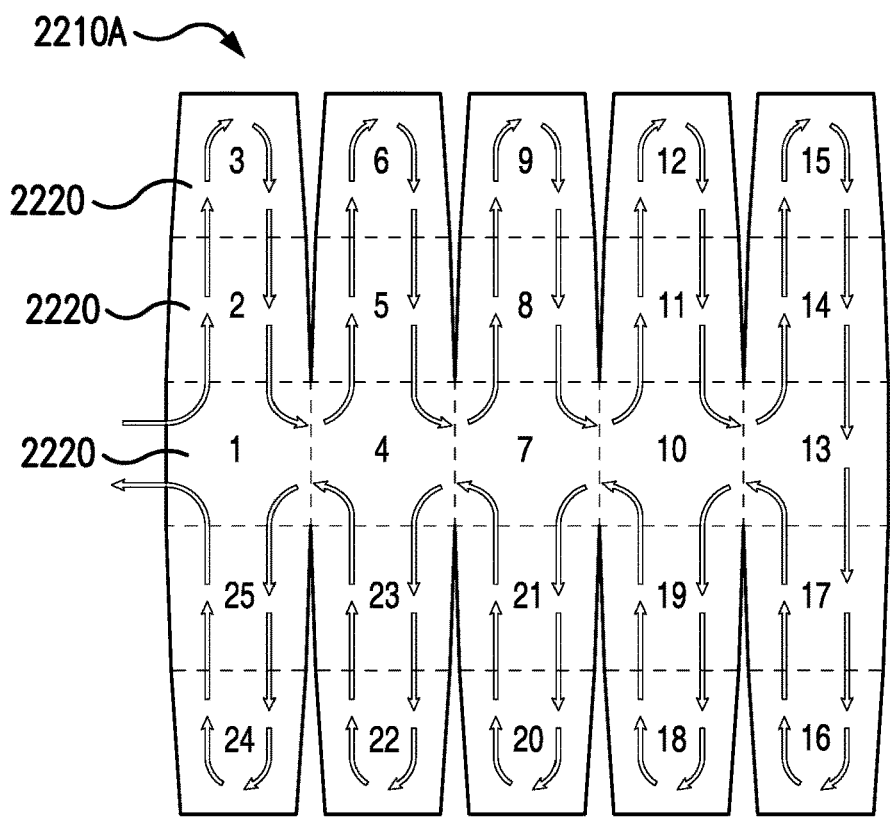
FIG. 24 illustrates a data flow through the flexible circuit board of FIG. 22, according to certain embodiments.

In some embodiments, wire traces 2230 are included on flexible circuit board 2210 to electrically connect facet locations 2220. For example, wire traces 2230 may connect to interconnection pads 2250 of each facet location 2220 in order to electrically connect adjacent facet locations 2220. In some embodiments, facet locations 2220 are serially connected via wire traces 2230. For example, FIG. 24 illustrates a serial data flow through flexible circuit board 2210, according to certain embodiments. In this example, each facet location 2220 is assigned a unique identifier (e.g., "1," "2," and so on), and data flows serially through facet locations 2220 via wire traces 2230 as illustrated. In this manner, each facet location 2220 may be addressed by a single processor or logic unit using its unique identifier. Any appropriate addressing scheme and data flow pattern may be used.

Figure 25:
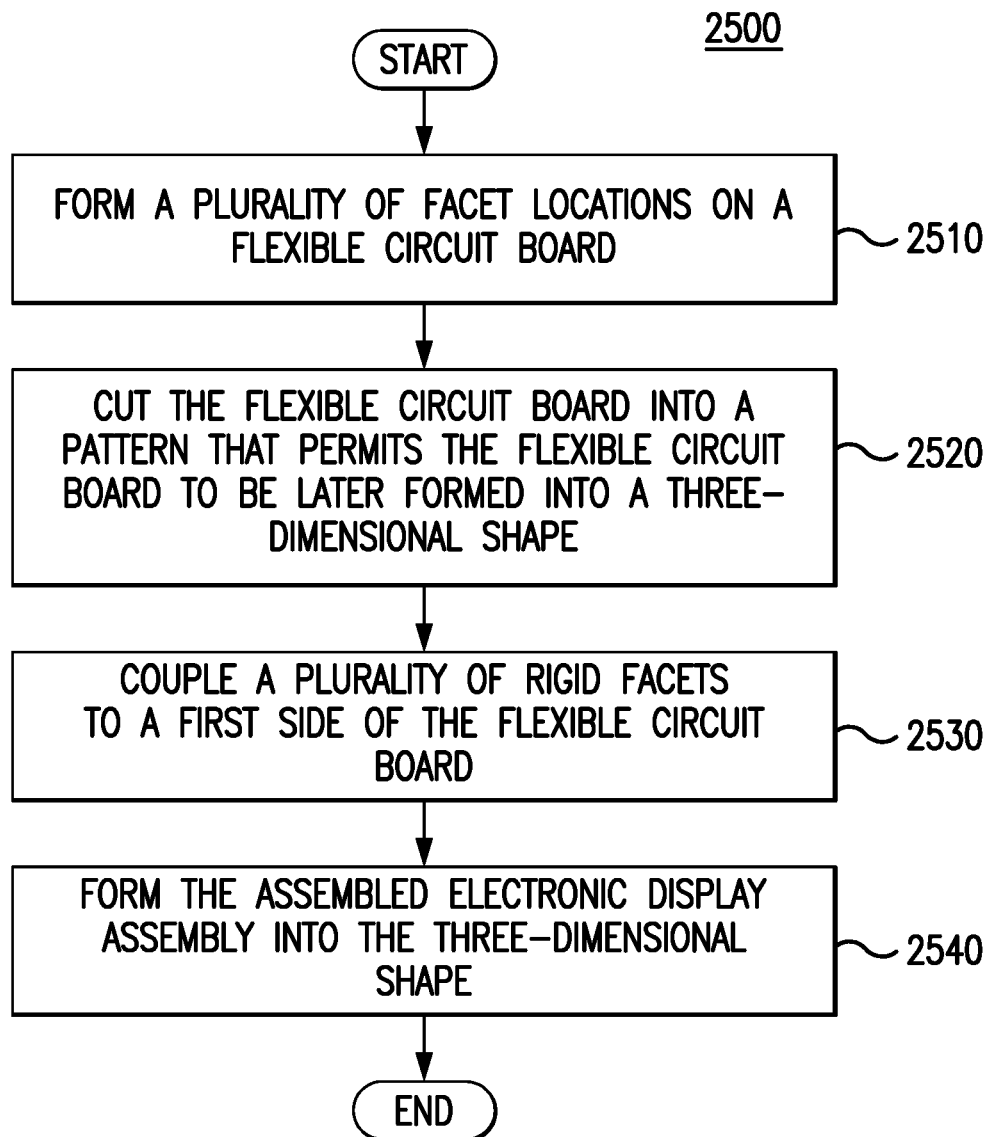
FIG. 25 illustrates a method of manufacturing an electronic assembly using the flexible circuit board of FIG. 22, according to certain embodiments.

FIG. 25 illustrates a method 2500 of manufacturing an electronic assembly using flexible circuit board 2210 of FIG. 22, according to certain embodiments. At step 2510, a plurality of facet locations are formed on a flexible circuit board. In some embodiments, the facet locations are facet locations 2220, and the flexible circuit board is flexible circuit board 2210. Each facet location corresponds to one of a plurality of sensor facets and one of a plurality of display facets. The sensor facets may be sensor facets 3735, and the display facets may be display facets 2665. In some embodiments, the plurality of facet locations are arranged into a plurality of facet columns such as columns 2201. In some embodiments, the plurality of facet locations are additionally or alternatively arranged into a plurality of facet rows such as rows 2202.

At step 2520, the flexible circuit board of step 2510 is cut or otherwise shaped into a pattern that permits the flexible circuit board to be later formed into a 3D shape such as a spherical or semispherical shape. When the flexible circuit board is flat, at least some of the facet locations are separated from one or more adjacent facet locations by a plurality of gaps such as gaps 2215. When the flexible circuit board is formed into the 3D shape, the plurality of gaps are substantially eliminated.

At step 2530, the electronic assembly is assembled by coupling a first plurality of rigid facets to a first side of the flexible circuit board. The first plurality of rigid facets may be sensor facets 3735 or display facets 2665. Each rigid facet is coupled to a respective one of the facet locations. In some embodiments, the first plurality of rigid facets are coupled to connection pads on the first side of the flexible circuit board using patterned conductive and non-conductive adhesives.

In some embodiments, the first plurality of rigid facets of step 2530 are rigid sensor facets such as sensor facet 3735, and method 2500 further includes coupling a plurality of rigid display facets such as display facet 2665 to a second side of the flexible circuit board that is opposite the first side. In this case, each particular facet location is configured to transmit signals between a particular rigid sensor facet electrically coupled to the particular facet location and a particular rigid display facet electrically coupled to the same particular facet location. This permits light to be displayed from the particular rigid display facet that corresponds to light captured by the corresponding rigid sensor facet.

At step 2540, the assembled electronic assembly is formed into the desired 3D shape. In some embodiments, this step involves placing the flexible circuit board with its coupled rigid facets into one side of a rigid casing that is in the desired shape. This allows the rigid facets to fall into defined spaces in the casing and the flexible circuit board to bend at defined creases/gaps between the rigid facets. After placing the flexible circuit board with its coupled rigid facets into one side of the rigid casing, an opposite matching side of the rigid casing may be attached to the first side, thereby sealing the assembly into the desired shape.

Particular embodiments may repeat one or more steps of method 2500, where appropriate. Although this disclosure describes and illustrates particular steps of method 2500 as occurring in a particular order, this disclosure contemplates any suitable steps of method 2500 occurring in any suitable order (e.g., any temporal order). Moreover, although this disclosure describes and illustrates an example method of manufacturing an electronic assembly using flexible circuit board, this disclosure contemplates any suitable method of manufacturing an electronic assembly using flexible circuit board, which may include all, some, or none of the steps of method 2500, where appropriate. Furthermore, although this disclosure describes and illustrates particular components, devices, or systems carrying out particular steps of method 2500, this disclosure contemplates any suitable combination of any suitable components, devices, or systems carrying out any suitable steps of method 2500.

FIGS. 26-36 illustrate distributed multi-screen arrays for high density displays, according to certain embodiments. In general, to provide a near-eye display capable of emulating the entire visual field of a single human eye, a high dynamic range image display with a resolution orders of magnitude greater than current common display screens is required. Such displays should be able to provide a light field display with enough angular and spatial resolution to accommodate 20/20 human visual acuity. This is an enormous amount of information, equating to a total horizontal pixel count of 100K to 200K. These displays should also wrap around the entire field of vision of one human eye (approximately 160° horizontally and 130° vertically). For rendering binocular vision, a pair of such displays spanning the entirety of a curved surface around each eye would be necessary. Typical displays available today, however, are unable to meet these requirements.

To address these and other limitations of current displays, embodiments of the disclosure provide an array of small, high-resolution micro displays (e.g., display facets 2665) of custom sizes and shapes, all of which are formed and then assembled on a larger, flexible circuit board 2210 that may be formed into a 3D shape (e.g., a semispherical surface). The micro displays may be mounted to the interior side of semispherical circuitry, where another layer containing an array of TFT logic units (e.g., logic units 755) may be included to handle all the power and signal management. Typically, one logic unit 755 may be included for each micro display. Each micro display operates as a discreet unit, displaying data from the logic unit behind it. Any additional information (e.g., such as external video for AR, VR, or MR applications) may be passed to the entire array via a central control processor. In some embodiments, the external data signal progresses serially from one micro display to the next as a packed multiplex stream, while the TFT logic unit for each display determines the source and section of the signal to read. This allows each unit to act independently of any other display, providing a large array of many high-resolution displays with unique content on each, such that the whole assembly together forms essentially a single extremely high-resolution display.

To fulfill the requirements of resolution, color clarity, and luminance output, each micro display may have a unique, high performance pixel architecture. For example, each micro display screen may include arrays of display pixels 100 as described in FIGS. 1-4 and their associated descriptions in U.S. patent application Ser. No. 15/724,004 entitled "Stacked Transparent Pixel Structures for Electronic Displays," which is incorporated herein by reference in its entirety. The micro display screens may be assembled on the same substrate using any appropriate method. Such simultaneous manufacturing using standard semiconductor layering and photolithographic processes virtually eliminates the overhead and costs associated with production and packaging of many individual screens, greatly improving affordability.

Figure 26:
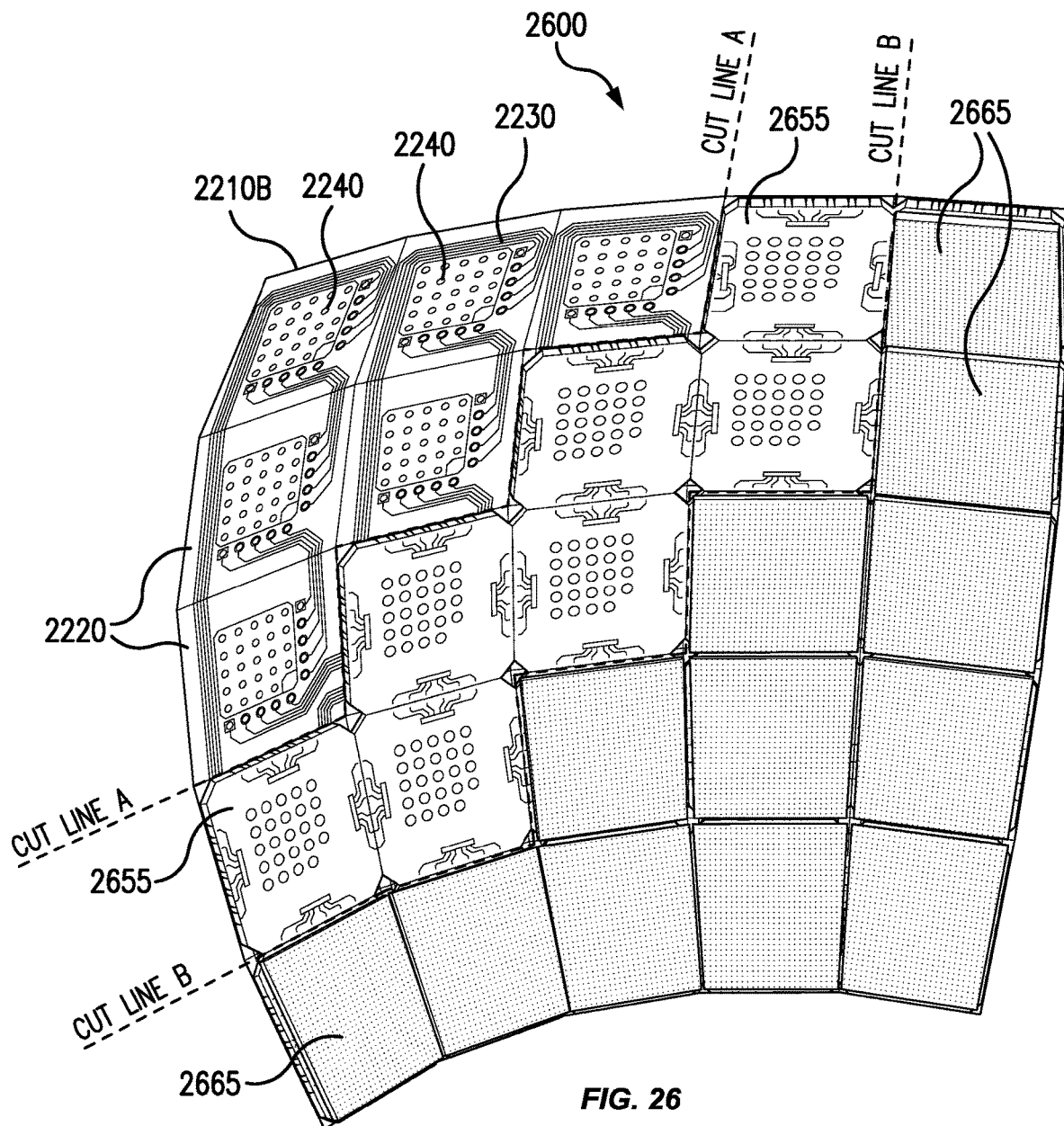
FIG. 26 illustrates a cut-away view of a curved multi-display array, according to certain embodiments.

FIG. 26 illustrates a cut-away view of a curved multi-display array 2600, according to certain embodiments. FIG. 26 is essentially the back side of flexible circuit board 2210B of FIG. 22 with the addition of logic facets 2655 and display facets 2665 coupled to flexible circuit board 2210B at facet locations 2220. In general, each logic facet 2655 is an individual logic unit 755 from logic unit layer 750. Similarly, each display facet 2665 is an individual display unit 765 from display layer 760 coupled with a portion of microlens array 720.

In some embodiments, each individual logic facet 2655 is coupled to flexible circuit board 2210, and each individual display facet 2665 is then coupled to one of the logic facets 2655. In other embodiments, each logic facet 2655 is first coupled one of the display facets 2665, and the combined facet is then coupled to flexible circuit board 2210. In such embodiments, the combined logic facet 2655 and display facet 2665 may be referred to as a display facet 2665 for simplicity. As used herein, "display facet" may refer to both embodiments (i.e., an individual display facet 2665 or a combination of a display facet 2665 with a logic facet 2655).

In general, each display facet 2665 can be individually addressed (e.g., by a central control processor not pictured), and a collection of display facets 2665 may represent a dynamic, heterogeneous collection forming a singular collective. In other words, multi-display array 2600 provides a tiled electronic display system showing imagery through individual display facets 2665 that together form a complete whole. Each individual display facet 2665 is capable of providing multiple different display resolutions and can be customized on the fly to run a different resolution, color range, frame rate, etc. For example, one display facet 2665 may have a 512×512 display resolution while an adjacent display facet 2665 (of equal size) has a 128×128 display resolution, wherein the former represents a higher concentration of imagery data. In this example, these two displays are heterogeneous, but are individually controllable and work in unison to form a singular display image.

The overall collection of display facets 2665 can follow any curved or flat surface structure. For example, display facets 2665 may be formed into a semispherical surface, a cylindrical surface, an oblong spherical surface, or any other shaped surface.

Logic facets 2655 and display facet 2665 may be in any appropriate shape. In some embodiments, the shapes of logic facets 2655 and display facets 2665 match each other and the shape of facet locations 2220. In some embodiments, logic facets 2655 and display facets 2665 are in the shape of a polygon such as a triangle, a quadrilateral, a pentagon, a hexagon, a heptagon, or an octagon. In some embodiments, some or all of logic facets 2655 and display facets 2665 have non-polygonal shapes. For example, display facets 2665 on the edges of flexible circuit board 2210 may not be polygonal as they may have curved cutoffs so as to enhance the aesthetic of the overall assembly.

In addition to having a selectable/controllable display resolution, each display facet 2665 may in some embodiments also have a selectable color range from a plurality of color ranges and/or a selectable frame rate from a plurality of frame rates. In such embodiments, the display facets 2665 of a particular flexible circuit board 2210 are configurable to provide heterogeneous frame rates and heterogeneous color range. For example, one display facet 2665 may have a particular color range while another display facet 2665 has a different color range. Similarly, one display facet 2665 may have a particular frame rate while another display facet 2665 has a different frame rate.

Figure 27:
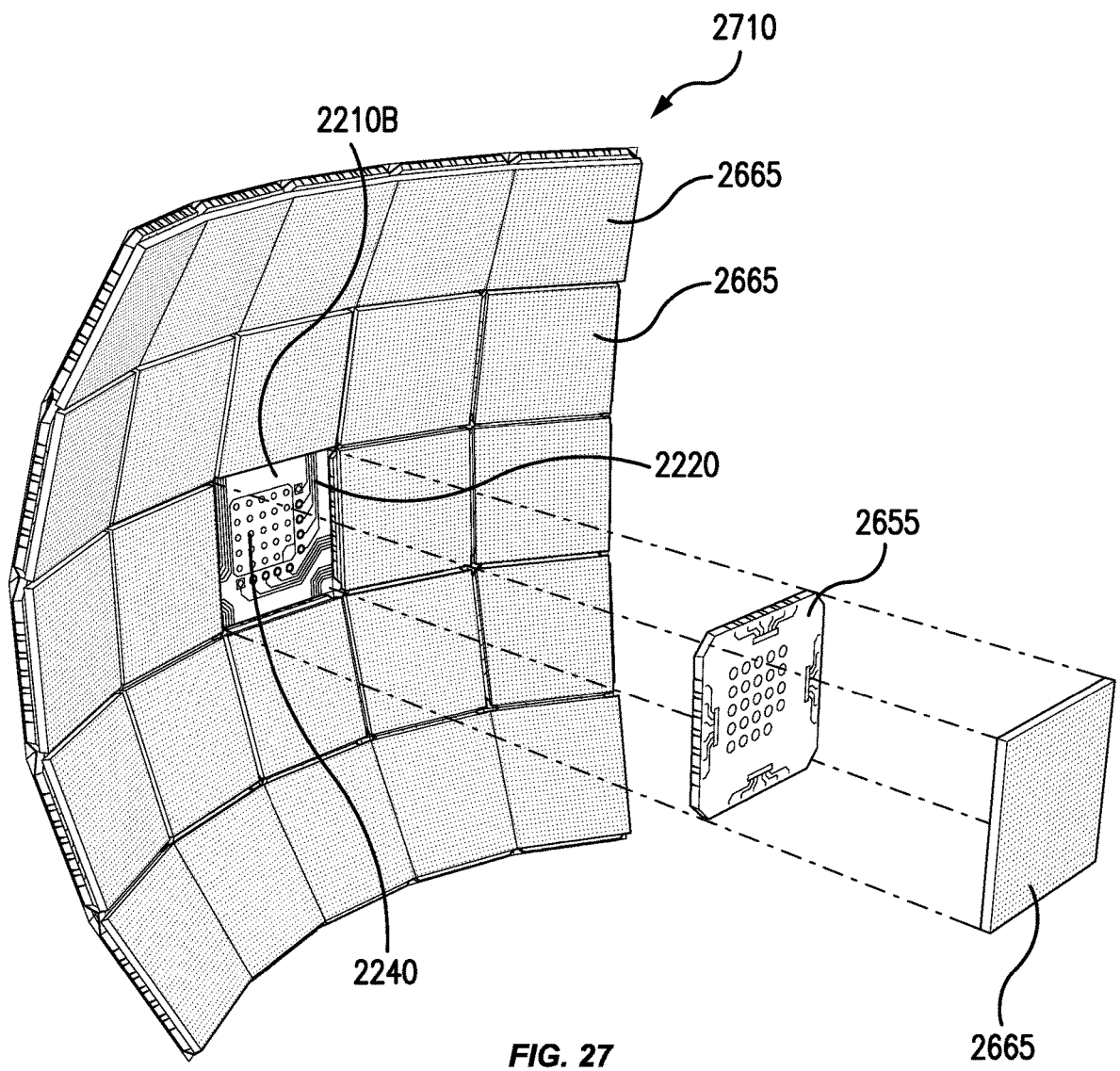
FIG. 27 illustrates an exploded view of the curved multi-display array of FIG. 26, according to certain embodiments.
Figure 28:
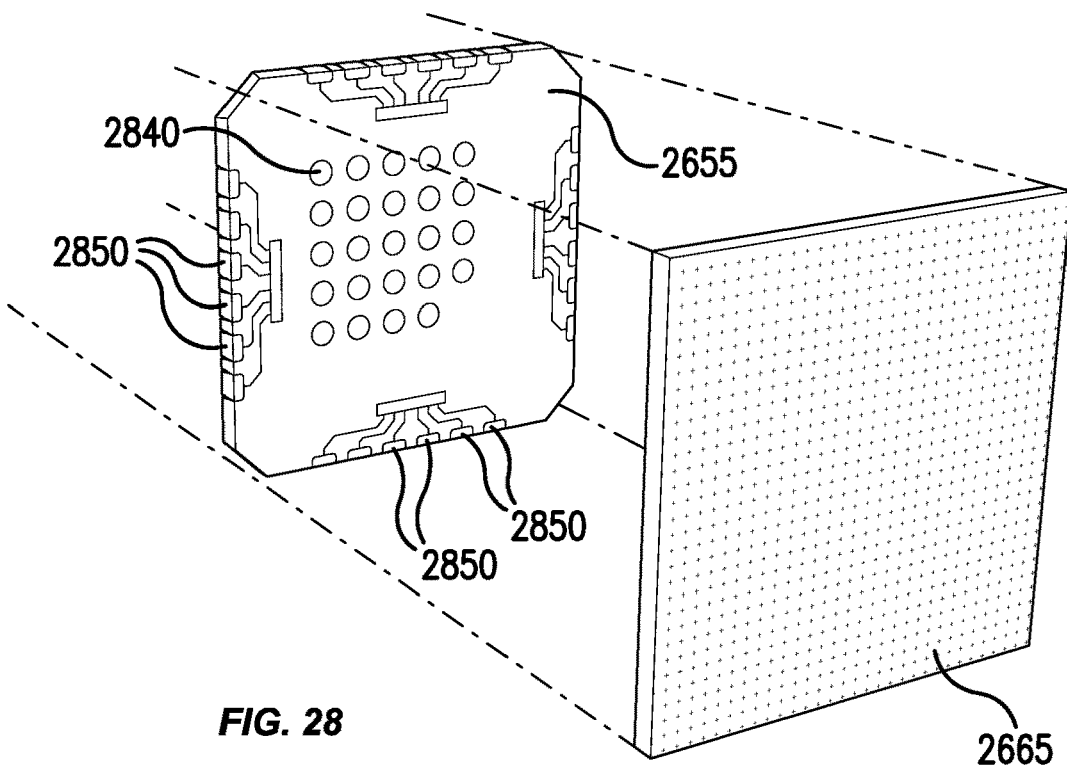
FIGS. 28-29 illustrate logic facets and display facets of the curved multi-display array of FIG. 26, according to certain embodiments.
Figure 29:
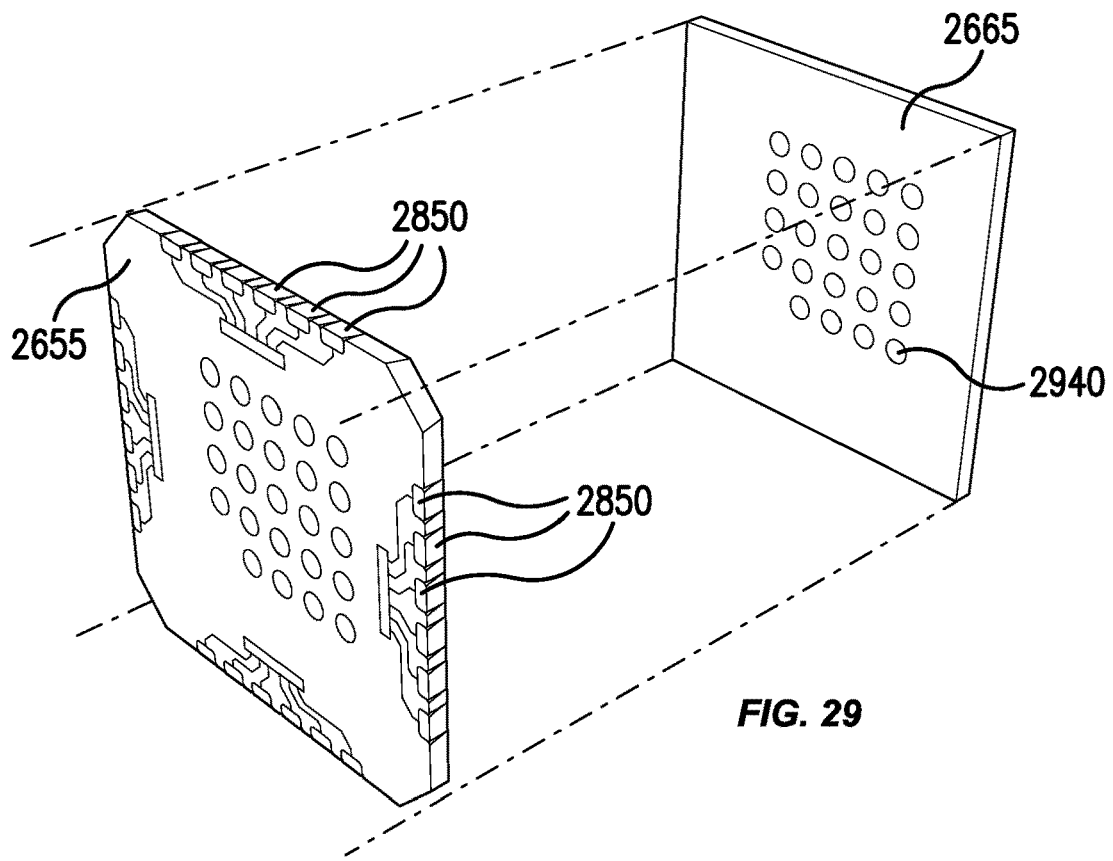

FIG. 27 illustrates an exploded view of the curved multi-display array 2600 of FIG. 26, and FIGS. 28-29 illustrate additional details of logic facet 2655 and display facet 2665, according to certain embodiments. As illustrated in these figures, each logic facet 2655 may include interconnections pads 2850 that may be electrically coupled to interconnection pads 2250 of adjacent logic facets 2655. This may enable display facets 2665 to be serially coupled via wire traces 2230. In addition, each logic facet 2655 may include pads 2840 in a pattern that matches pads 2940 on the back side of display facet 2665. This permits logic facet 2655 and display facet 2665 to be coupled together using any appropriate technique in the art. In some embodiments, pads 2840 and pads 2940 are BGA pads or any other appropriate surface-mounting pads.

Figure 30:
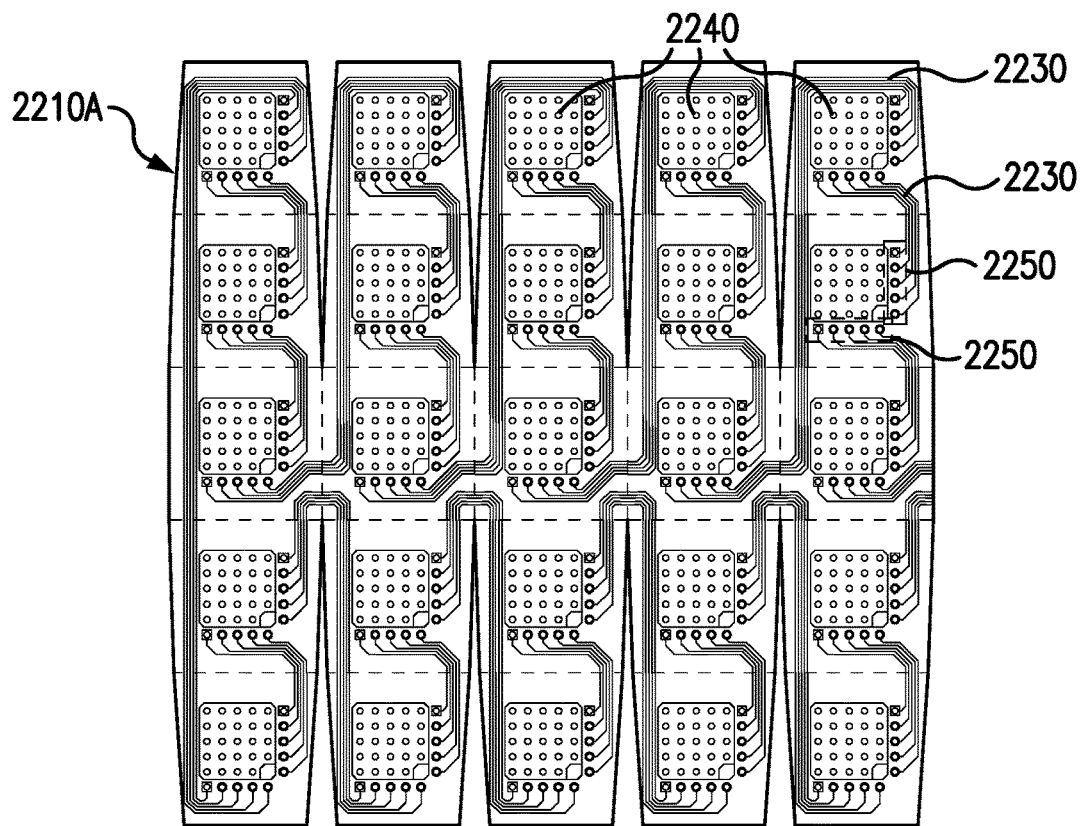
FIG. 30 illustrates a back side of the flexible circuit board of FIG. 22, according to certain embodiments.
Figure 31:
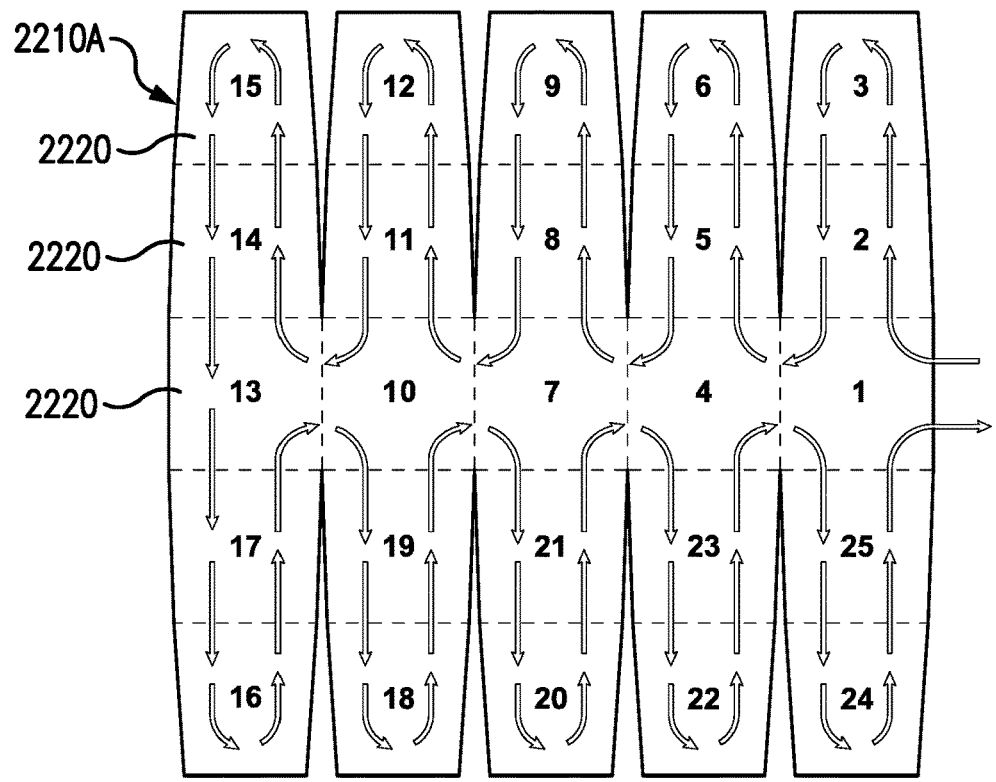
FIG. 31 illustrates a data flow through the flexible circuit board of FIG. 30, according to certain embodiments.
Figure 32:
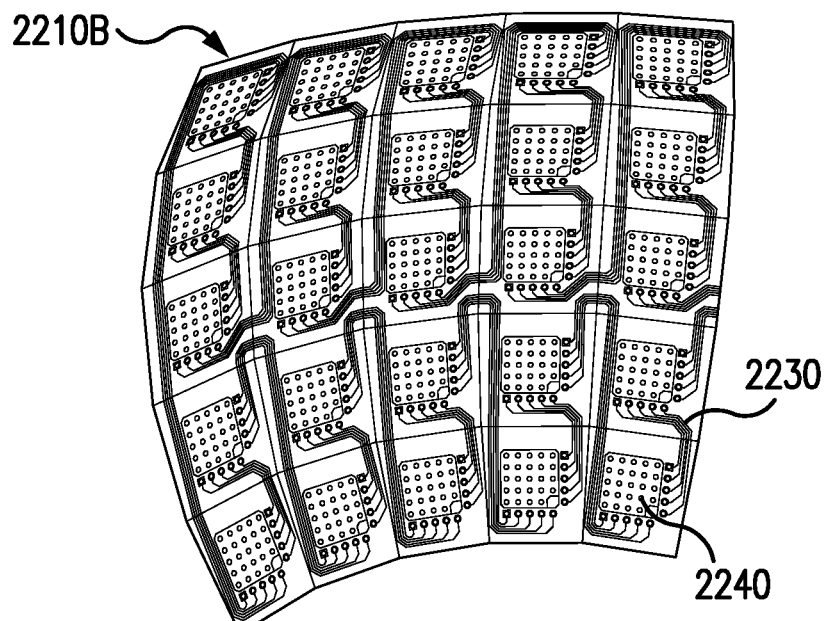
FIG. 32 illustrates the flexible circuit board of FIG. 30 that has been formed into a semispherical shape, according to certain embodiments.
Figure 33:
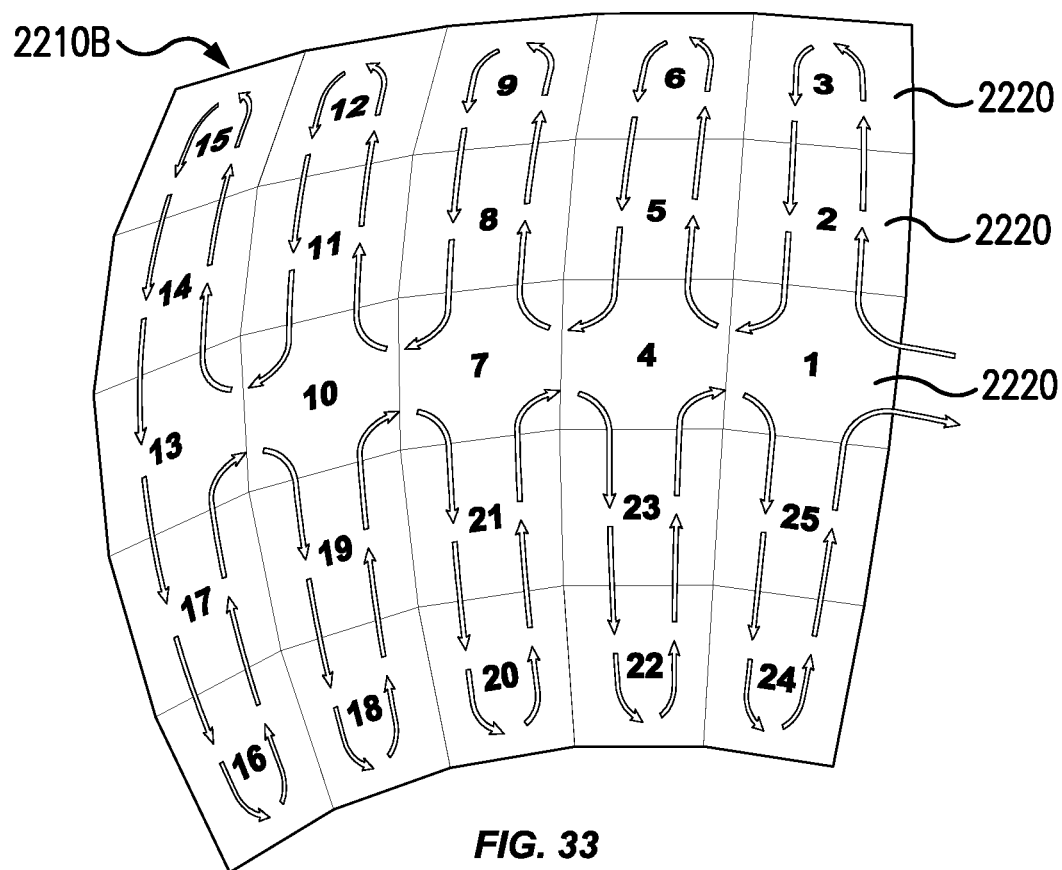
FIG. 33 illustrates a data flow through the flexible circuit board of FIG. 32, according to certain embodiments.
Figure 34:
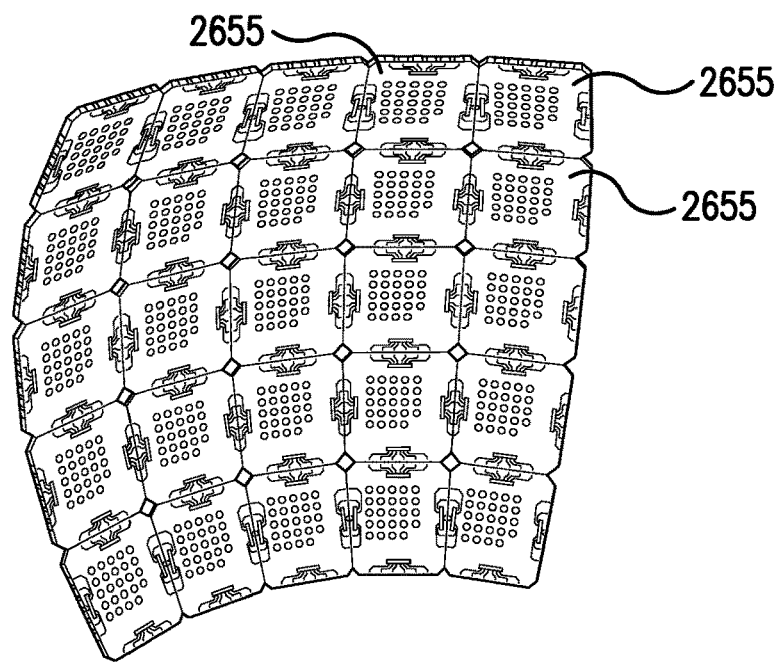
FIG. 34 illustrates an array of logic facets that have been formed into a semispherical shape, according to certain embodiments.
Figure 35:
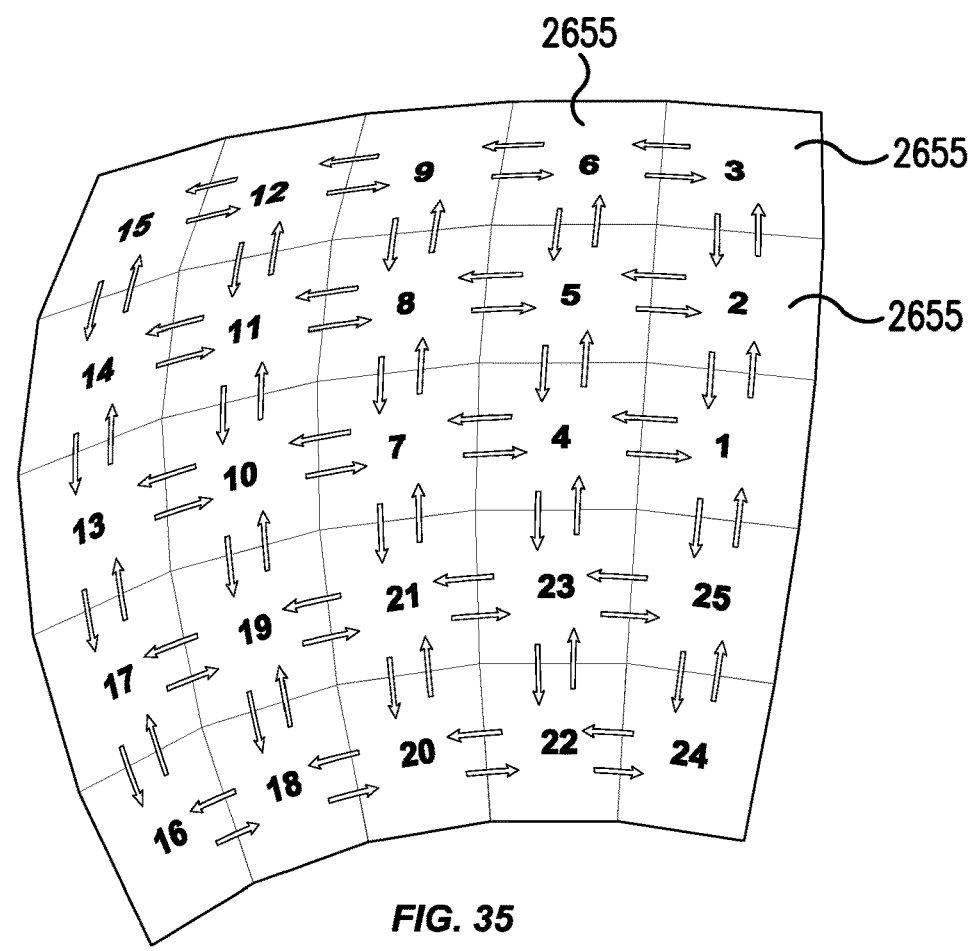
FIG. 35 illustrates communications between the logic facets of FIG. 34, according to certain embodiments.

FIGS. 30 and 32 illustrate a back side of flexible circuit board 2210 of FIG. 22, and show similar details as described in reference to FIG. 23. FIGS. 31 and 33 illustrate a serial data flow through flexible circuit board 2210, and show similar details as described in reference to FIG. 24. FIG. 34 illustrates an array of logic facets 2655 that have been formed into a semispherical shape, according to certain embodiments. In this figure, flexible circuit board 2210 and display facet 2665 have been removed for clarity. FIG. 35 illustrates communications between the logic facets 2655 of FIG. 34, according to certain embodiments. As illustrated in this figure, each logic facet 2655 may communicate with adjacent logic facets 2655 using interconnections pads 2850. In addition, each logic facet 2655 may have a unique identification as illustrated in FIG. 35. This permits each logic facet 2655 to be uniquely addressed by, for example, a central processing unit.

Figure 36:
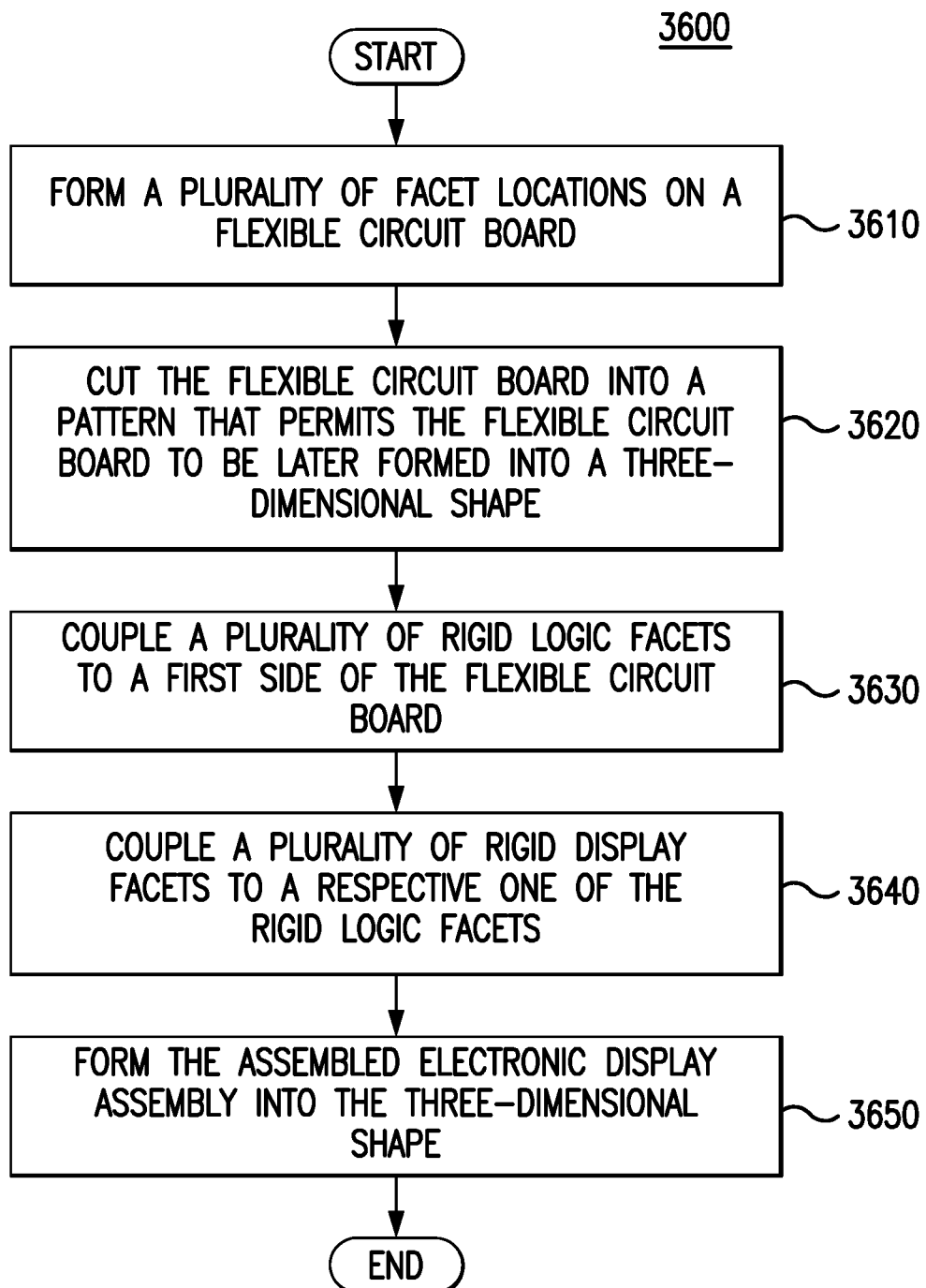
FIG. 36 illustrates a method of manufacturing the curved multi-display array of FIG. 26, according to certain embodiments.

FIG. 36 illustrates a method 3600 of manufacturing the curved multi-display array of FIG. 26, according to certain embodiments. Method 3600 may begin in step 3610 where a plurality of facet locations are formed on a circuit board. In some embodiments, the facet locations are facet locations 2220 and the circuit board is flexible circuit board 2210. In some embodiments, each facet location corresponds to one of a plurality of display facets such as display facets 2665.

At step 3620, the flexible circuit board is cut or otherwise formed into a pattern that permits the flexible circuit board to be later formed into a 3D shape. When the flexible circuit board is flat, at least some of the facet locations are separated from one or more adjacent facet locations by a plurality of gaps such as gaps 2215. When the flexible circuit board is formed into the 3D shape, the plurality of gaps are substantially eliminated.

At step 3630, a plurality of logic facets are coupled to a first side of the flexible circuit board. Each logic facet is coupled to a respective one of the facet locations of step 3610. At step 3640, a plurality of display facets are coupled to a respective one of the plurality of logic facets of step 3630. In alternate embodiments, the display facets may be mounted to the logic facets of step 3630 at the wafer level prior to coupling the logic facets to the first side of the flexible circuit board. At step 3650, the assembled electronic display assembly is formed into the 3D shape. In some embodiments, this step may be similar to step 2540 of method 2500 described above. After step 3650, method 3600 may end.

Particular embodiments may repeat one or more steps of method 3600, where appropriate. Although this disclosure describes and illustrates particular steps of method 3600 as occurring in a particular order, this disclosure contemplates any suitable steps of method 3600 occurring in any suitable order (e.g., any temporal order). Moreover, although this disclosure describes and illustrates an example method of manufacturing a curved multi-display array, this disclosure contemplates any suitable method of manufacturing a curved multi-display array, which may include all, some, or none of the steps of method 3600, where appropriate. Furthermore, although this disclosure describes and illustrates particular components, devices, or systems carrying out particular steps of method 3600, this disclosure contemplates any suitable combination of any suitable components, devices, or systems carrying out any suitable steps of method 3600.

FIGS. 37-42 illustrate a distributed multi-aperture camera array 3700, according to certain embodiments. In general, to capture the full light field of the entire visual field of a single human eye, a large, high dynamic range image sensor with a resolution much higher than currently available is needed. Such an image sensor would enable a light field camera with enough angular and spatial resolution to accommodate 20/20 human visual acuity. This is an enormous amount of information, equating to a total horizontal pixel count of 100K to 200K. This multi-aperture image sensor must also wrap around the entire field of vision of one human eye (approximately 160° horizontally and 130° vertically). For imaging binocular vision, a pair of such cameras spanning the entirety of a curved surface around each eye are necessary. Typical image sensor assemblies available today are unable to meet these requirements.

To overcome these and other limitations of typical image sensors, embodiments of the disclosure provide an array of small image sensors of custom sizes and shapes, all of which are assembled on a larger, flexible circuit board 2210 that is formed to a 3D (e.g., semi-spherical) shape. The image sensors (e.g., sensor facets 3735) are mounted to the exterior side of flexible circuit board 2210, where another layer containing an array of TFT logic units (e.g., logic units 755) may be provided to handle all the power and signal management—one logic unit for each display. Each image sensor operates as a discrete unit passing readout data to the logic unit behind it (in embodiments that include logic units), where it is handled and routed accordingly (e.g., to a corresponding display facet 2665 in some embodiments). This allows each sensor facet 3735 to act independently of any other sensor facet 3735, providing a large array of many apertures capturing unique content on each, such that the whole assembly essentially becomes a seamless, very high resolution, multi-node camera. It should be noted that while image sensors may pass data to their paired logic units in some embodiments, the functionality of the image sensors themselves do not necessarily require logic unit coupling.

To fulfill the requirements of resolution, color clarity, and luminance output, each micro sensor may have a unique, high performance pixel architecture. For example, each micro sensor may include arrays of sensor pixels 1800 as described in FIGS. 18-20 and their associated descriptions in U.S. patent application Ser. No. 15/724,027 entitled "Stacked Transparent Pixel Structures for Image Sensors," which is incorporated herein by reference in its entirety. The micro sensor may be assembled on the same substrate using any appropriate method. Such simultaneous manufacturing using standard semiconductor layering and photolithographic processes virtually eliminates the overhead and costs associated with production and packaging of many individual screens, greatly improving affordability.

Another characteristic of certain embodiments of distributed multi-aperture camera array 3700 is built-in depth perception based on parallax between different plenoptic cells. Imagery produced by cells on opposite sides of a given sensor may be used to calculate the offset of image detail, where offset distance directly correlates with proximity of the detail to the sensor surface. This scene information may be used by a central processor when overlaying any augmented video signal, resulting in AR/MR content placed in front of the viewer at the appropriate depth. The information can also be used for a variety of artificial focus blurring and depth-sensing tasks, including simulated depth of field, spatial edge detection, and other visual effects.

Figure 37:
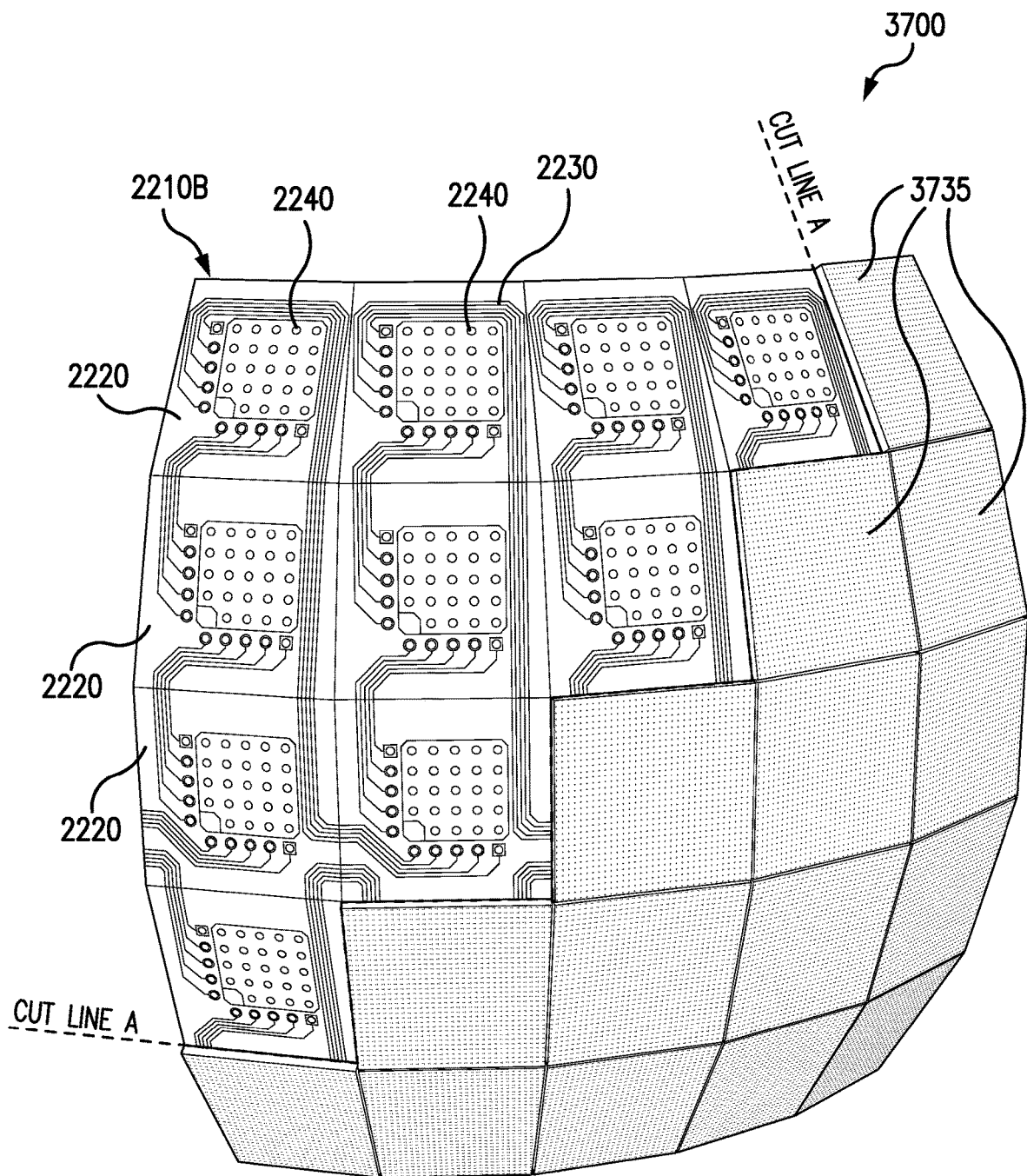
FIG. 37 illustrates a cut-away view of a curved multi-camera array, according to certain embodiments.

FIG. 37 illustrates a cut-away view of distributed multi-aperture camera array 3700, according to certain embodiments. FIG. 37 is essentially the flexible circuit board 2210B of FIG. 22 with the addition of sensor facet 3735 coupled to flexible circuit board 2210B at facet locations 2220. In some embodiments, each sensor facet 3735 is an individual sensor unit 735 from image sensor layer 730.

In some embodiments, each individual sensor facet 3735 is coupled to flexible circuit board 2210. In other embodiments, each individual sensor facet 3735 is coupled to one of the logic facets 2655 that has been coupled to flexible circuit board 2210. In other embodiments, each logic facet 2655 is first coupled one of the sensor facets 3735, and the combined facet is then coupled to flexible circuit board 2210. In such embodiments, the combined logic facet 2655 and sensor facet 3735 may be referred to as a sensor facet 3735 for simplicity. As used herein, "sensor facet" may refer to both embodiments (i.e., an individual sensor facet 3735 or a combination of a sensor facet 3735 with a logic facet 2655).

In general, each sensor facet 3735 can be individually addressed (e.g., by a central control processor not pictured), and a collection of sensor facets 3735 may represent a dynamic, heterogeneous collection forming a singular collective. In other words, distributed multi-aperture camera array 3700 provides a tiled electronic sensor system providing imagery captured through individual sensor facets 3735 that together form a complete whole. Each individual sensor facets 3735 is capable of capturing images at multiple different resolutions and can be customized on the fly to capture a different resolution, color range, frame rate, etc. For example, one sensor facet 3735 may have a 512×512 capture resolution while an adjacent sensor facet 3735 (of equal size) has a 128×128 capture resolution, wherein the former represents a higher concentration of imagery data. In this example, these two sensors are heterogeneous, but are individually controllable and work in unison to capture a singular light field.

The overall collection of sensor facets 3735 can follow any curved or flat surface structure. For example, sensor facets 3735 may be formed into a semispherical surface, a cylindrical surface, an oblong spherical surface, or any other shaped surface.

Sensor facets 3735 may be in any appropriate shape. In some embodiments, the shapes of sensor facets 3735 match the shapes of display facets 2665 and the shape of facet locations 2220. In some embodiments, sensor facets 3735 are in the shape of a polygon such as a triangle, a quadrilateral, a pentagon, a hexagon, a heptagon, or an octagon. In some embodiments, some or all of sensor facets 3735 have non-polygonal shapes. For example, sensor facets 3735 on the edges of flexible circuit board 2210 may not be polygonal as they may have curved cutoffs so as to enhance the aesthetic of the overall assembly.

In addition to having a selectable/controllable resolution, each sensor facets 3735 may in some embodiments also have a selectable color range from a plurality of color ranges and/or a selectable frame rate from a plurality of frame rates. In such embodiments, the sensor facets 3735 of a particular flexible circuit board 2210 are configurable to provide heterogeneous frame rates and heterogeneous color range. For example, one sensor facet 3735 may have a particular color range while another sensor facet 3735 has a different color range. Similarly, one sensor facet 3735 may have a particular frame rate while another sensor facet 3735 has a different frame rate.

Figure 38:
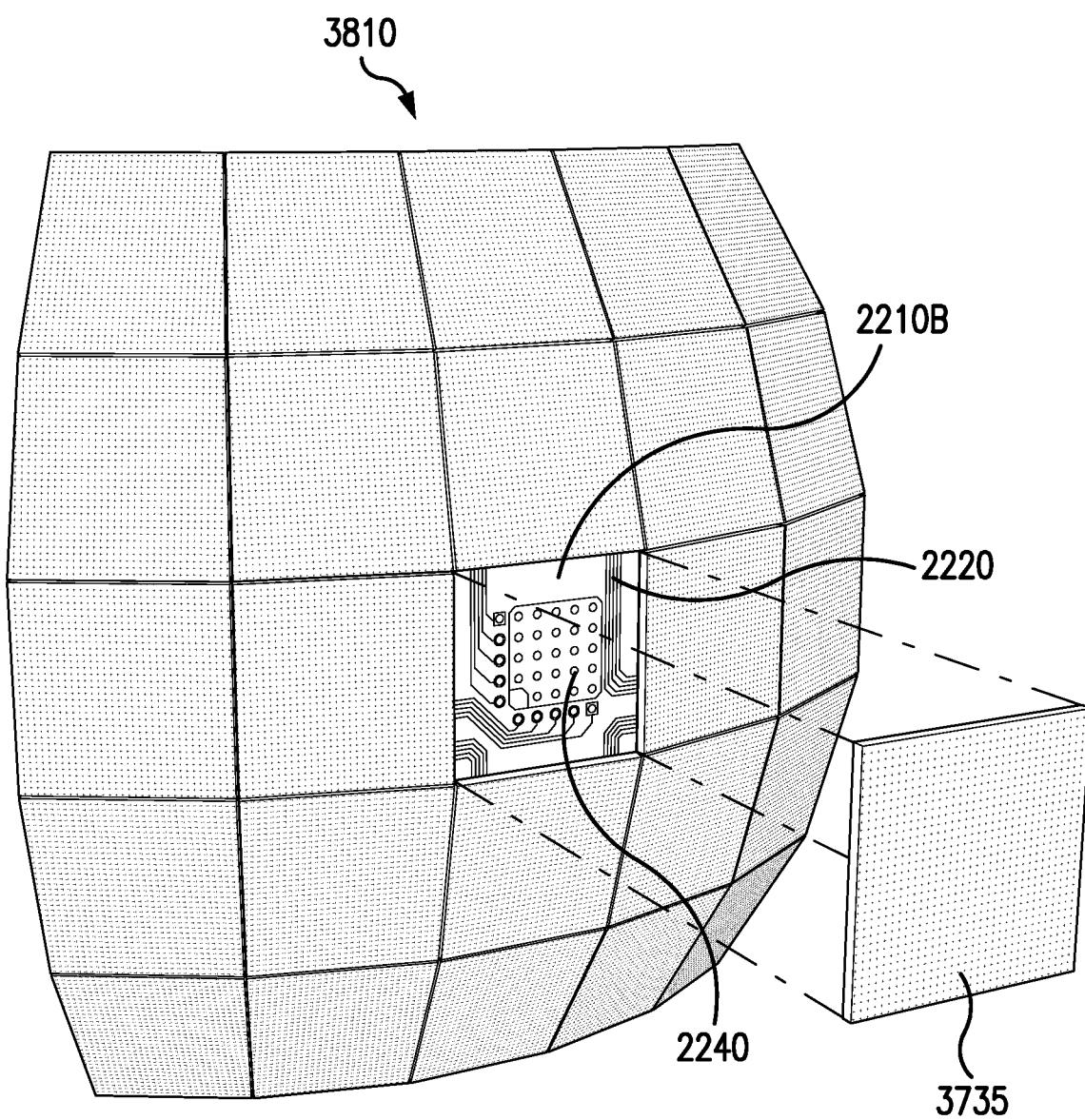
FIGS. 38-39 illustrate exploded views of the curved multi-camera array of FIG. 37, according to certain embodiments.
Figure 39:
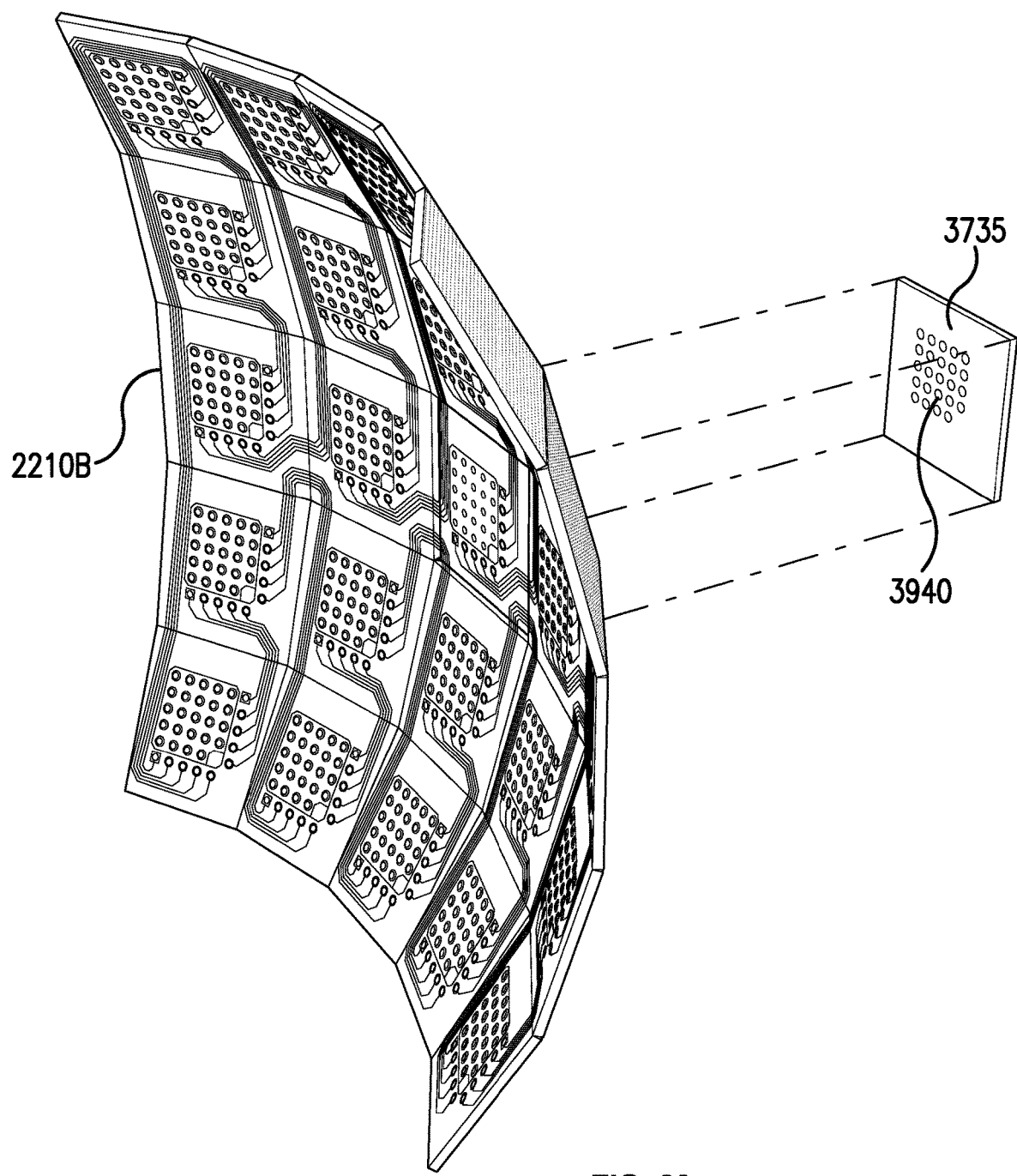
Figure 40:
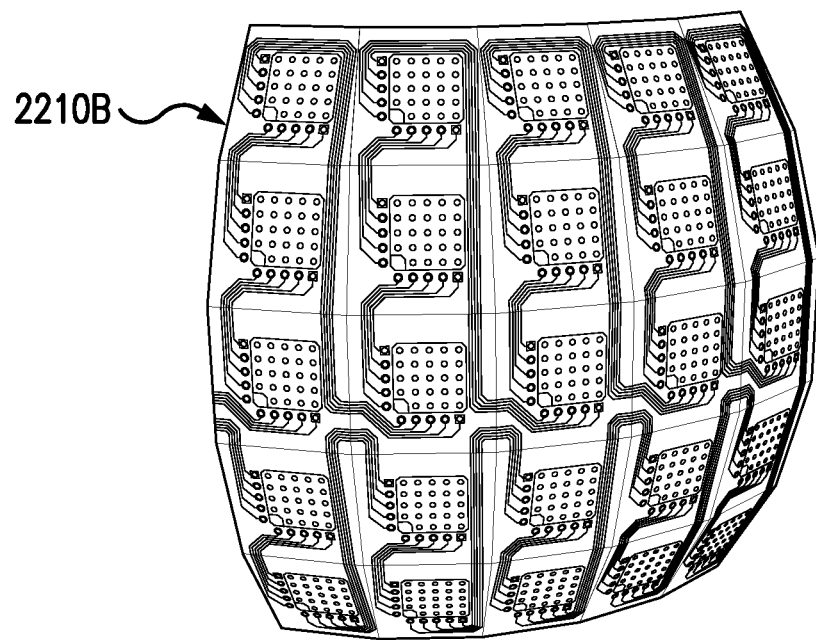
FIG. 40 illustrates a back view of the flexible circuit board of FIG. 32, according to certain embodiments.
Figure 41:
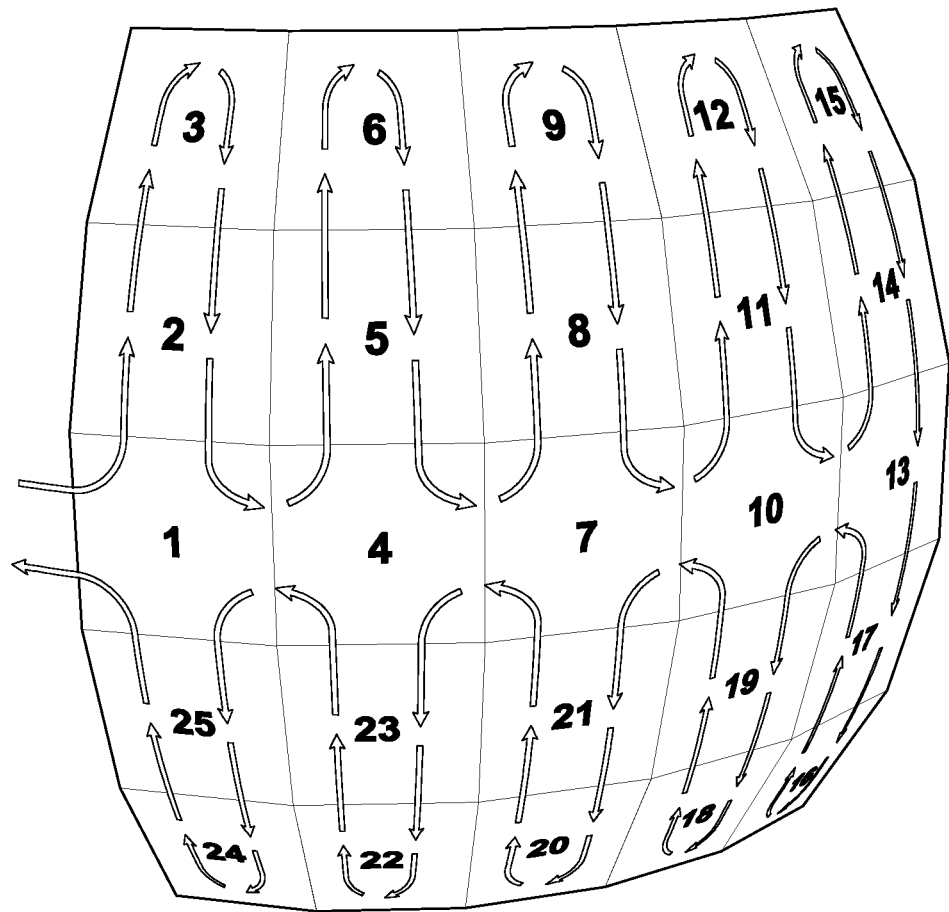
FIG. 41 illustrates a data flow through the flexible circuit board of FIG. 40, according to certain embodiments.

FIGS. 38-39 illustrate exploded views of the distributed multi-aperture camera array 3700 of FIG. 37, according to certain embodiments. As illustrated in these figures, each sensor facet 3735 may include pads 3940 in a pattern that matches pads 2240 on flexible circuit board 2210 or pads 2940 on logic facet 2655. This permits sensor facet 3735 to be coupled to logic facet 2655 or flexible circuit board 2210 using any appropriate technique in the art. In some embodiments, pads 3940 are BGA pads or any other appropriate surface-mounting pads. FIGS. 40-40 illustrate similar views of flexible circuit board 2210 as shown in FIGS. 23-24, except that flexible circuit board 2210 has been formed into a 3D shape.

Figure 42:
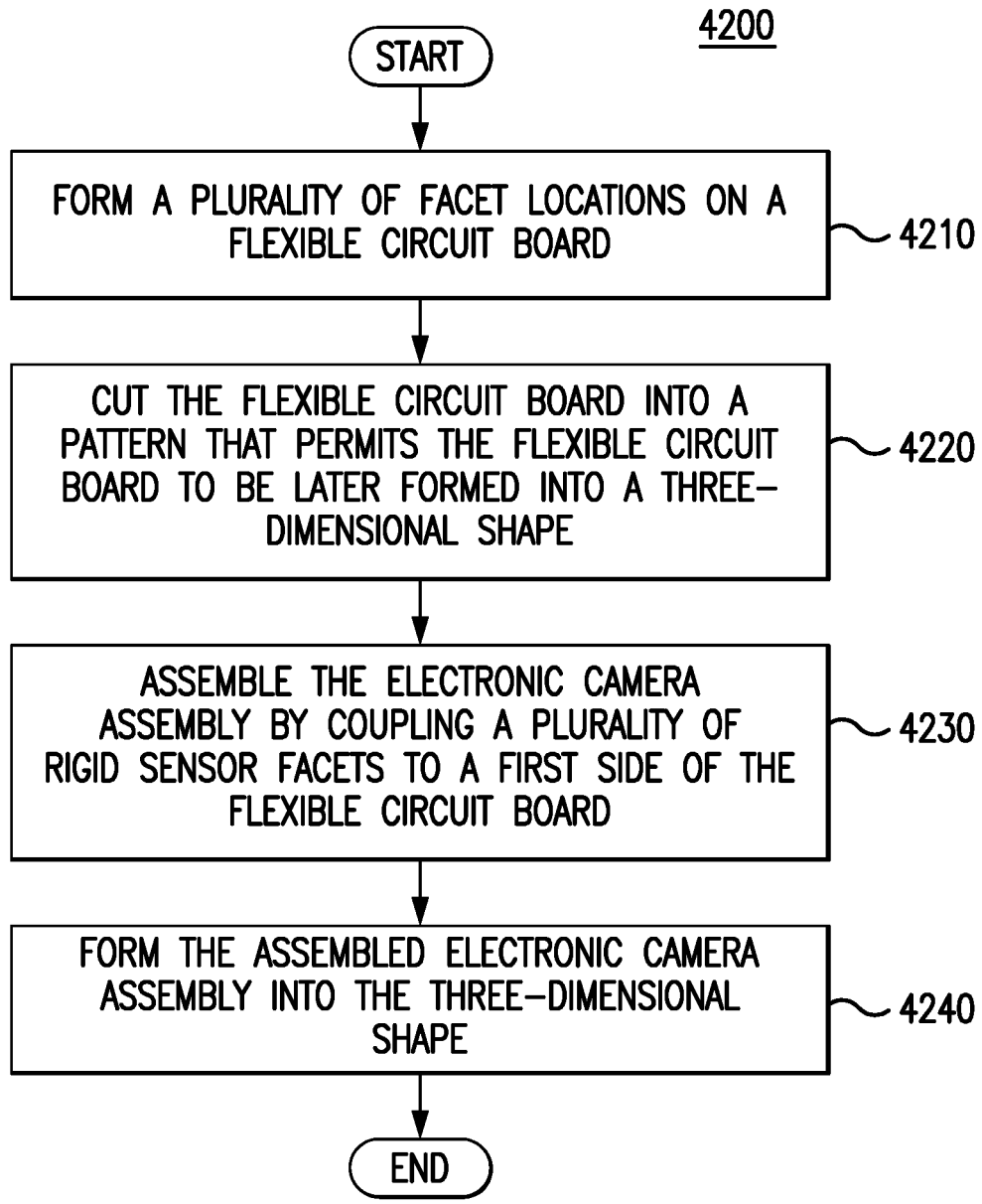
FIG. 42 illustrates a method of manufacturing the curved multi-camera array of FIG. 37, according to certain embodiments.

FIG. 42 illustrates a method 4200 of manufacturing distributed multi-aperture camera array 3700, according to certain embodiments. Method 4200 may begin in step 4210 where a plurality of facet locations are formed on a circuit board. In some embodiments, the facet locations are facet locations 2220 and the circuit board is flexible circuit board 2210. In some embodiments, each facet location corresponds to one of a plurality of sensor facets such as sensor facets 3735.

At step 4220, the flexible circuit board is cut or otherwise formed into a pattern that permits the flexible circuit board to be later formed into a 3D shape. When the flexible circuit board is flat, at least some of the facet locations are separated from one or more adjacent facet locations by a plurality of gaps such as gaps 2215. When the flexible circuit board is formed into the 3D shape, the plurality of gaps are substantially eliminated.

At step 4230, a plurality of sensor facets are coupled to a first side of the flexible circuit board. Each sensor facet is coupled to a respective one of the facet locations of step 4210. At step 4240, the assembled electronic camera assembly is formed into the 3D shape. In some embodiments, this step may be similar to step 2540 of method 2500 described above. After step 4240, method 4200 may end.

Particular embodiments may repeat one or more steps of method 4200, where appropriate. Although this disclosure describes and illustrates particular steps of method 4200 as occurring in a particular order, this disclosure contemplates any suitable steps of method 4200 occurring in any suitable order (e.g., any temporal order). Moreover, although this disclosure describes and illustrates an example method of manufacturing a distributed multi-aperture camera array, this disclosure contemplates any suitable method of manufacturing a distributed multi-aperture camera array, which may include all, some, or none of the steps of method 4200, where appropriate. Furthermore, although this disclosure describes and illustrates particular components, devices, or systems carrying out particular steps of method 4200, this disclosure contemplates any suitable combination of any suitable components, devices, or systems carrying out any suitable steps of method 4200.

Figure 43:
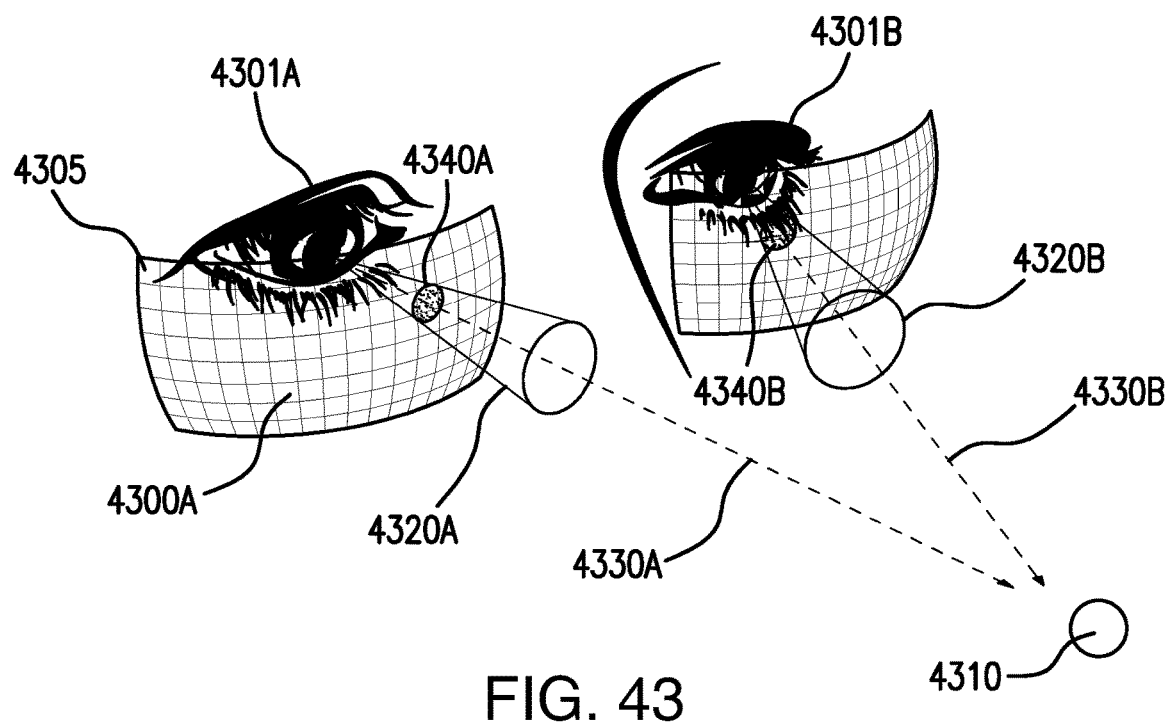
FIGS. 43-46 illustrate perspective views of a near-eye pupil-tracking surface, according to certain embodiments.
Figure 44:
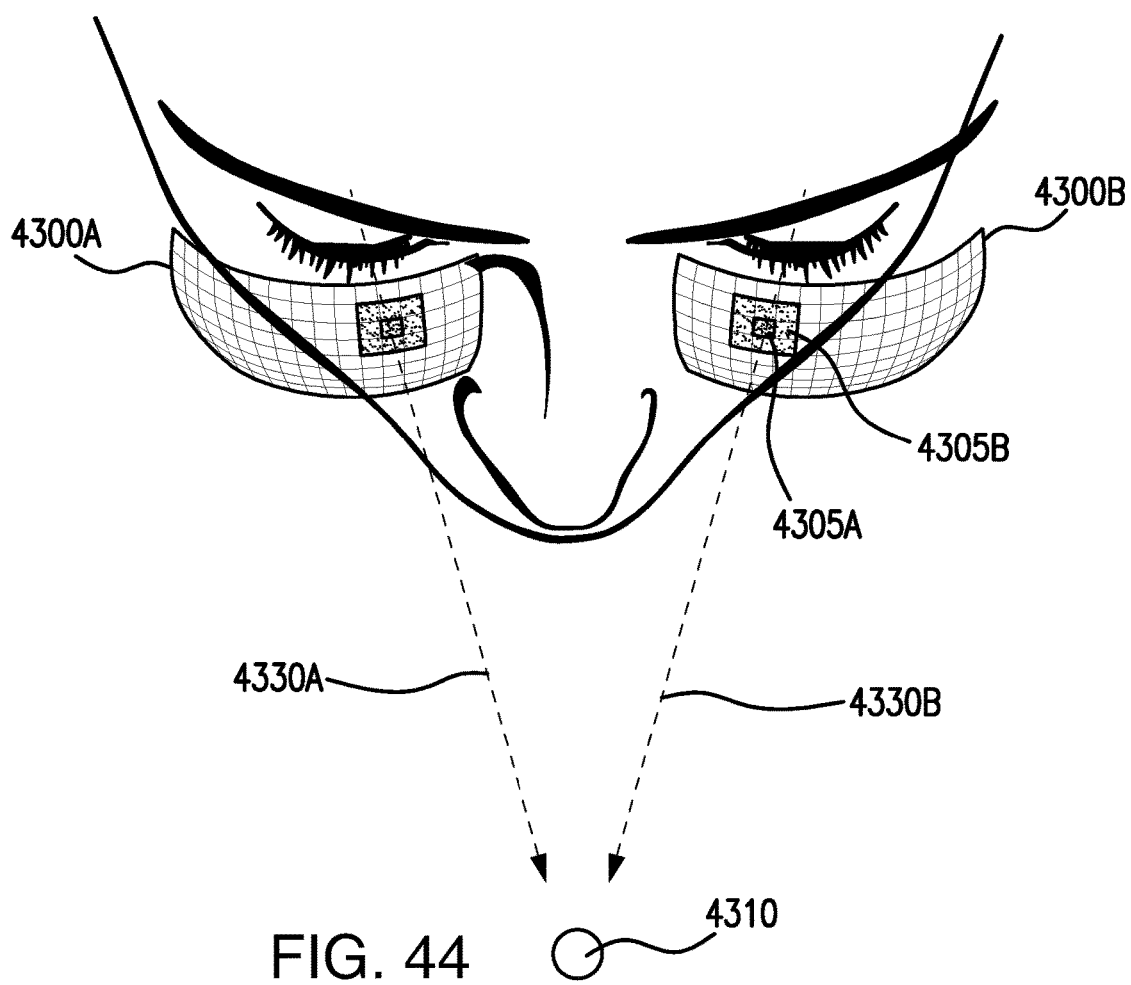

FIGS. 43-46 illustrates perspective views of a near-eye pupil-tracking surface 4300 worn by a viewer, according to certain embodiments. In general, near-eye pupil-tracking surface 4300 includes an array of facets 4305 that may be arranged in any appropriate pattern (e.g., a plurality of facet columns and a plurality of facet rows as illustrated). In some embodiments, facets 4305 are arranged in a grid pattern as illustrated. Facets 4305 are coupled to a side of near-eye pupil-tracking surface 4300 that faces an eye 4301 of the viewer (e.g., eye 4301A or 4301B). Facets 4305 transmit light towards an eye 4301 as the viewer focuses on a target object 4310. As the viewer looks toward target object 4310 along a view axis 4330 (e.g., view axis 4330A or 4330B), the light transmitted by facets 4305 towards eye 4301 will be reflected back towards near-eye pupil-tracking surface 4300 by eye 4301 as a cone of retro-reflected light 4320 (e.g., cones 4320A or 4320B). Cone of retro-reflected light 4320 will be centered upon view axis 4330 and will strike the inside surface of near-eye pupil-tracking surface 4300 and be detected by facets 4305. As illustrated in FIG. 43, cone of retro-reflected light 4320 will intersect near-eye pupil-tracking surface 4300 at a cone intersection 4340 (e.g., cone intersection 4340A or 4340B). In some embodiments, any facets 4305 that detect any portion of cone of retro-reflected light 4320 (i.e., facets 4305 that intersect with any portion of cone intersection 4340) will correspond to a direction of gaze of eye 4301. In some embodiments, different portions of cone of retro-reflected light 4320 are used to determine a direction of gaze of eye 4301. For example, the direction of gaze of eye 4301 may be based on an intensity of the reflection and the overall coverage area (i.e., the total combination of which facets—or which portions of which facets—are receiving reflection is used to determine the center of the gaze). As illustrated in FIG. 44, the highlighted facets 4305 correspond to a direction of gaze of each eye 4301 and include a center-of-gaze facet 4305A and adjacent facets 4305B. As a result, near-eye pupil-tracking surface 4300 may accurately detect where a viewer is currently looking without causing any obstructions to the viewer's vision and without requiring expensive and bulky eye-tracking cameras.

Figure 45:
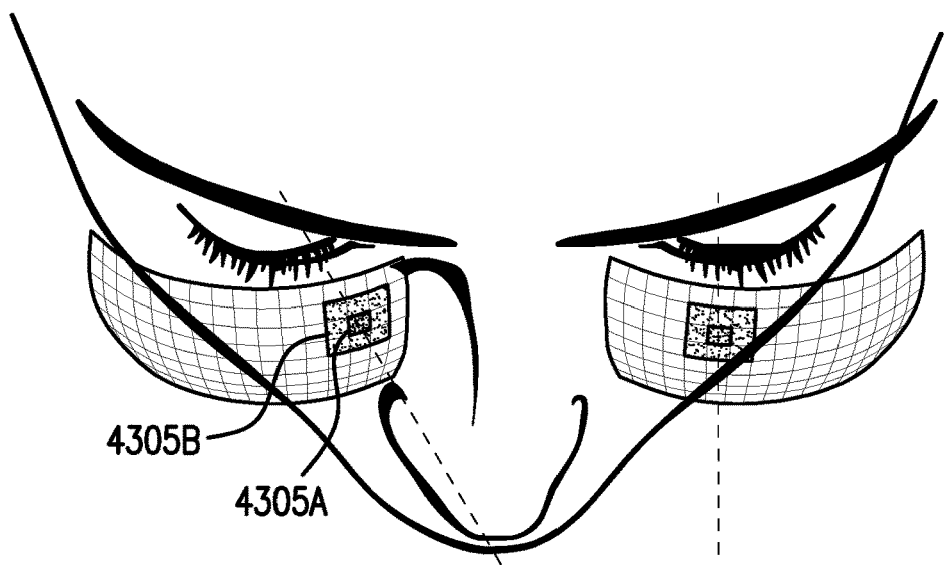
Figure 46:
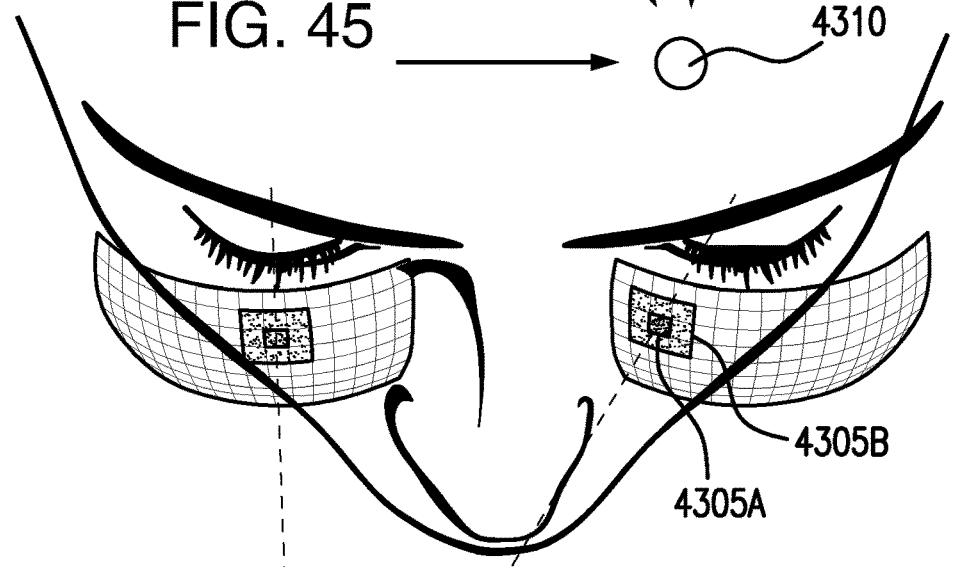

FIGS. 43-44 illustrate a viewer focusing on a target object 4310 that is directly in front of the viewer. As a result, the center-of-gaze facet 4305A for each near-eye pupil-tracking surface 4300 is in approximately the same location on near-eye pupil-tracking surface 4300 as illustrated in FIG. 44. FIGS. 45-46 are similar to FIGS. 43-44 except that the viewer is focusing on a target object 4310 that is not directly in front of the viewer. In these examples, the center-of-gaze facet 4305A for each near-eye pupil-tracking surface 4300 is not in the same location on both near-eye pupil-tracking surfaces 4300. For example, as illustrated in FIG. 45, the center-of-gaze facet 4305A for each near-eye pupil-tracking surface 4300 has been shifted to the right on both near-eye pupil-tracking surfaces 4300 since target object 4310 has shifted to the right. Similarly, as illustrated in FIG. 46, the center-of-gaze facet 4305A for each near-eye pupil-tracking surface 4300 has been shifted to the left on both near-eye pupil-tracking surfaces 4300 since target object 4310 has shifted to the left.

FIGS. 47A-47B illustrate cross-sectional views of near-eye pupil-tracking surface 4300, according to certain embodiments. As illustrated in these figures, facets 4305 each include one or more emitters 4730 and one or more receptors 4740. Emitters 4730 and receptors 4740 may be interleaved or layered. Each emitter 4730 is capable of emitting light 4710 (e.g., visible, non-visible, IR, or near-IR), and each receptor 4740 is capable of detecting any reflected light 4720 that is reflected back towards near-eye pupil-tracking surface 4300 by eye 4301. While a specific number and pattern of emitters 4730 and receptors 4740 are illustrated, any appropriate number and pattern of emitters 4730 and receptors 4740 may be used.

In general, facets 4305 are individual rigid or flexible electronic components that are capable of transmitting and detecting light. In some embodiments, facets 4305 are display facets 2665 (or are similar in design/shape/etc. to display facets 2665) described above. In some embodiments, each facet 4305 includes a planar face 4750. In embodiments where near-eye pupil-tracking surface 4300 has a curved shape that is concentric with eye 4301 (i.e., the curved shape of near-eye pupil-tracking surface 4300 is roughly centered on a center of eye 4760 when near-eye pupil-tracking surface 4300 is being worn by the viewer), each planar face 4750 may be normal to a line pointing towards center of eye 4760. In general, center of eye 4760 is a geometric area about which eye 4301 rotates. When near-eye pupil-tracking surface 4300 has a shape that is designed to be centered on center of eye 4760, the planar faces 4750 of facets 4305 remain normal to lines pointing towards center of eye 4760 regardless of where eye 4301 is pointed.

In some embodiments, each facet 4305 is coupled to a circuit board such as circuit board 740 described above. In some embodiments, circuit board 740 is a flexible circuit board that is formed into a curved shape that is configured to be substantially concentric with eye 4301. In other embodiments, circuit board 740 (and the overall near-eye pupil-tracking surface 4300) is curved but is not concentric with eye 4301. Such embodiments are described below in reference to FIGS. 49A-49B. In still other embodiments, circuit board 740 (and the overall near-eye pupil-tracking surface 4300) is flat. Such embodiments are described below in reference to FIGS. 50A-50B.

In some embodiments, facets 4305 are not coupled directly to circuit board 740. Instead, each facet 4305 may be coupled to a respective logic facet such as logic facets 2655 described above. This may allow each facet 4305 to be individually addressable as described above with respect to display facets 2665. This may allow the detection of a center of gaze of the viewer (i.e., center-of-gaze facet 4305A).

In some embodiments, each emitter 4730 and each receptor 4740 is an individual pixel or stand-alone component coupled to facet 4305. In other embodiments, facets 4305 may be display facets 2665, and the emitters 4730 and receptors 4740 may be individual layers or subpixels within display pixels 1735 of the display facets 2665. For example, the pixels may be display pixels 100, emitters 4730 may be IR emitter subpixels 2210, and receptors 4740 may be IR detector subpixels 2610 as described in FIGS. 1-4 and 22-29 and their associated descriptions in U.S. patent application Ser. No. 15/808,368 entitled "Display-Integrated Infrared Emitter and Sensor Structures," which is incorporated herein by reference in its entirety.

In general, a human eye 4301 includes a retina 4701, a cornea 4702, a pupil opening 4703, and a crystalline lens 4704. While the individual dimensions of these components of eye 4301 may vary from human to human, the variance is generally small and within a known range. For example, a typical eye 4301 will have a pupil opening 4703 that is approximately 4.4 mm in diameter, but this may vary by ambient light intensity and not just biological distinctions. This results in a cone of retro-reflected light 4320 from retina 4701 that is typically around 12 degrees.

Facets 4305 may be in any appropriate shape. In some embodiments, facets 4305 are coupled to facet locations 2220 on circuit board 740, and the shapes of facets 4305 match the shapes of facet locations 2220. In some embodiments, facets 4305 are in the shape of a polygon such as a triangle, a quadrilateral, a pentagon, a hexagon, a heptagon, or an octagon. In some embodiments, some or all of facets 4305 have non-polygonal shapes. For example, facets 4305 on the edges of near-eye pupil-tracking surface 4300 may not be polygonal as they may have curved cutoffs so as to enhance the aesthetics of the overall assembly.

Figure 48A:
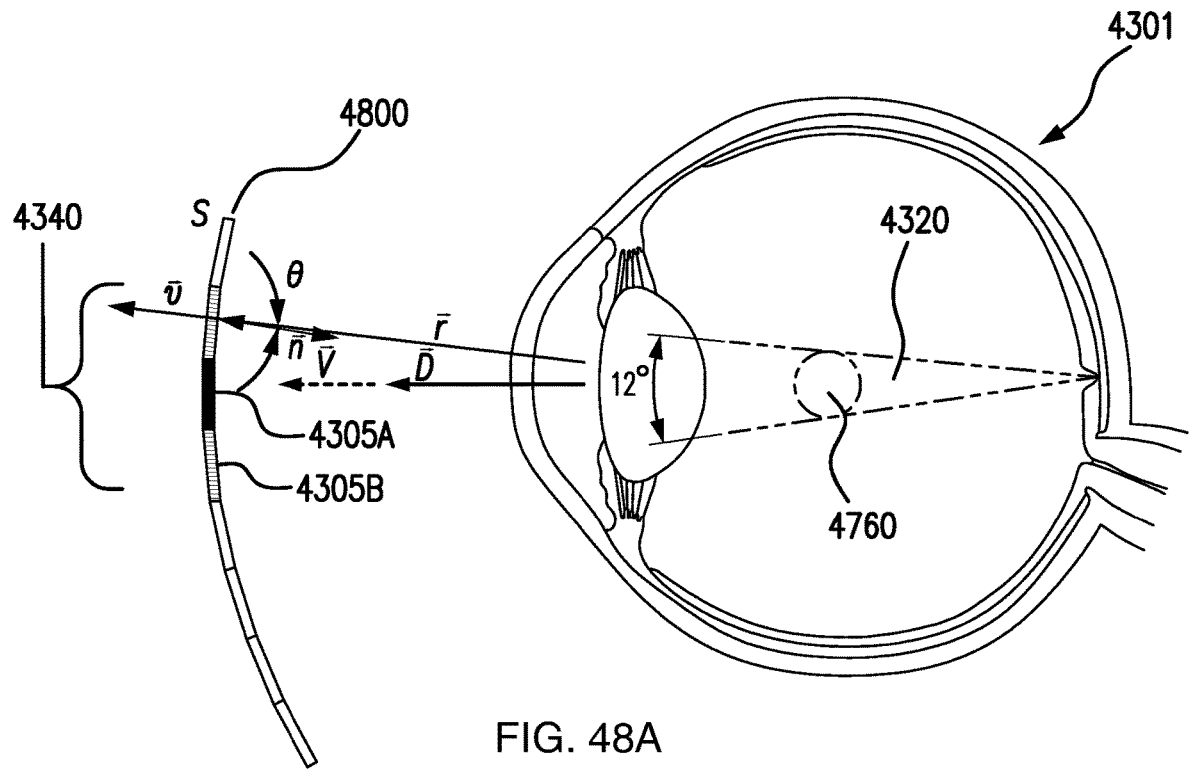
FIGS. 48A-48B illustrate cones of retinal retro-reflected light as detected by an ocular-concentric tracking surface, according to certain embodiments.
Figure 48B:
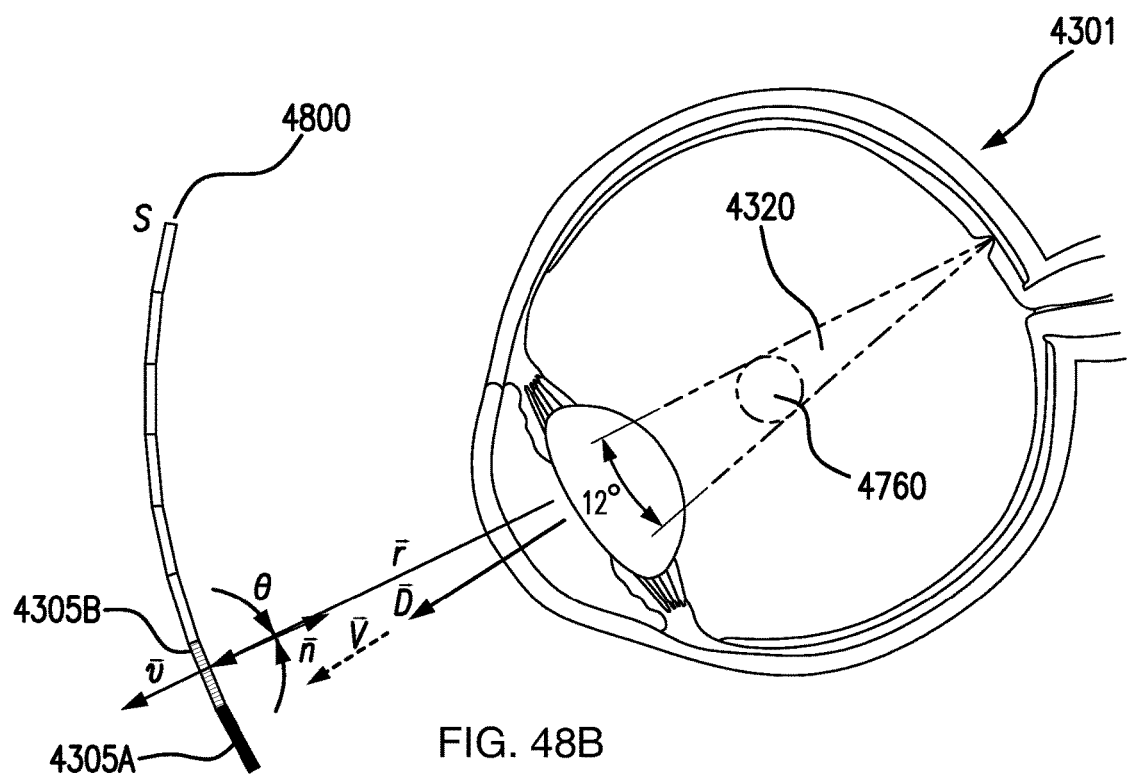
Figure 49A:
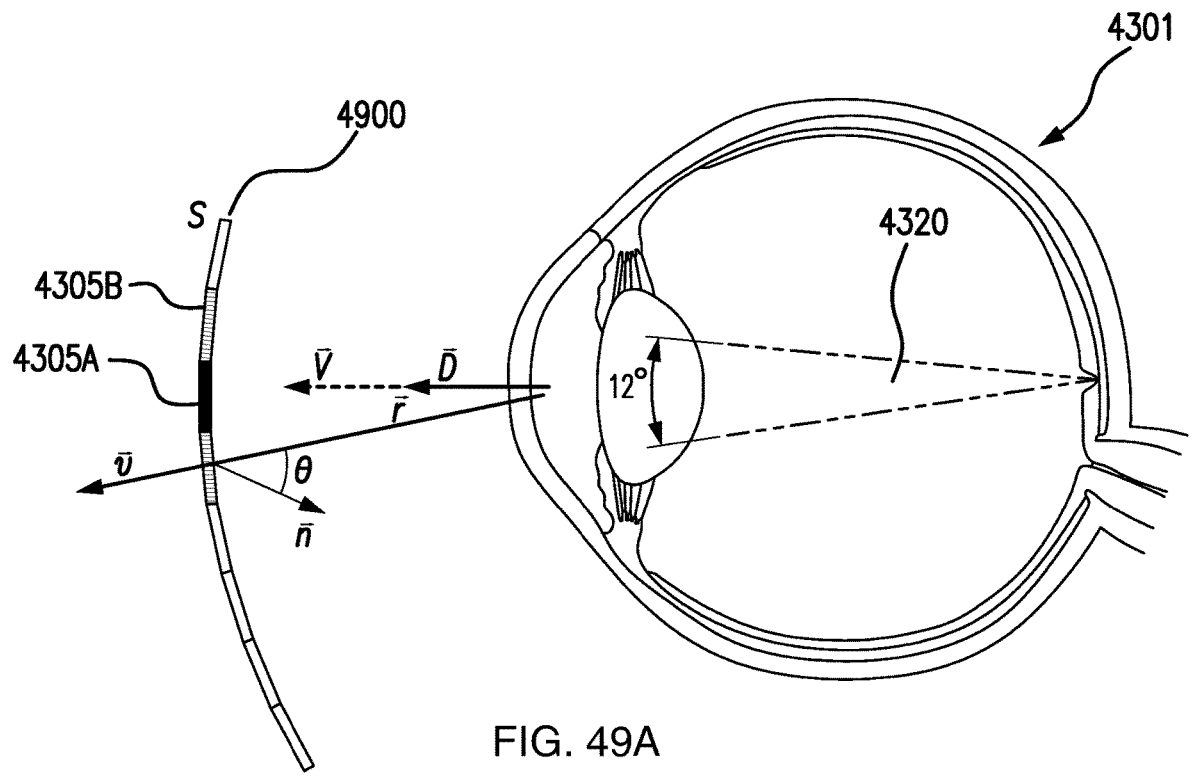
FIGS. 49A-49B illustrate cones of retinal retro-reflected light as detected by a non-ocular-concentric tracking surface, according to certain embodiments.
Figure 49B:
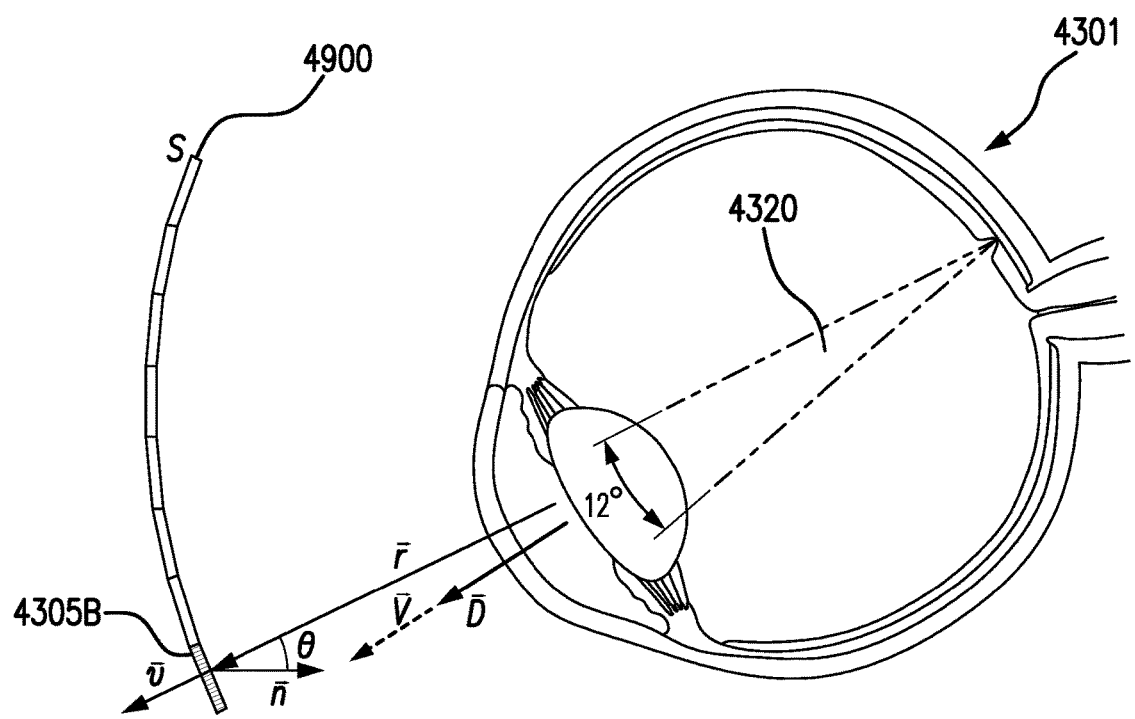
Figure 50A:
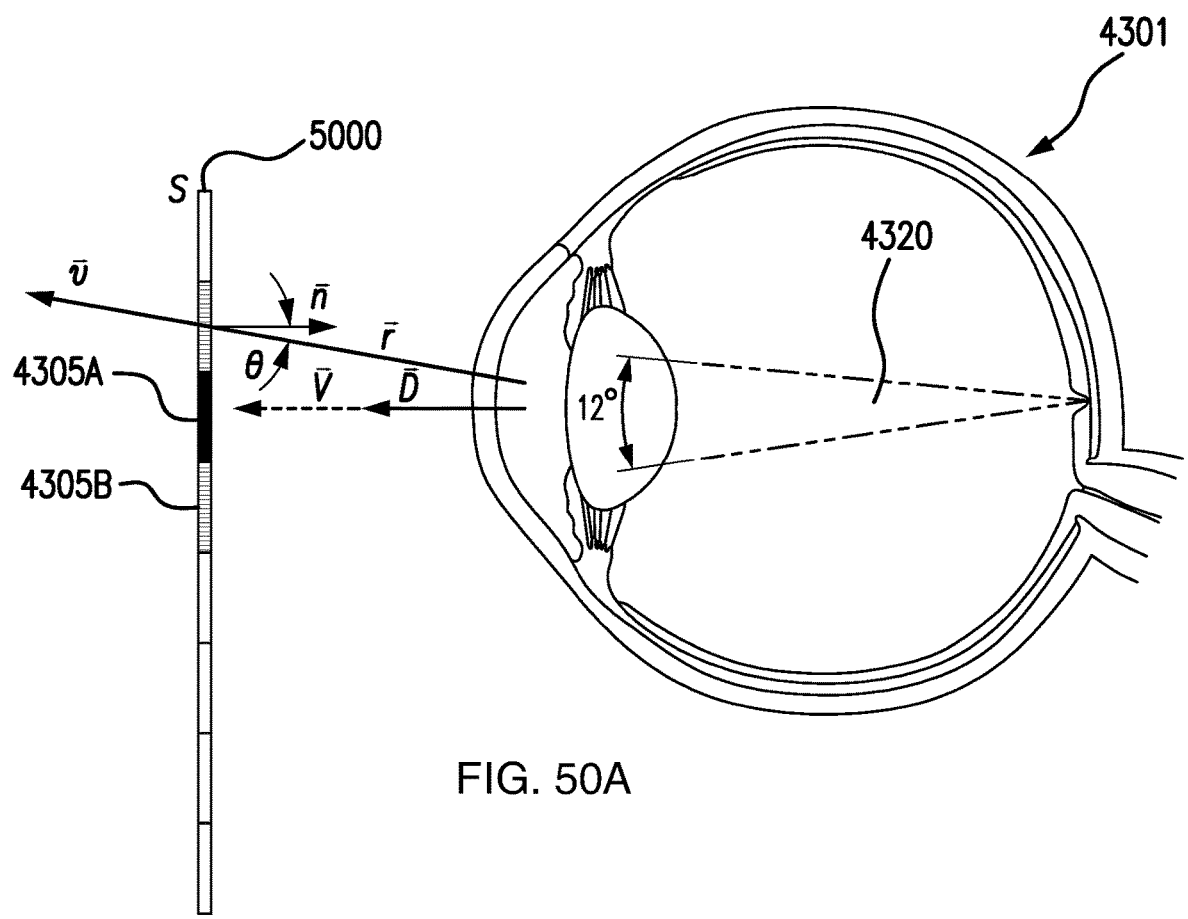
FIGS. 50A-50B illustrate cones of retinal retro-reflected light as detected by a flat tracking surface, according to certain embodiments.
Figure 50B:
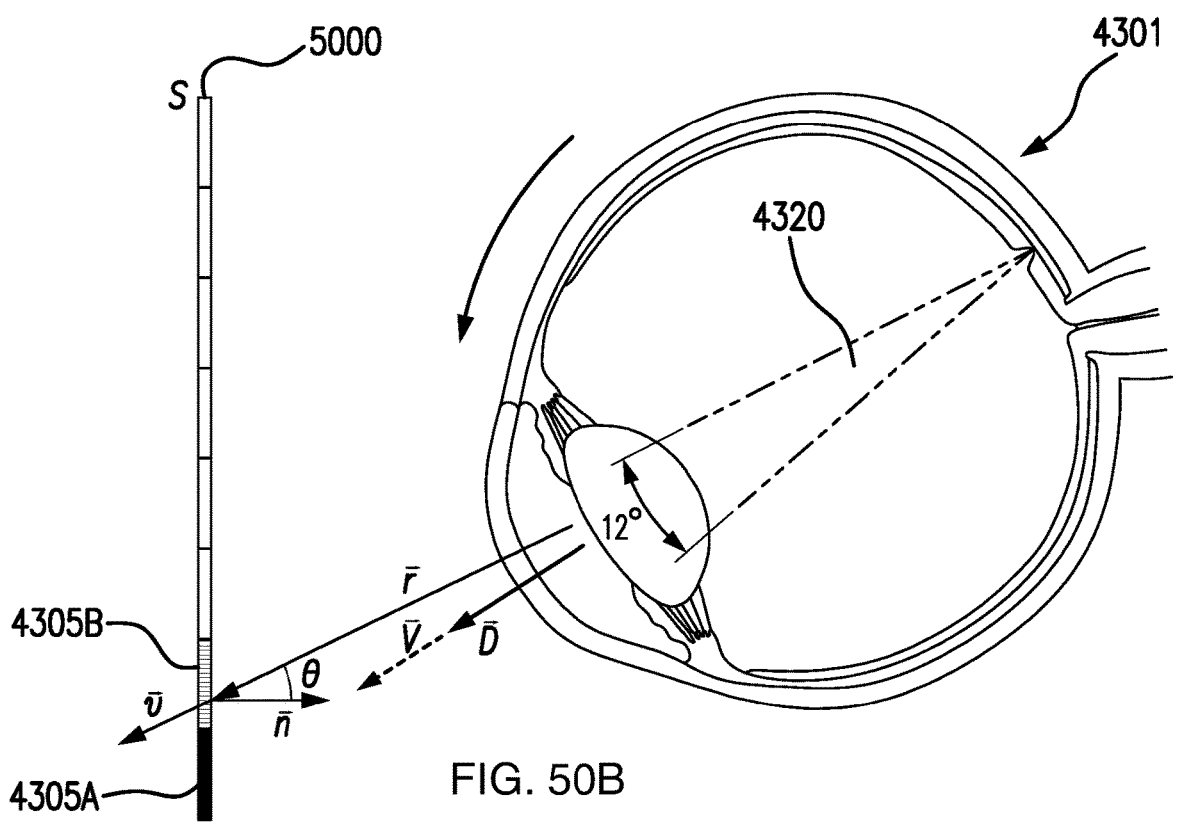

FIGS. 48A-50B illustrate cones of retinal retro-reflected light 4320 as detected by various embodiments of near-eye pupil-tracking surface 4300. FIGS. 48A-48B illustrate cones of retinal retro-reflected light 4320 as detected by an ocular-concentric tracking surface 4300, FIGS. 49A-49B illustrate cones of retinal retro-reflected light 4320 as detected by a curved, non-ocular-concentric tracking surface 4900, and FIGS. 50A-50B illustrate cones of retinal retro-reflected light 4320 as detected by a flat tracking surface 5000, according to certain embodiments. In reference to FIGS. 48A-50B, suppose a light-sensitive surface S (representing a possibly curved near-eye pupil-tracking surface 4300), which is finite and does not pass through the origin. Now suppose that there is some vector $\vec{D}$ of unit length (representing the central direction of light emission from the origin). Finally, suppose that light is emitted as a one-sided cone centered on the origin, pointing in the direction $\vec{D}$, and having an intensity value at unit distance of:

$$I(\cos\theta)$$

pointing in a direction which forms an angle $\theta$ with $\vec{D}$. That is, there is an eye at the origin of the system and a detector that is outside of the eye. The retroreflected light from the eye also may have some arbitrary falloff rate given by $I(\cos\theta)$. Given some parameterization $\vec{r}(s, t)$ of S for some region in $(s, t)$-space, let $\vec{n}(s, t)$ denote the unit length normal vector to the surface. Using the shorthand $r=|\vec{r}|$, take $$\vec{u} = \frac{\vec{r}}{r}.$$

Since the perceived intensity of incoming light to a surface is $|I\vec{u}\cdot\vec{n}|$ where $I\vec{u}$ represents the direction and intensity of the incoming light and $\vec{n}$ represents the normal vector to the surface, the detected intensity of light at a point $\vec{r}$ on S is $I_d = I(\vec{u}\cdot\vec{D})\vec{u}\cdot\vec{n}/r^2$. But the sensors which detect this light are distributed at (potentially) varying densities throughout S. Thus, $\rho(s, t)$ will be defined to be the number of sensors per square unit of S picking up light around $\vec{r}$. Now, assuming that S does not cast a shadow onto itself, the total light detected by the sensors is $$\int\int_S I_d \rho\, dS.$$

where $I_d$ is the theoretical amount of light that is detected by any given sensor on the surface, $\vec{r}$ is the point at which it is detected and $\vec{n}$ is the normal of the detection surface (not necessarily pointing toward the center of the eye).

Next, it is desirable to assign a vector $\vec{v}(s, t)$ to each sensor such that $$\vec{V} := \int\int_S I_d \rho \vec{v}\, dS = c\vec{D}$$

for some positive value c. This equation reveals that simply by multiplying the detected value of light by a hardcoded vector in each sensor and then adding all of those products together across the entire sensor array (e.g., the sensor surface), the resultant vector has the same direction as the original direction of view. Taking $$\vec{v} = \frac{\vec{u}}{\rho}$$

and assuming that all of the light actually hits the surface S, $\vec{V}$ can be simplified as follows:

$$\vec{V} := \int\int_S I_d \rho \vec{v}\, dS$$

$$= \int\int_S \frac{(I(\vec{u}\cdot\vec{D})\vec{u}\cdot\vec{n})}{r^2} \rho \frac{\vec{u}}{\rho}\, dS$$

$$= \int\int_S I(\vec{u}\cdot\vec{D}) \frac{\vec{u}\cdot\vec{n}}{r^2} \vec{u}\, dS$$

Some perpendicular unit vector to $\vec{D}$ can be found and called $\vec{D}^\perp$, then $\theta$ and $\varnothing$ can be defined to parameterize the unit sphere so that $\vec{u}=\vec{D}\cos\theta+(\sin\theta)(\vec{D}^\perp\cos\varnothing+(\vec{D}\times\vec{D}^\perp)\sin\varnothing)$. Observe that $\vec{r}=|\vec{r}|\vec{u}$. This leads to the following computations:

$$\vec{r}_\theta \times \vec{r}_\varnothing = (r\vec{u}_\theta + r_\theta \vec{u}) \times (r\vec{u}_\varnothing + r_\varnothing \vec{u})$$

$$= r\vec{u}_\theta \times r\vec{u}_\varnothing + r\vec{u}_\theta \times r_\varnothing \vec{u} + r_\theta \vec{u} \times r\vec{u}_\varnothing + r_\theta \vec{u} \times r_\varnothing \vec{u}$$

$$= r^2(\vec{u}_\theta \times \vec{u}_\varnothing) + r\vec{u}_\theta \times r_\varnothing \vec{u} - r\vec{u}_\varnothing \times r_\theta \vec{u} + 0$$

$$= r^2(\vec{u}_\theta \times \vec{u}_\varnothing) + r(r_\varnothing \vec{u}_\theta - r_\theta \vec{u}_\varnothing) \times \vec{u}$$

Here, a system of coordinates in terms of the retroreflected cone is established: $\theta$ represents the angle away from the cone axis and $\varnothing$ represents the angle around the cone's axis. Observe that since $\vec{n}$ is the unit normal to S, $$\vec{n} = \frac{\vec{r}_\theta \times \vec{r}_\varnothing}{|\vec{r}_\theta \times \vec{r}_\varnothing|}.$$

Therefore, $$\frac{\vec{u}\cdot\vec{n}}{r^2} = \frac{\vec{u}\cdot(\vec{r}_\theta \times \vec{r}_\varnothing)}{r^2|\vec{r}_\theta \times \vec{r}_\varnothing|}$$

$$= \frac{\vec{u}\cdot(r^2(\vec{u}_\theta \times \vec{u}_\varnothing) + r(r_\varnothing \vec{u}_\theta - r_\theta \vec{u}_\varnothing) \times \vec{u})}{r^2|\vec{r}_\theta \times \vec{r}_\varnothing|}$$

$$= \frac{\vec{u}\cdot r^2(\vec{u}_\theta \times \vec{u}_\varnothing) + 0}{r^2|\vec{r}_\theta \times \vec{r}_\varnothing|}$$

$$= \frac{\vec{u}\cdot \vec{u}_\theta \times \vec{u}_\varnothing}{|\vec{r}_\theta \times \vec{r}_\varnothing|}$$

$$= \frac{1}{|\vec{r}_\theta \times \vec{r}_\varnothing|} \begin{vmatrix} \cos\theta & \sin\theta\cos\varnothing & \sin\theta\sin\varnothing \\ -\sin\theta & \cos\theta\cos\varnothing & \cos\theta\sin\varnothing \\ 0 & -\sin\theta\sin\varnothing & \sin\theta\cos\varnothing \end{vmatrix}$$

$$= \frac{\sin\theta}{|\vec{r}_\theta \times \vec{r}_\varnothing|}$$

Finally, it can be shown that $\vec{V}$ is in fact a scalar multiple of $\vec{D}$:

$$\vec{V} = \int\int_S I(\vec{u}\cdot\vec{D}) \frac{\vec{u}\cdot\vec{n}}{r^2} \vec{u}\, dS$$

-continued $$= \int_0^{\pi/2}\int_0^{2\pi} I(\vec{u}\cdot\vec{D})\frac{\vec{u}\cdot\vec{n}}{r^2}\vec{u}|\vec{r_\theta}\times\vec{r_\phi}|d\phi d\theta$$

$$= \int_0^{\pi/2}\int_0^{2\pi} I(\cos\theta)\frac{\sin\theta}{|\vec{r_\theta}\times\vec{r_\phi}|}\vec{u}|\vec{r_\theta}\times\vec{r_\phi}|d\phi d\theta$$

$$= \int_0^{\pi/2}\int_0^{2\pi} I(\cos\theta)\vec{u}\sin\theta d\phi d\theta$$

$$= \int_0^{\pi/2} I(\cos\theta)\sin\theta \int_0^{2\pi}\vec{u}d\phi d\theta$$

$$= \int_0^{\pi/2} I(\cos\theta)\sin\theta \int_0^{2\pi}\vec{D}\cos\theta + (\sin\theta)(\vec{D}^\perp\cos\phi + (\vec{D}\times\vec{D}^\perp)\sin\phi)\,d\phi d\theta$$

$$= \int_0^{\pi/2} I(\cos\theta)\sin\theta\left(2\pi\vec{D}\cos\theta + \sin\theta\int_0^{2\pi}\vec{D}^\perp\cos\phi + (\vec{D}\times\vec{D}^\perp)\sin\,d\phi\right)d\theta$$

$$= \int_0^{\pi/2} I(\cos\theta)\sin\theta\,(2\pi\vec{D}\cos\theta + \sin\theta\cdot 0)d\theta$$

$$= \int_0^{\pi/2} I(\cos\theta)\,2\pi\vec{D}\sin\theta\cos\theta d\theta$$

$$= 2\pi\vec{D}\int_0^{\pi/2} I(\cos\theta)\sin\theta\cos\theta d\theta$$

$$= c\vec{D}\text{ for }c = 2\pi\int_0^{\pi/2} I(\cos\theta)\sin\theta\cos\theta d\theta$$

To program and initially setup near-eye pupil-tracking surface 4300, a fixed point O representing the average apex of the light cone may first be chosen. Next, for each sensor at a point X, let $\vec{r}:=X-O$, and let ρ be the sensor density at that location. Next, for each sensor, assign $r:=|\vec{r}|$, $$\vec{u}:=\frac{\vec{r}}{r}\text{ and }\vec{v}:=\frac{\vec{u}}{\rho}.$$

Next, store at each sensor the value of $\vec{v}$. Next, experimentally determine the control vector $\vec{W}$ by taking the value of $\Sigma I\vec{v}$ when there is no retroreflector present (such as when the device is being worn, but the eye is closed). Finally, store the value of $\vec{W}$.

At runtime, the follow procedure may be followed. First, record at each sensor the intensity of light I hitting that sensor. Next, compute $\Sigma I\vec{v}$ over all sensors. Next, let $\vec{V}:=(\Sigma I\vec{v})-\vec{W}$. Finally, output the vector $$\vec{D}:=\frac{\vec{V}}{|\vec{V}|}.$$

Figure 51:
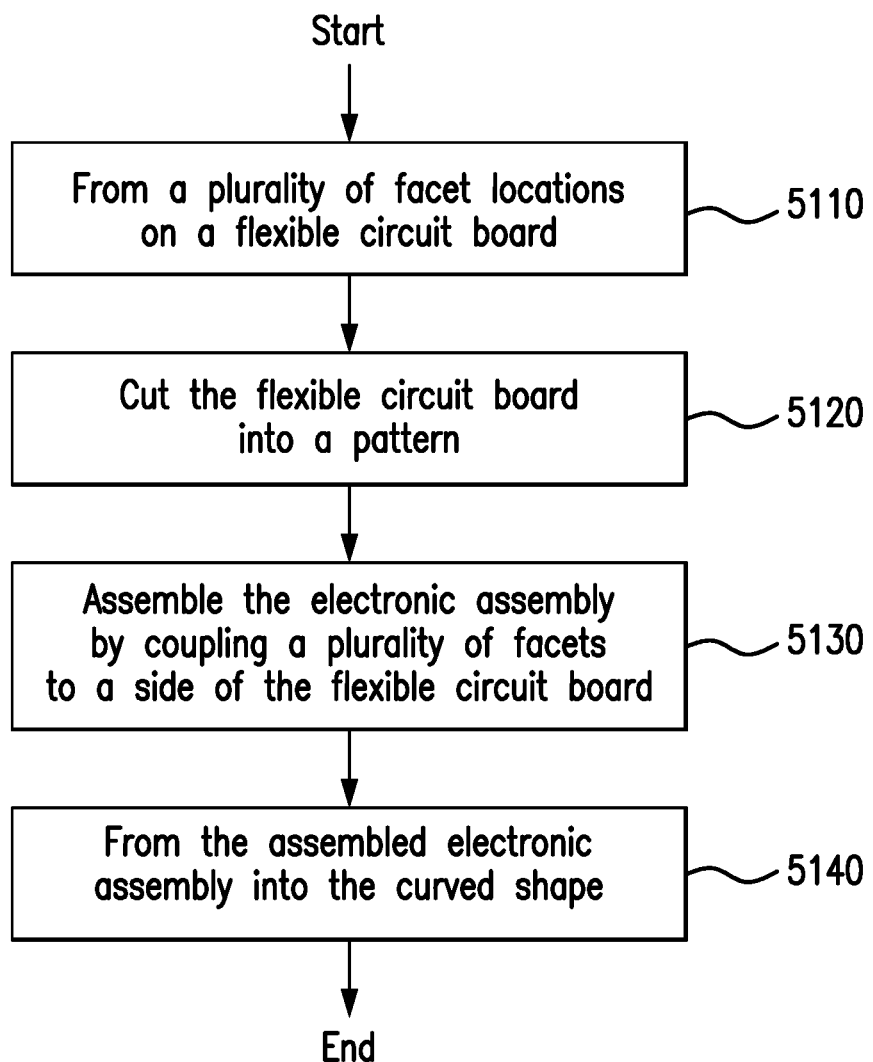
FIG. 51 illustrates a method of manufacturing the near-eye pupil-tracking surface of FIG. 43, according to certain embodiments.

FIG. 51 illustrates a method 5100 of manufacturing an electronic assembly using flexible circuit such as flexible circuit board 2210, according to certain embodiments. At step 5110, a plurality of facet locations are formed on a flexible circuit board. In some embodiments, the facet locations are facet locations 2220, and the flexible circuit board is flexible circuit board 2210. Each facet location corresponds to one of a plurality of facets. The facets may be facets 4305 or display facets 2665. In some embodiments, the plurality of facet locations are arranged into a plurality of facet columns such as columns 2201. In some embodiments, the plurality of facet locations are additionally or alternatively arranged into a plurality of facet rows such as rows 2202.

At step 5120, the flexible circuit board of step 5110 is cut or otherwise shaped into a pattern. In some embodiments, the pattern permits the flexible circuit board to be later formed into a curved shape that is configured to be substantially concentric with a viewer's eye. In some embodiments, the pattern permits the flexible circuit board to be later formed into a curved shape that will not be substantially concentric with a viewer's eye.

At step 5130, the electronic assembly is assembled by coupling a plurality of facets to a first side of the flexible circuit board that is configured to face the viewer's eye. The plurality of facets may be facets 4305 or display facets 2665. Each facet may be coupled to a respective one of the facet locations. In some embodiments, the plurality of facets are coupled to connection pads on the first side of the flexible circuit board using any appropriate mounting technique such as patterned conductive and non-conductive adhesives. Each facet includes a planar face such as planar face 4750, one or more emitters such as emitters 4730 that are configured to emit light towards the viewer's eye, and one or more receptors such as receptors 4740 that are configured to detect the emitted light after it has been reflected back towards the electronic assembly from a retina of the viewer's eye. Each planar face is normal to a line pointing towards a center area of the viewer's eye when the curved shape is substantially concentric with the viewer's eye.

At step 5140, the assembled electronic assembly is formed into the desired curved shape. In some embodiments, this step involves placing the flexible circuit board with its coupled rigid facets into one side of a rigid casing that is in the desired shape. This allows the rigid facets to fall into defined spaces in the casing and the flexible circuit board to bend at defined creases/gaps between the rigid facets. After placing the flexible circuit board with its coupled rigid facets into one side of the rigid casing, an opposite matching side of the rigid casing may be attached to the first side, thereby sealing the assembly into the desired shape.

Particular embodiments may repeat one or more steps of method 5100, where appropriate. Although this disclosure describes and illustrates particular steps of method 5100 as occurring in a particular order, this disclosure contemplates any suitable steps of method 5100 occurring in any suitable order (e.g., any temporal order). Moreover, although this disclosure describes and illustrates an example method of manufacturing an electronic assembly using flexible circuit board, this disclosure contemplates any suitable method of manufacturing an electronic assembly using flexible circuit board, which may include all, some, or none of the steps of method 5100, where appropriate. Furthermore, although this disclosure describes and illustrates particular components, devices, or systems carrying out particular steps of method 5100, this disclosure contemplates any suitable combination of any suitable components, devices, or systems carrying out any suitable steps of method 5100.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An electronic assembly comprising:
a flexible circuit board formed into a curved shape that is configured to be substantially concentric with a viewer's eye; and
a plurality of facets coupled to a side of curved shape of the flexible circuit board that is configured to face the viewer's eye, each facet comprising:
a planar face, each face being normal to a line pointing towards a center area of the viewer's eye when the curved shape is substantially concentric with the viewer's eye;
one or more emitters configured to emit light from the face of the facet towards the viewer's eye; and
one or more receptors configured to detect the emitted light after it has been reflected back towards the face of the facet from a retina of the viewer's eye;
wherein each facet is individually addressable such that the plurality of facets are configurable to detect a center of gaze of the viewer.

2. The electronic assembly of claim 1, wherein each of the plurality of facets are in a shape of a polygon comprising a triangle, a quadrilateral, a pentagon, a hexagon, a heptagon, or an octagon.

3. The electronic assembly of claim 1, wherein the plurality of facets are arranged into a plurality of facet columns and a plurality of facet rows.

4. The electronic assembly of claim 1, wherein:
the plurality of facets are display facets comprising a plurality of display pixels;
the one or more emitters each comprise an IR emitter layer within a respective one of the display pixels; and
and the one or more receptors each comprise an IR detector layer within a respective one of the display pixels.

5. The electronic assembly of claim 4, wherein each display facet is coupled to a respective one of a plurality of logic facets.

6. The electronic assembly of claim 1, wherein the light emitted by the one or more emitters comprises IR light.

7. The electronic assembly of claim 1, wherein the center of gaze of the viewer comprises a central facet within a plurality of facets that detect any of the emitted light after it has been reflected back towards the electronic assembly from the retina of the viewer's eye.

8. An electronic assembly comprising:
a circuit board; and
a plurality of facets coupled to a side of the circuit board that is configured to face a viewer's eye, each facet comprising:
a planar face;
one or more emitters configured to emit light towards the viewer's eye; and
one or more receptors configured to detect the emitted light after it has been reflected back towards the electronic assembly from a portion of the viewer's eye;
wherein each facet is individually addressable such that the plurality of facets are configurable to detect a center of gaze of the viewer.

9. The electronic assembly of claim 8, wherein each of the plurality of facets are in a shape of a polygon comprising a triangle, a quadrilateral, a pentagon, a hexagon, a heptagon, or an octagon.

10. The electronic assembly of claim 8, wherein the plurality of facets are arranged into a plurality of facet columns and a plurality of facet rows.

11. The electronic assembly of claim 8, wherein:
the plurality of facets are display facets comprising a plurality of display pixels;
the one or more emitters each comprise an IR emitter layer within a respective one of the display pixels; and
and the one or more receptors each comprise an IR detector layer within a respective one of the display pixels.

12. The electronic assembly of claim 11, wherein each display facet is coupled to a respective one of a plurality of logic facets.

13. The electronic assembly of claim 8, wherein the light emitted by the one or more emitters comprises IR light.

14. The electronic assembly of claim 8, wherein the center of gaze of the viewer comprises a central facet within a plurality of facets that detect any of the emitted light after it has been reflected back towards the electronic assembly from the portion of the viewer's eye.

15. A method of manufacturing an electronic assembly, the method comprising:
- forming a plurality of facet locations on a flexible circuit board, each facet location corresponding to one of a plurality of facets;
- cutting the flexible circuit board into a pattern that permits the flexible circuit board to be later formed into a curved shape that is configured to be substantially concentric with a viewer's eye;
- assembling the electronic assembly by coupling a plurality of facets to a side of the flexible circuit board that is configured to face the viewer's eye, each facet being coupled to a respective one of the facet locations, each facet comprising:
  - a planar face, each face being normal to a line pointing towards a center area of the viewer's eye when the curved shape is substantially concentric with the viewer's eye;
  - one or more emitters configured to emit light towards the viewer's eye; and
  - one or more receptors configured to detect the emitted light after it has been reflected back towards the electronic assembly from a portion of the viewer's eye; and
- forming the assembled electronic assembly into the curved shape.

16. The method of manufacturing the electronic assembly of claim 15, further comprising coupling each of a plurality of display facets to a respective one of the plurality of facets.

17. The method of manufacturing the electronic assembly of claim 15, wherein the plurality of facets are in the shape of a polygon.

18. The method of manufacturing the electronic assembly of claim 17, wherein the polygon comprises a triangle, a quadrilateral, a pentagon, a hexagon, a heptagon, or an octagon.

19. The method of manufacturing the electronic assembly of claim 17, wherein the plurality of facet locations are arranged into a plurality of facet columns and a plurality of facet rows.

20. The method of manufacturing the electronic assembly of claim 17, wherein each particular facet location comprises:
- a ball grid array configured to couple to one of the plurality of facets; and
- a plurality of interconnection pads configured to electrically couple the particular facet to one or more adjacent facets.

* * * * *